(12) United States Patent
Koyanagi

(10) Patent No.: US 8,283,208 B2
(45) Date of Patent: Oct. 9, 2012

(54) METHOD AND APPARATUS FOR FABRICATING INTEGRATED CIRCUIT DEVICE USING SELF-ORGANIZING FUNCTION

(76) Inventor: Mitsumasa Koyanagi, Miyagi (JP)

( * ) Notice: Subject to any disclaimer, the term of this patent is extended or adjusted under 35 U.S.C. 154(b) by 73 days.

(21) Appl. No.: 11/813,032

(22) PCT Filed: Dec. 28, 2005

(86) PCT No.: PCT/JP2005/024131
§ 371 (c)(1),
(2), (4) Date: May 2, 2008

(87) PCT Pub. No.: WO2006/077739
PCT Pub. Date: Jul. 27, 2006

(65) Prior Publication Data
US 2009/0023243 A1    Jan. 22, 2009

(30) Foreign Application Priority Data

Dec. 28, 2004 (JP) .................................. 2004-382089

(51) Int. Cl.
*H01L 21/00* (2006.01)
(52) U.S. Cl. ................ 438/109; 438/464; 257/E21.505; 257/E21.705
(58) Field of Classification Search .................. 438/109, 438/464; 257/E21.505, E21.705
See application file for complete search history.

(56) References Cited

U.S. PATENT DOCUMENTS

| | | | |
|---|---|---|---|
| 3,516,155 A * | 6/1970 | Smith | 29/839 |
| 5,085,364 A * | 2/1992 | Ishikawa et al. | 228/139 |
| 5,348,607 A | 9/1994 | Wojnarowski et al. | |
| 5,897,335 A * | 4/1999 | Wyland et al. | 438/108 |
| 6,494,552 B1 * | 12/2002 | Miyamoto et al. | 347/1 |
| 6,630,725 B1 * | 10/2003 | Kuo et al. | 257/659 |
| 6,690,185 B1 * | 2/2004 | Khandros et al. | 324/756.03 |
| 6,800,405 B2 * | 10/2004 | Kobayashi | 430/5 |
| 7,033,842 B2 * | 4/2006 | Haji et al. | 438/6 |

(Continued)

FOREIGN PATENT DOCUMENTS

EP    0 384 704 A2    8/1990

(Continued)

OTHER PUBLICATIONS

X. Xiong et al., "Controlled Multibatch Self-Assembly of Microdevices", Journal of Microelectromechanical Systems, vol. 12, No. 2, pp. 117-127, Apr. 2003.

(Continued)

*Primary Examiner* — Charles Garber
*Assistant Examiner* — Ron Pompey
(74) *Attorney, Agent, or Firm* — Griffin & Szipl, P.C.

(57) ABSTRACT

In a method of fabricating an integrated circuit device having a three-dimensional stacked structured, the step of fixing many chip-shaped semiconductor circuits to a support substrate or a circuit layer with a predetermined layout can be performed easily and efficiently with a desired accuracy. Temporary adhesion portions 12b of semiconductor chips 13 are temporarily adhered to corresponding temporary adhesion regions 72a of a carrier substrate 73a by way of water films 81. The carrier substrate 73a is then pressed toward a support substrate or a desired circuit layer, thereby contacting connecting portions 12 of the chips 13 on the carrier substrate 73a with corresponding predetermined positions on the support substrate or a circuit layer. Thereafter, by fixing the connecting portions 12 to the predetermined positions, the chips 13 are attached to the support substrate or the circuit layer with a desired layout.

38 Claims, 40 Drawing Sheets

U.S. PATENT DOCUMENTS

| | | | | |
|---|---|---|---|---|
| 7,625,780 B2* | 12/2009 | Jacobs et al. | ............... | 438/116 |
| 2001/0028117 A1* | 10/2001 | Appelt et al. | ............... | 257/784 |
| 2003/0177633 A1 | 9/2003 | Haji et al. | | |
| 2004/0137708 A1* | 7/2004 | Shibata | ............... | 438/617 |
| 2010/0248424 A1* | 9/2010 | Luce et al. | ............... | 438/109 |
| 2011/0008632 A1* | 1/2011 | Zheng et al. | ............... | 428/457 |
| 2011/0033976 A1* | 2/2011 | Di Cioccio et al. | ............... | 438/107 |
| 2012/0021525 A1* | 1/2012 | Fehr et al. | ............... | 436/94 |

FOREIGN PATENT DOCUMENTS

| | | | |
|---|---|---|---|
| JP | 02-271639 | | 11/1990 |
| JP | 06-163634 | * | 6/1994 |
| JP | 11-298065 | | 10/1999 |
| JP | 2002-299546 | | 10/2002 |

OTHER PUBLICATIONS

K. Lee et al., "Development of Three-Dimensional Integration Technology for Highly Parallel Image-processing Chip", Jpn. J. of Appl. Phys., vol. 39, pp. 2473-2477, Apr. 2000.

H. Kurino et al., "Intelligent Image Sensor Chip with Three Dimensional Structure", 1999 IEDM Technical Digest, pp. 36.4.1-36.4.4, 1999.

International Search Report issued in corresponding application No. PCT/JP2005/024131 completed May 2, 2006 and mailed May 16, 2006.

Office Action issued in related Japanese application 2006-553851 on Aug. 1, 2011.

"What happens when you melt paraffin wax with water?" at http://answers.yahoo.com/question/index?qid=20081120055057AAf2nQ9, dated Nov. 20, 2008, and downloaded Dec. 20, 2011, filed herewith as Exhibit B.

"Wax Emulsions," SPX Corporation, 2008, filed herewith as Exhibit C.

Hawley's Condensed Chemical Dictionary 460, 461, 679, 680, 704, 705, 1078 and 1233 (1987); filed herewith as Exhibit D.

* cited by examiner

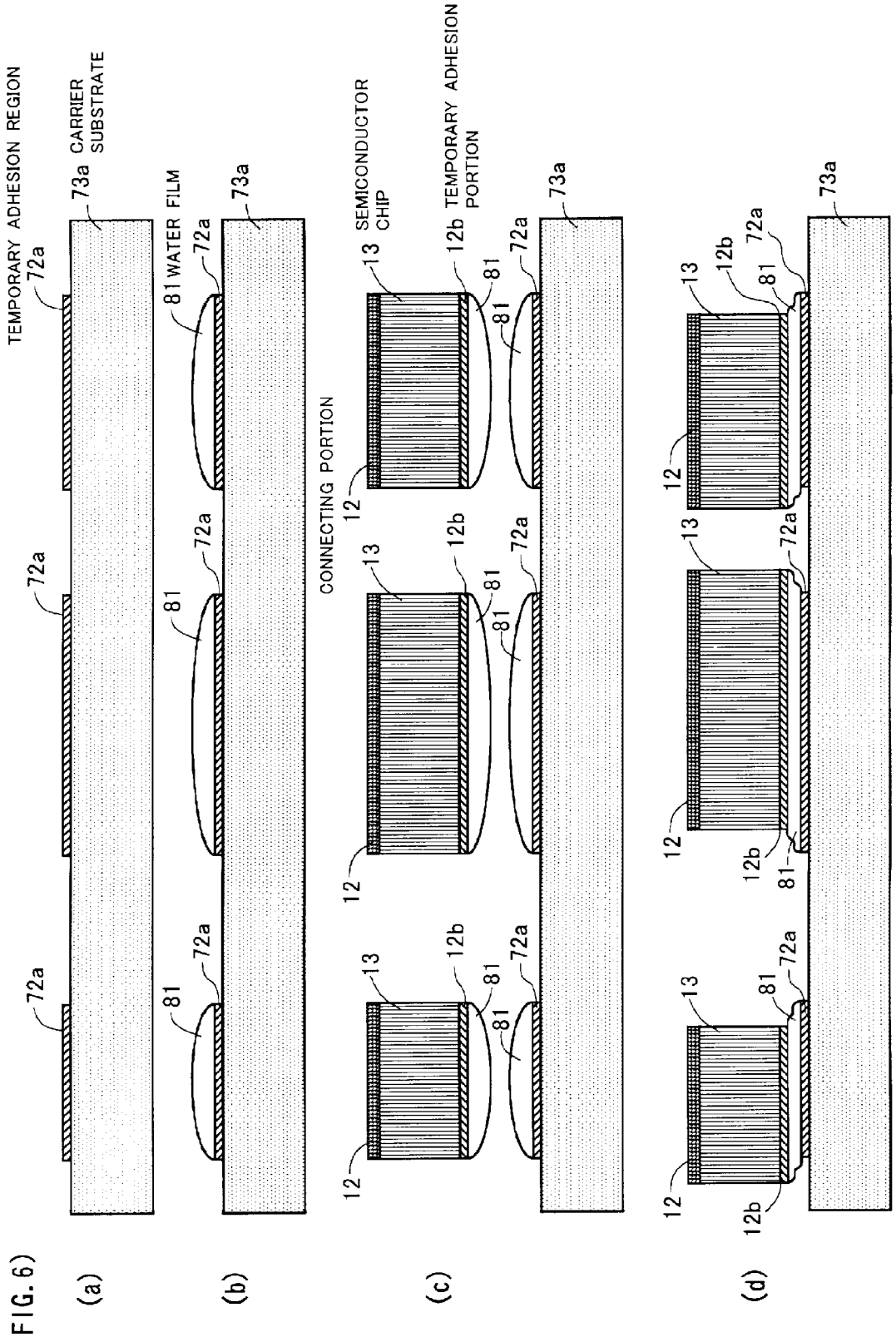

(FIG. 7)
(e)
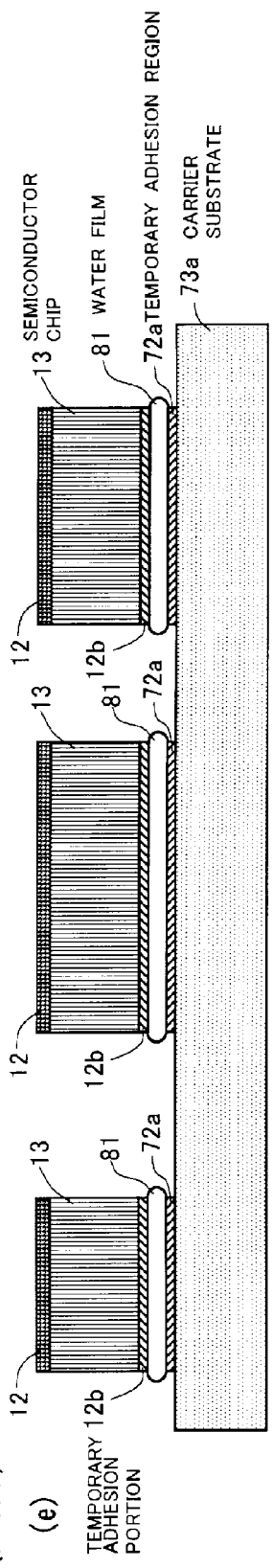
(f)
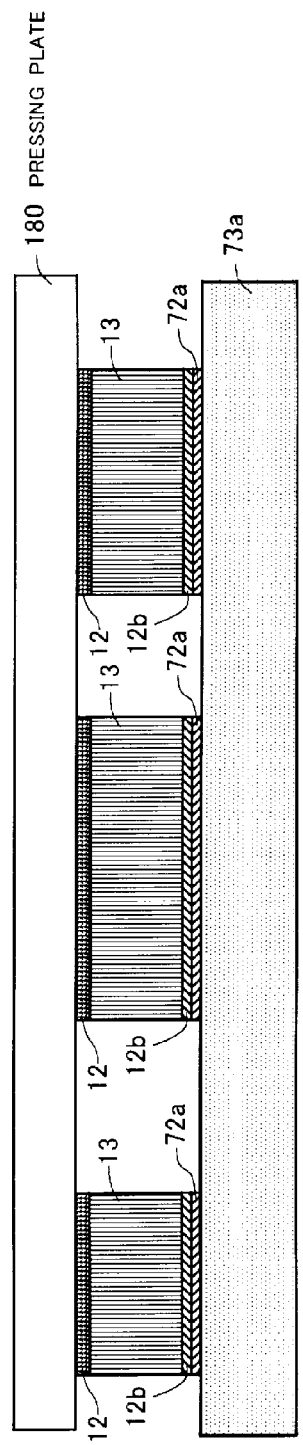
(g)
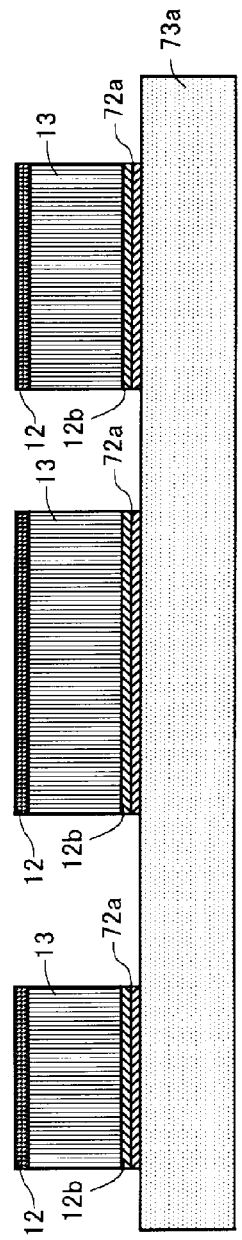

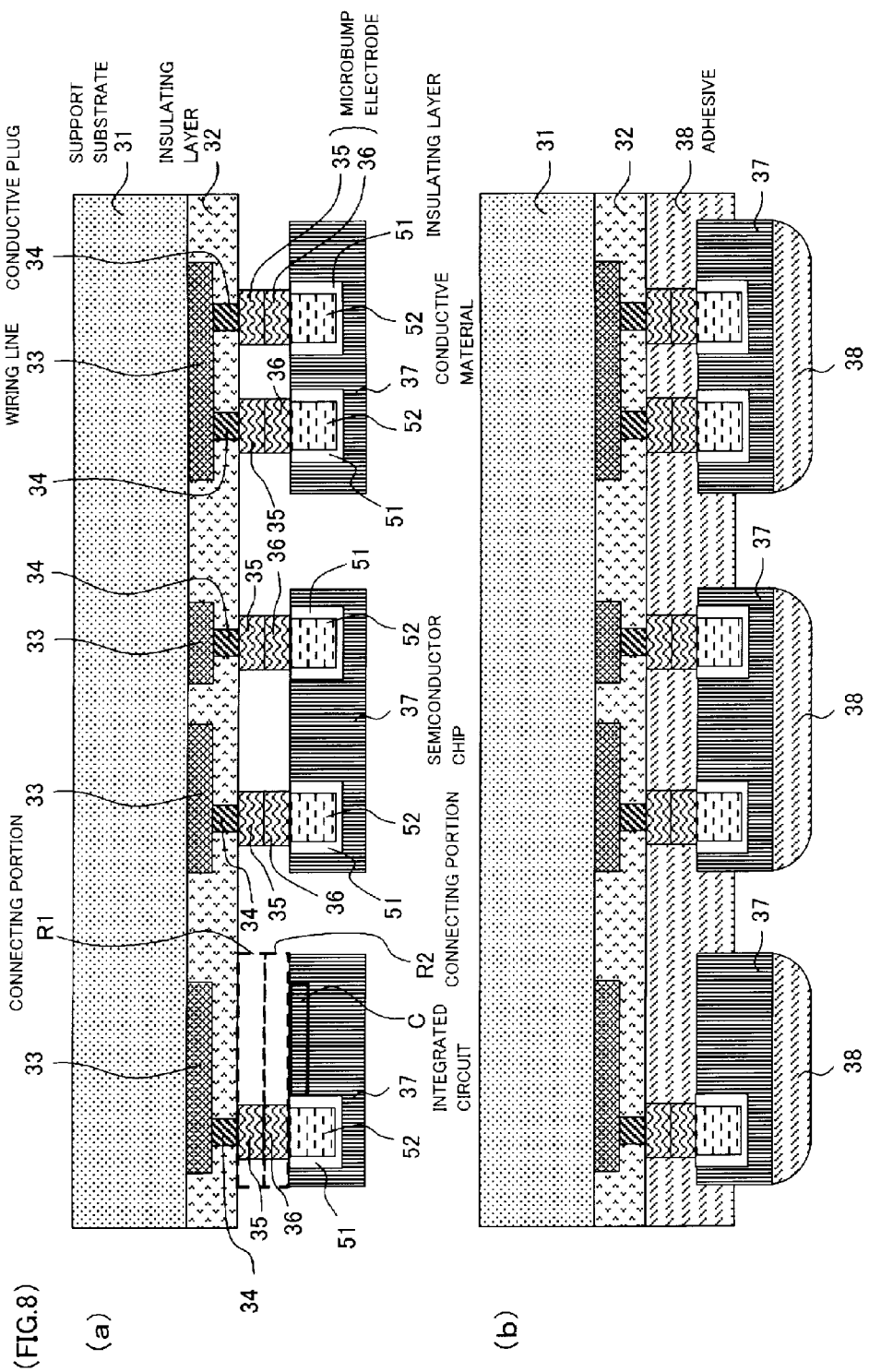
(FIG.8)

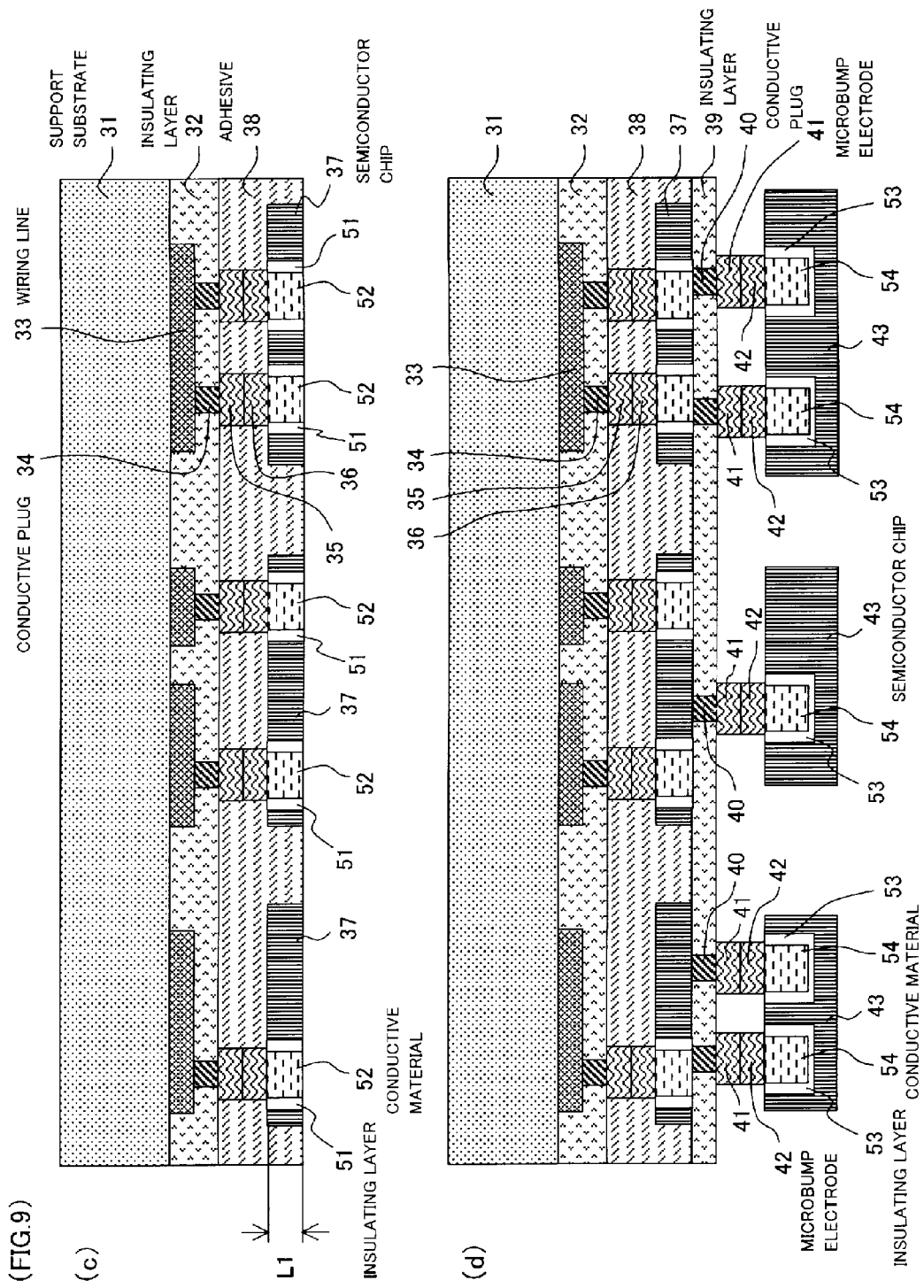

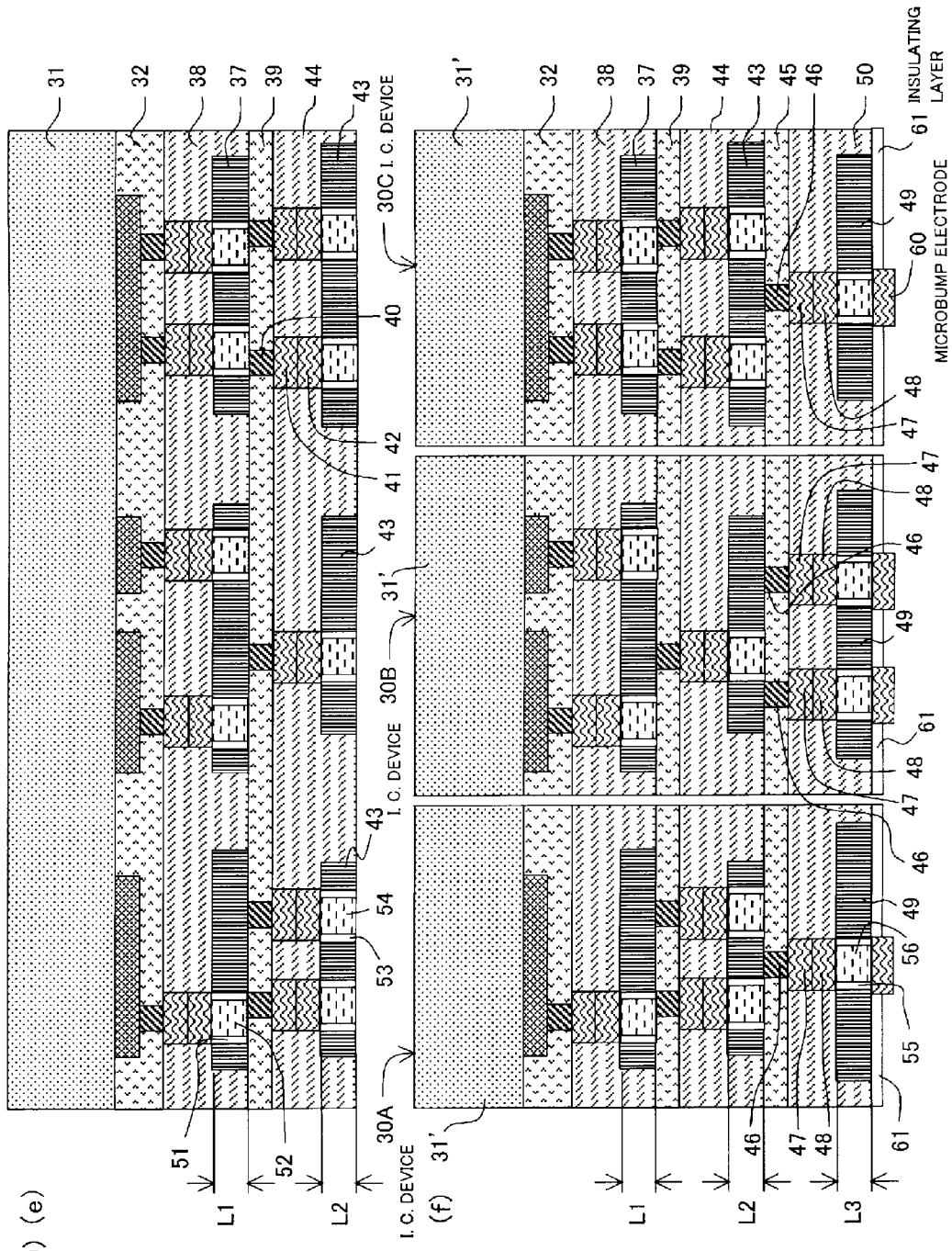

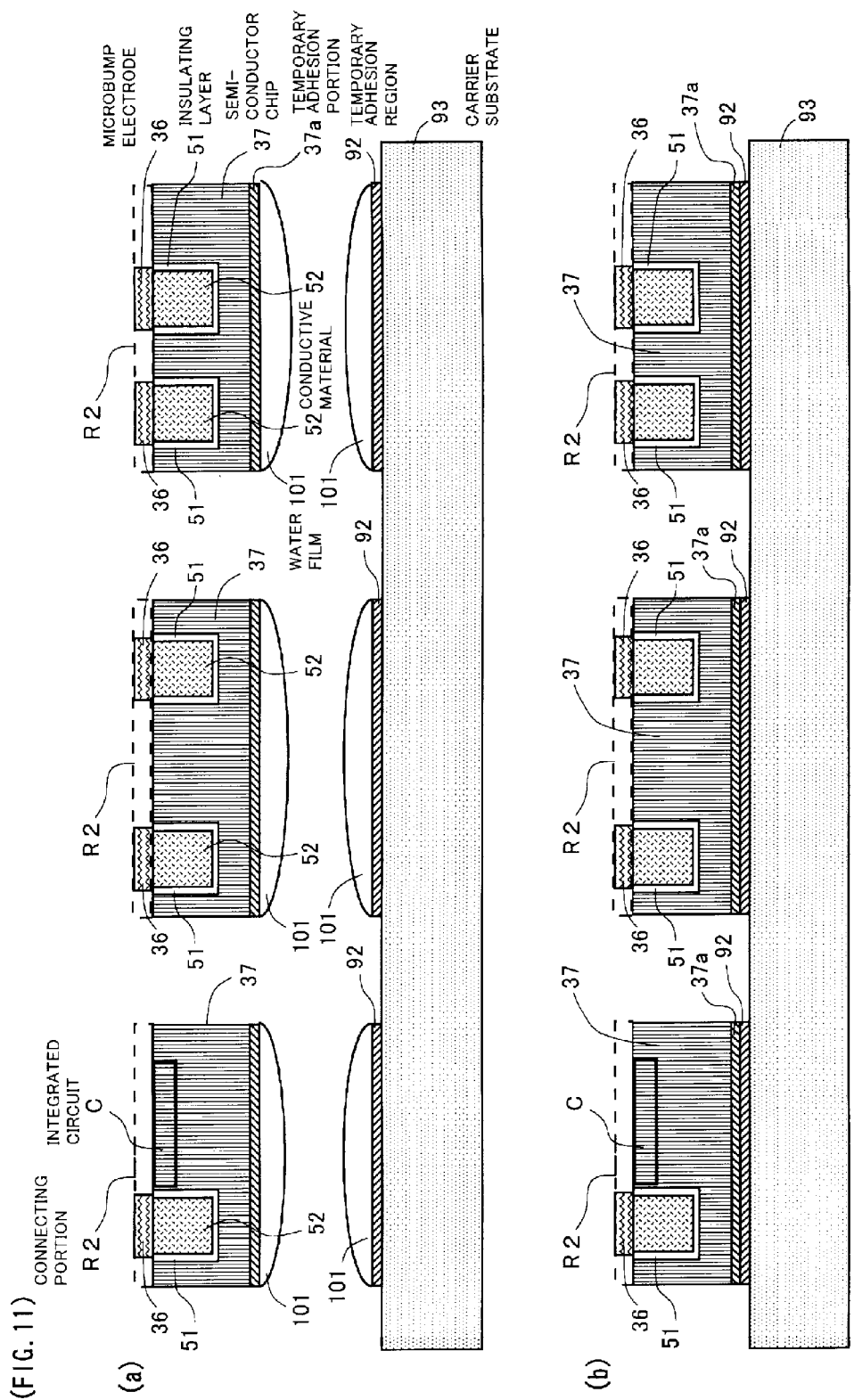

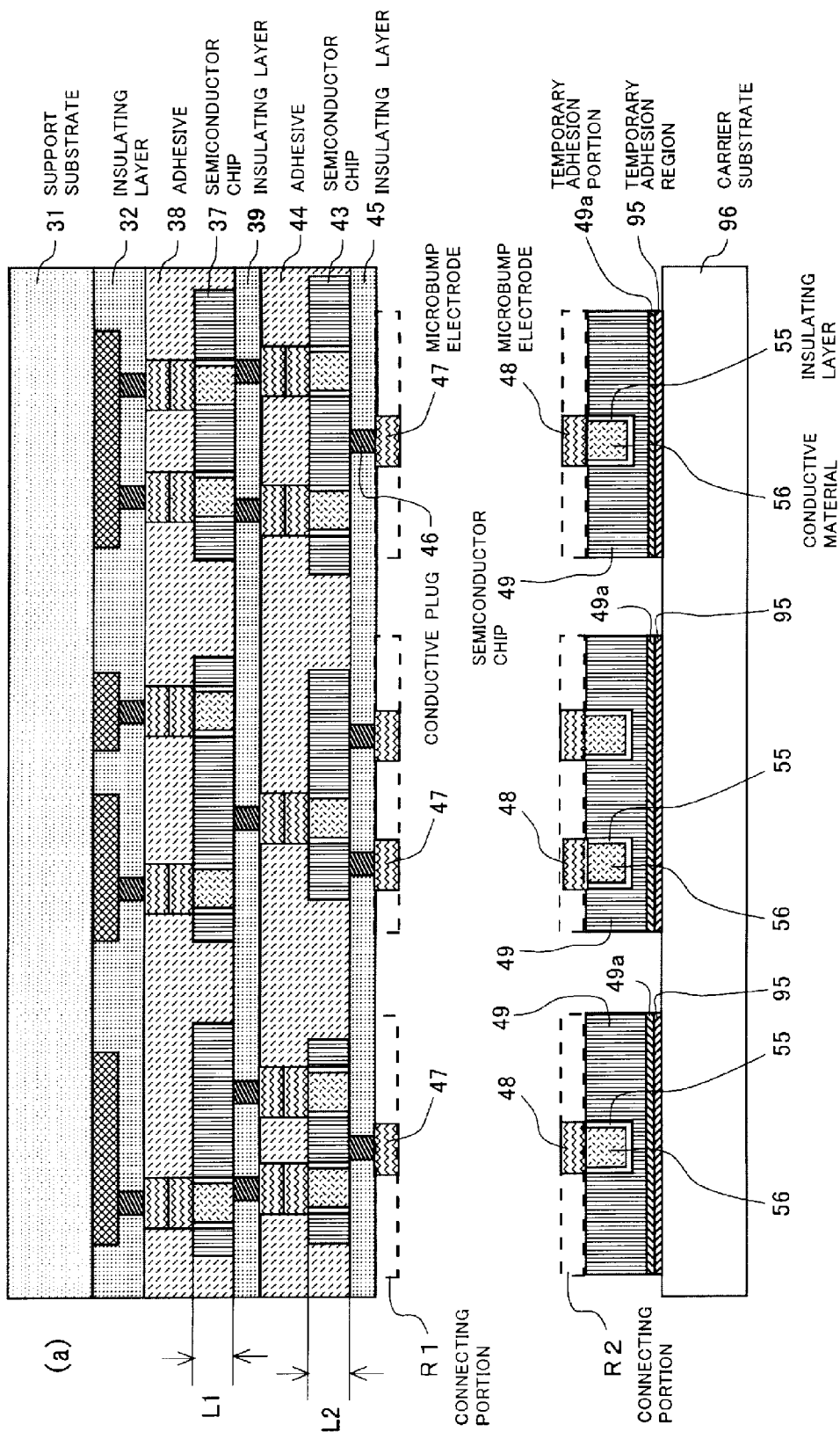

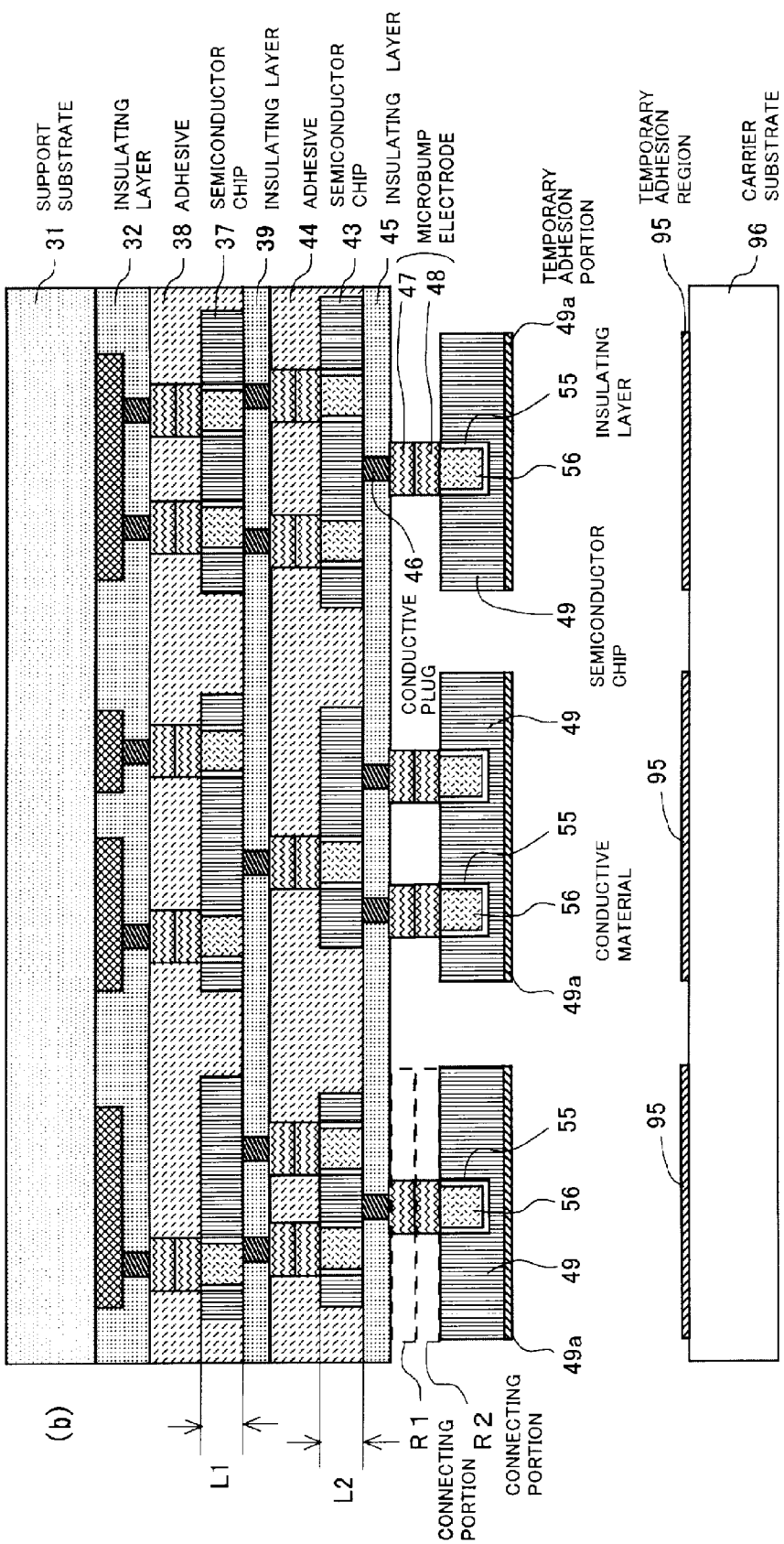

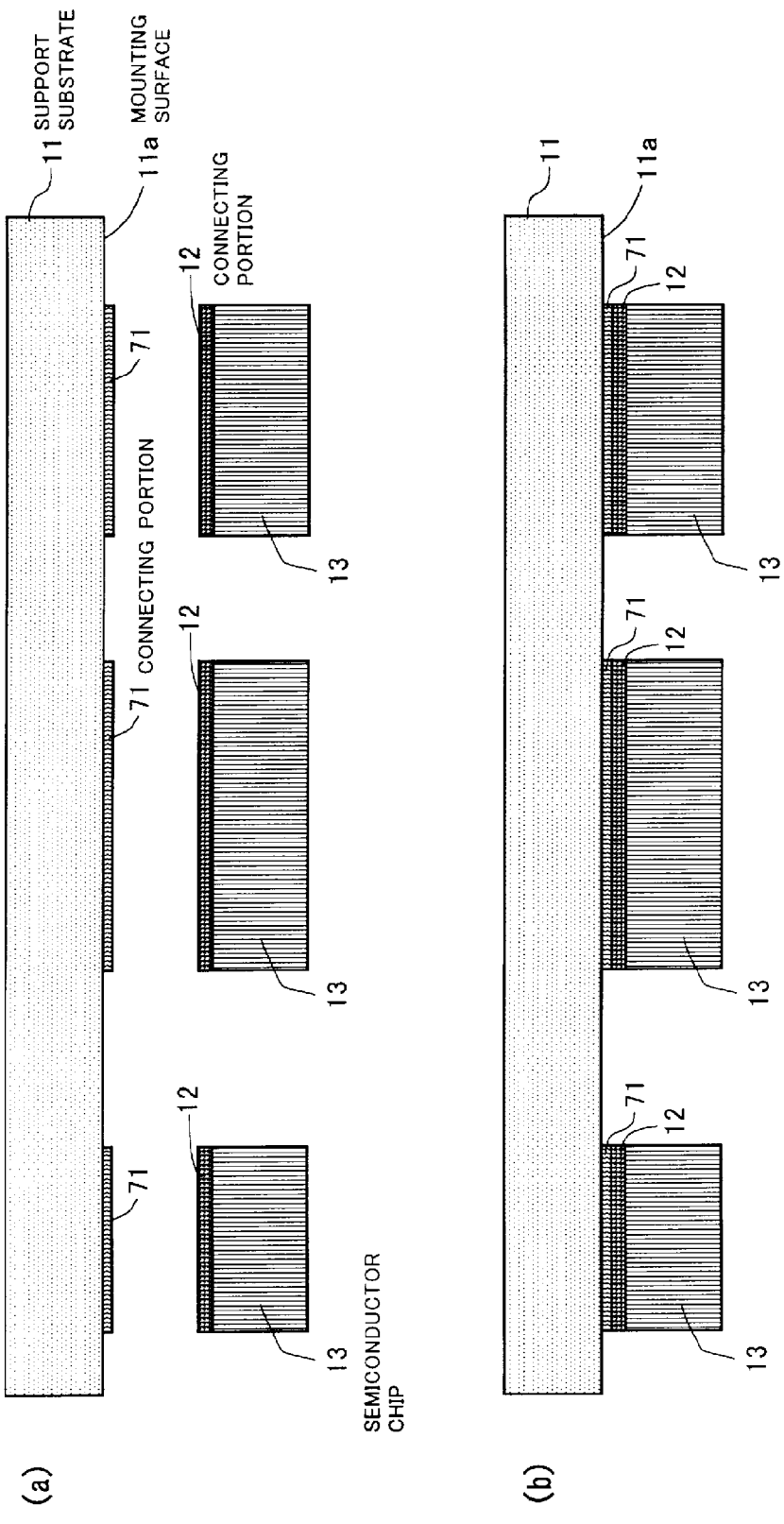
(FIG. 14)

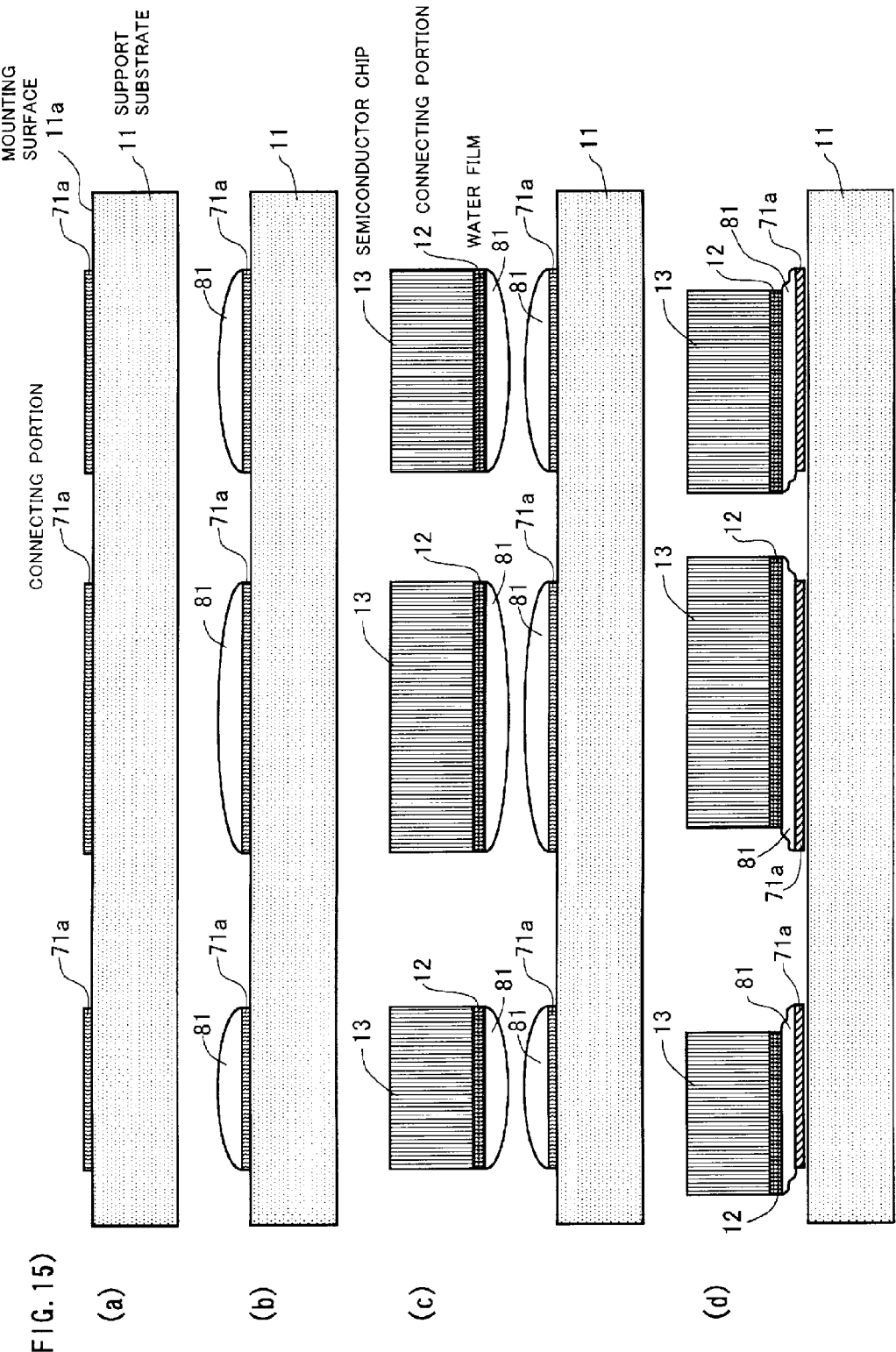

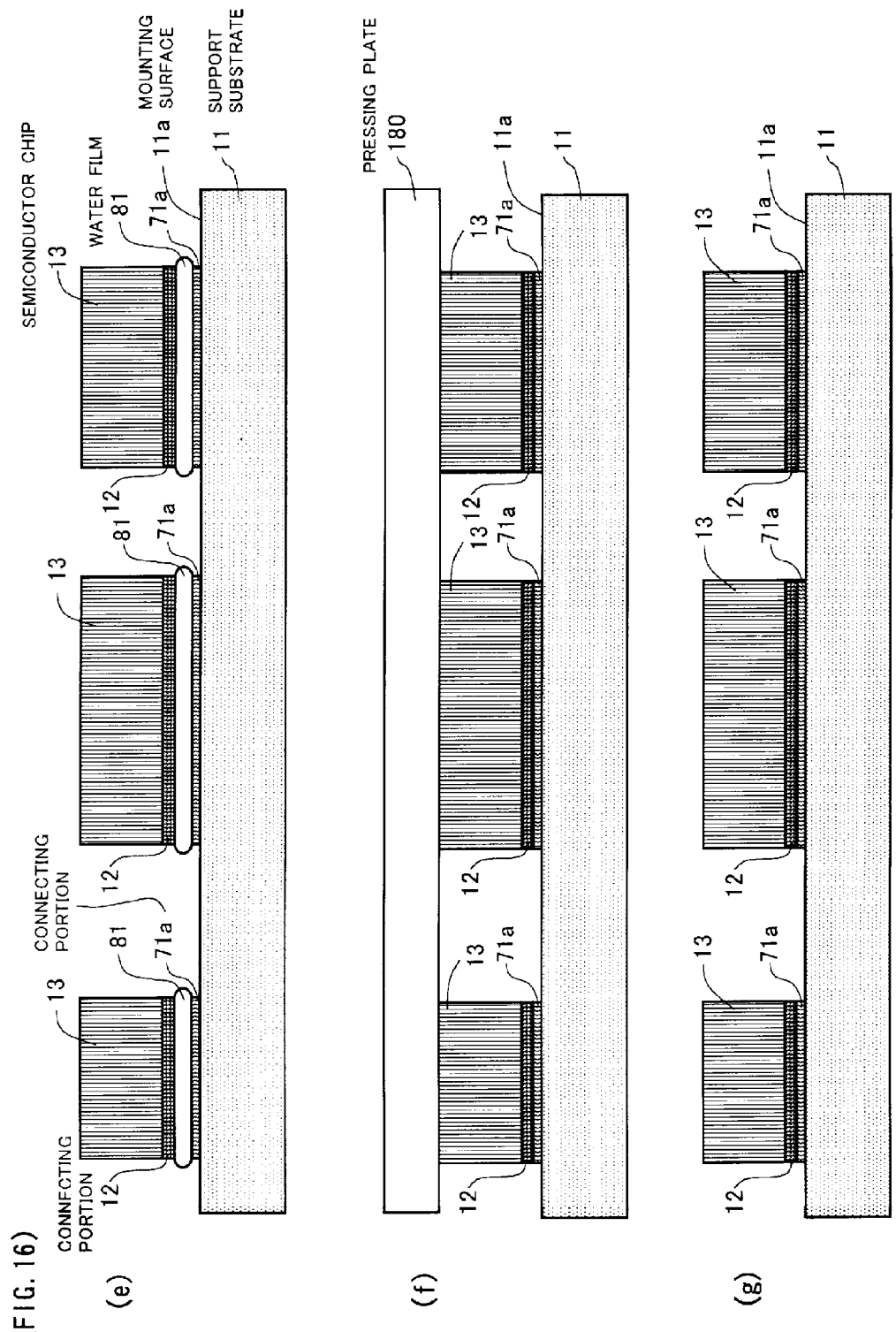

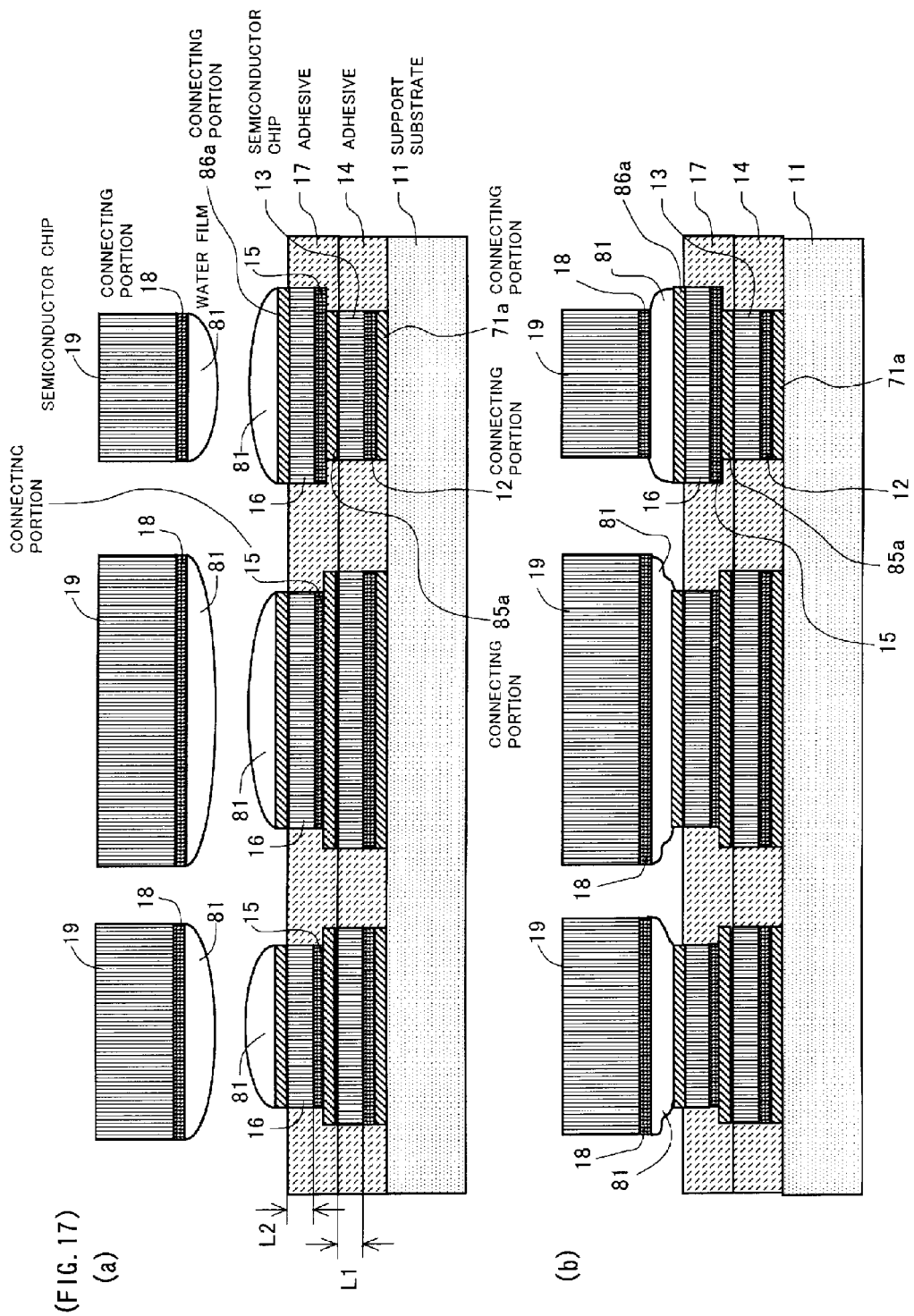

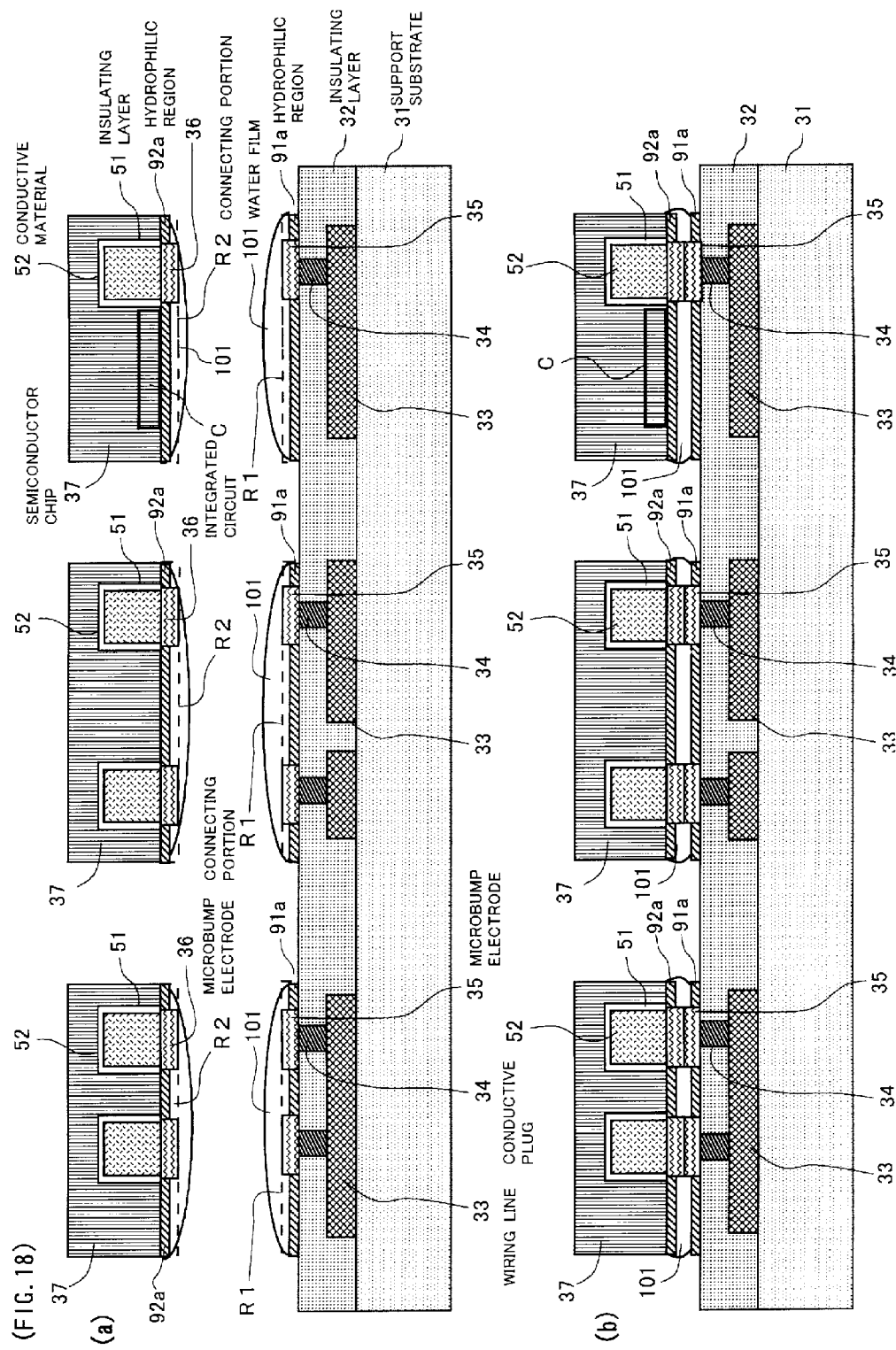

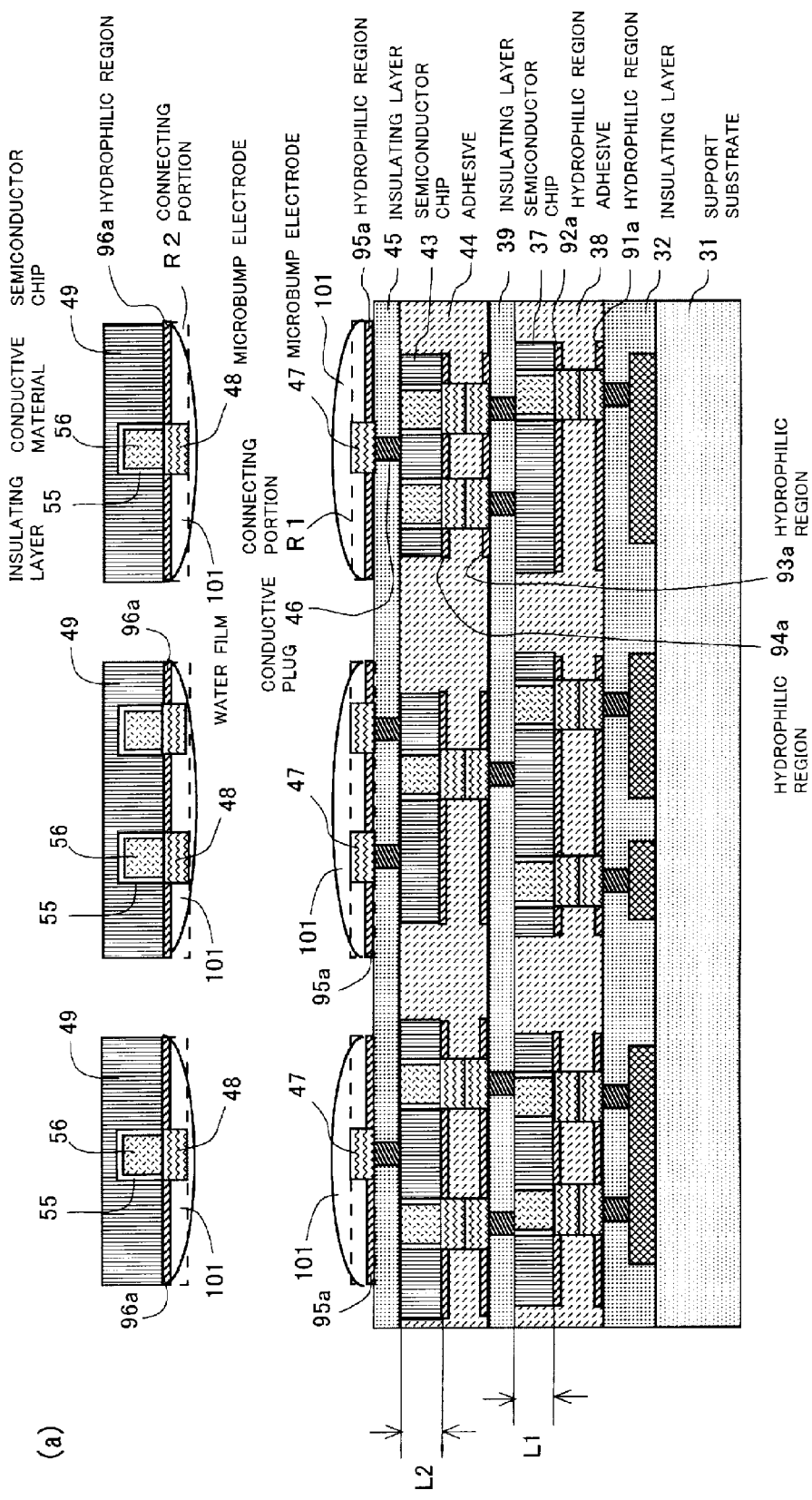
(FIG. 19)
(a)

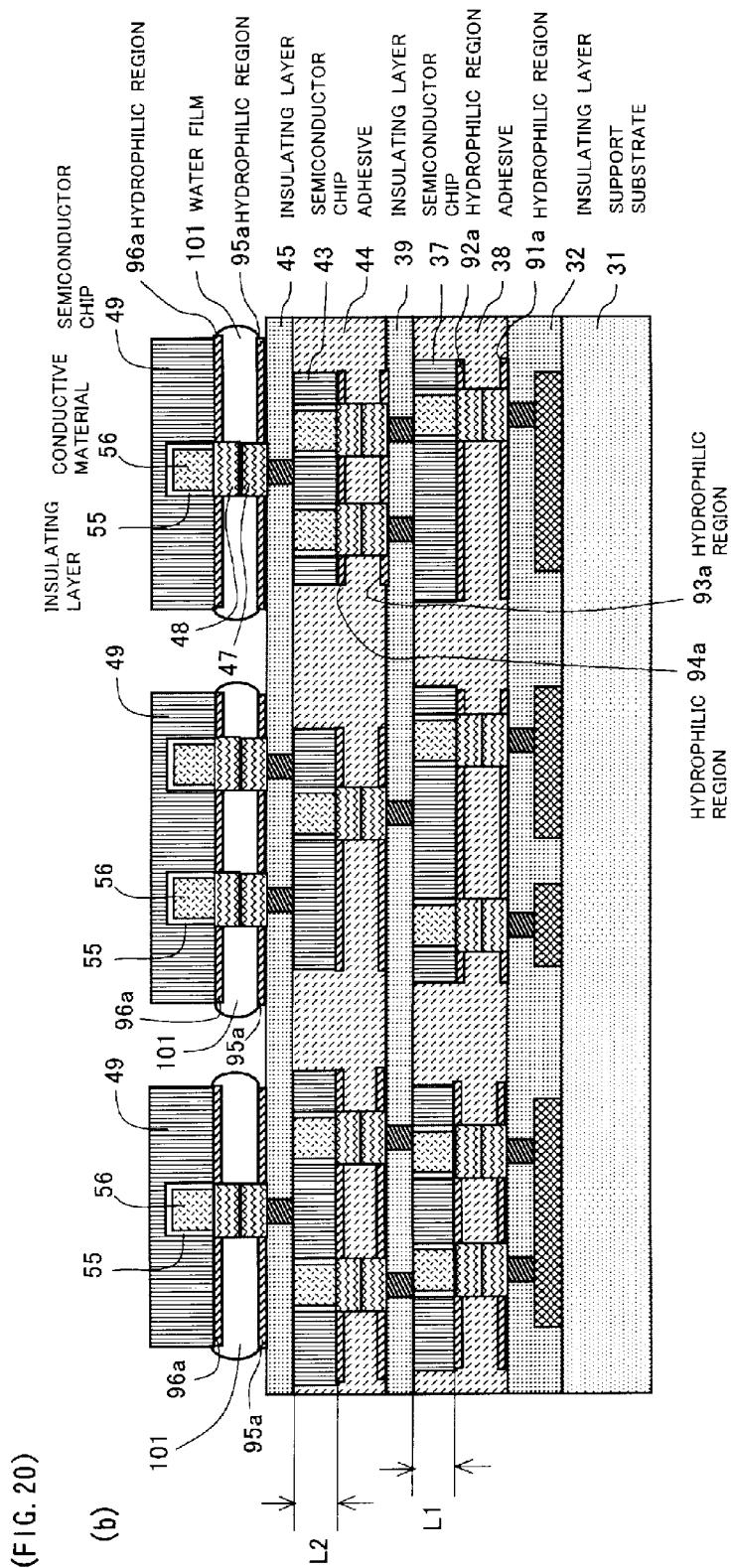

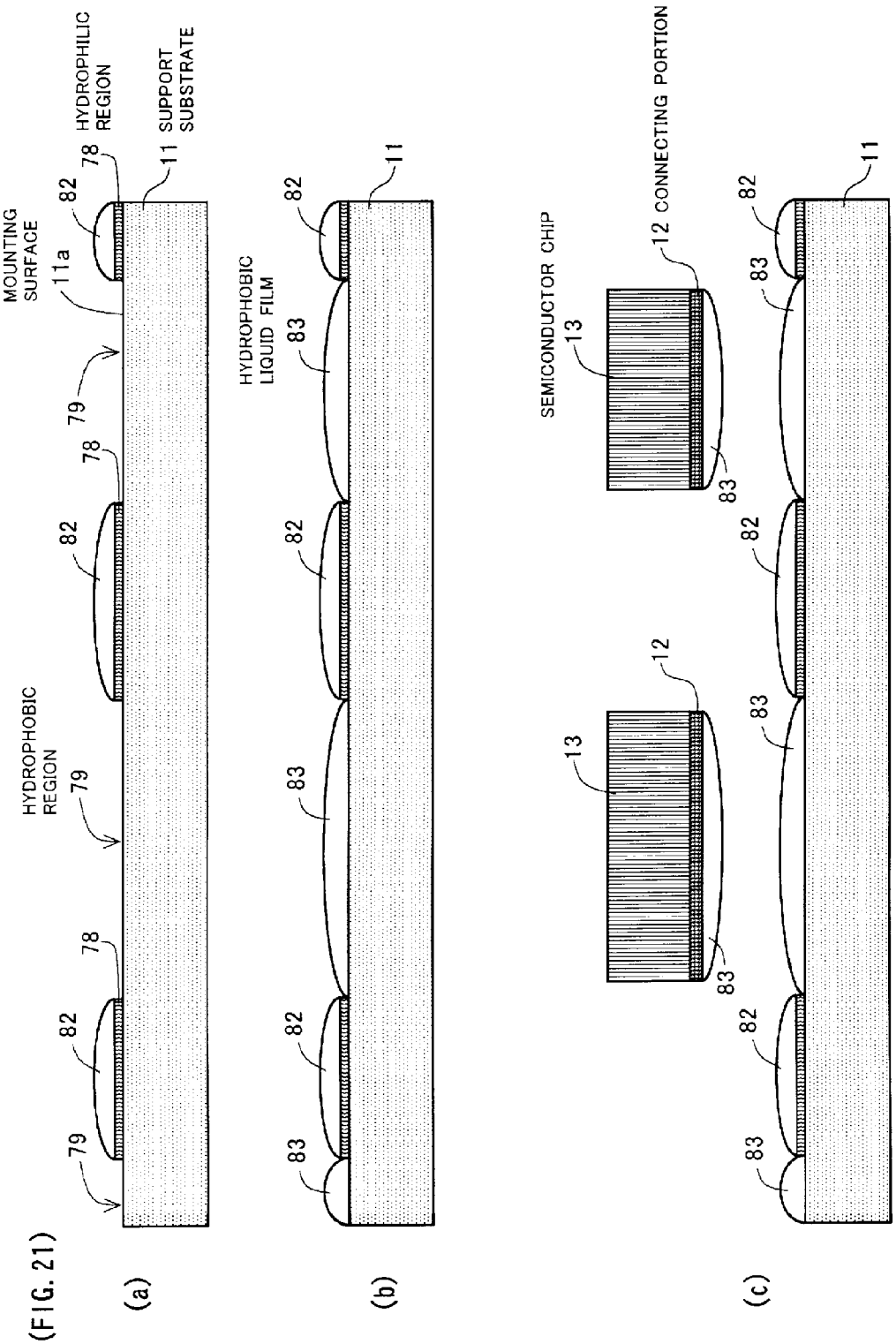

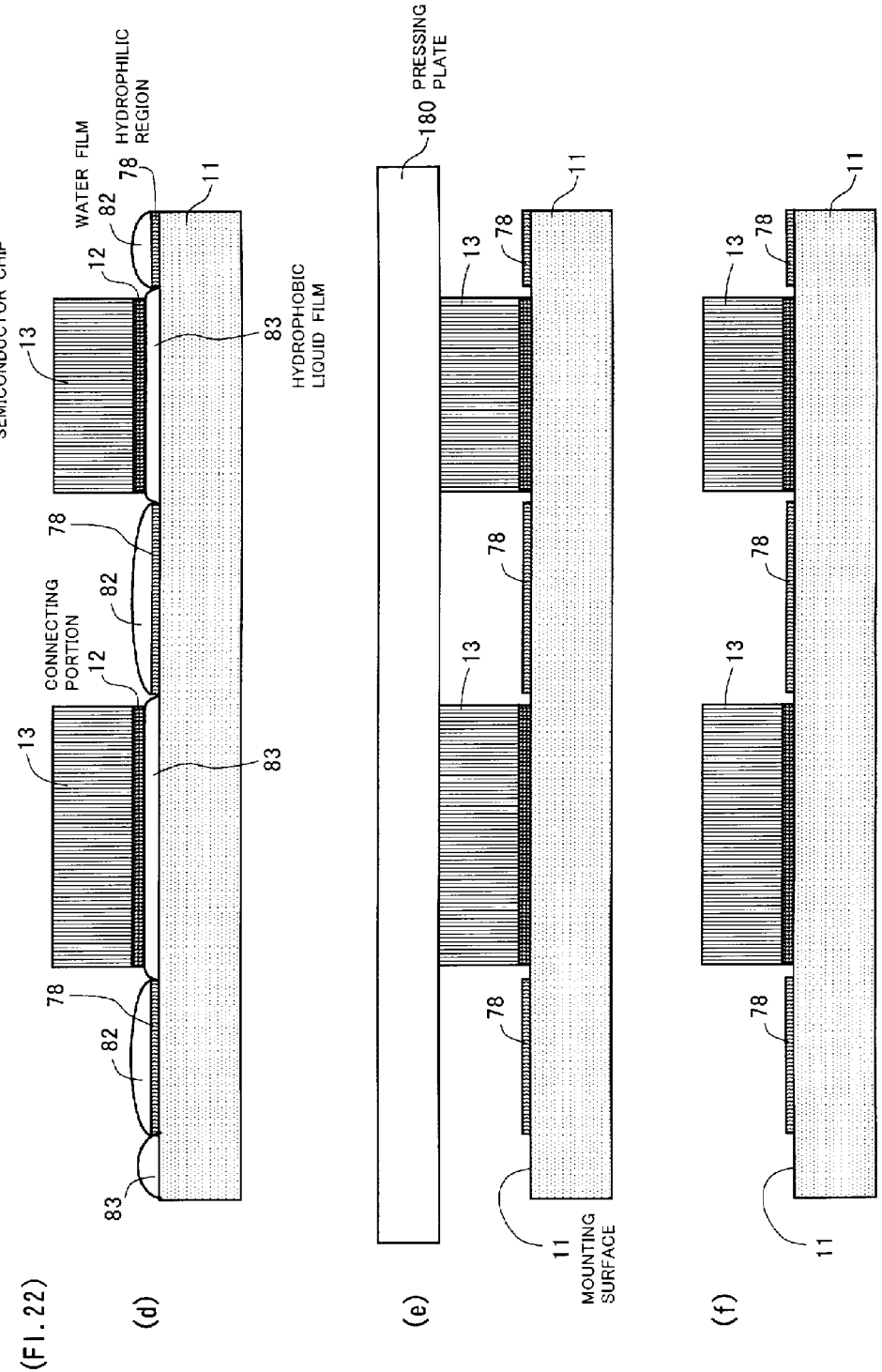

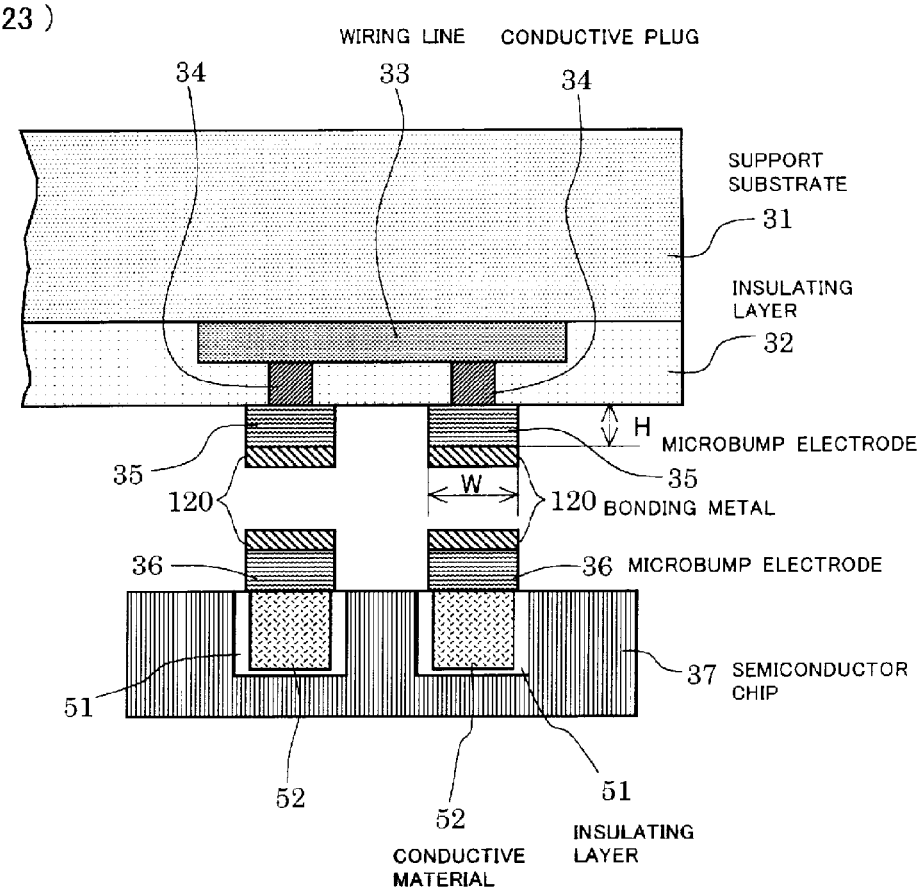
( FIG.23 )

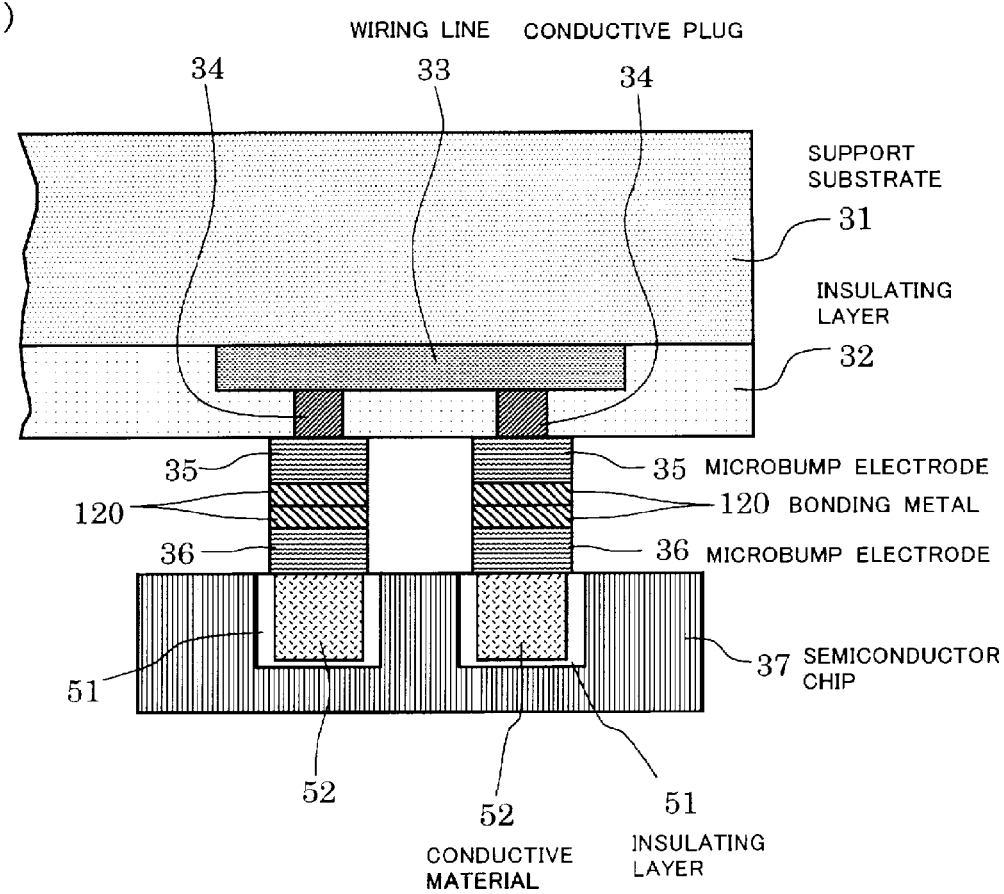

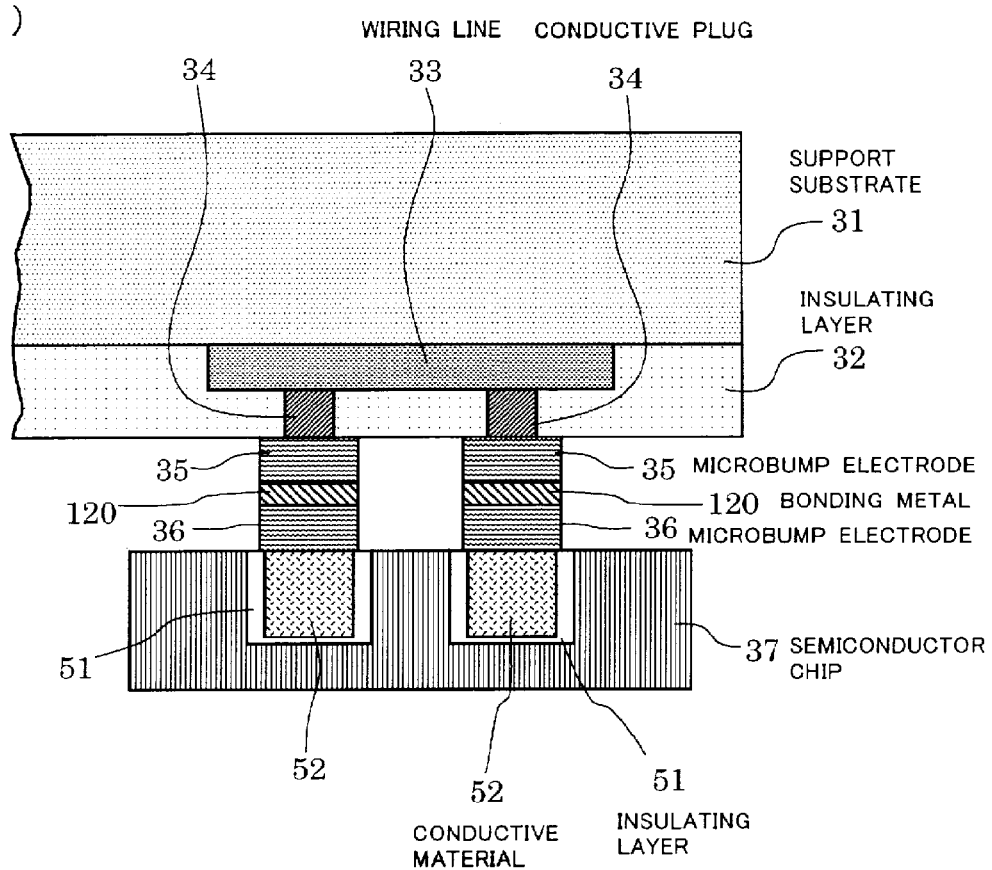
(FIG.25)

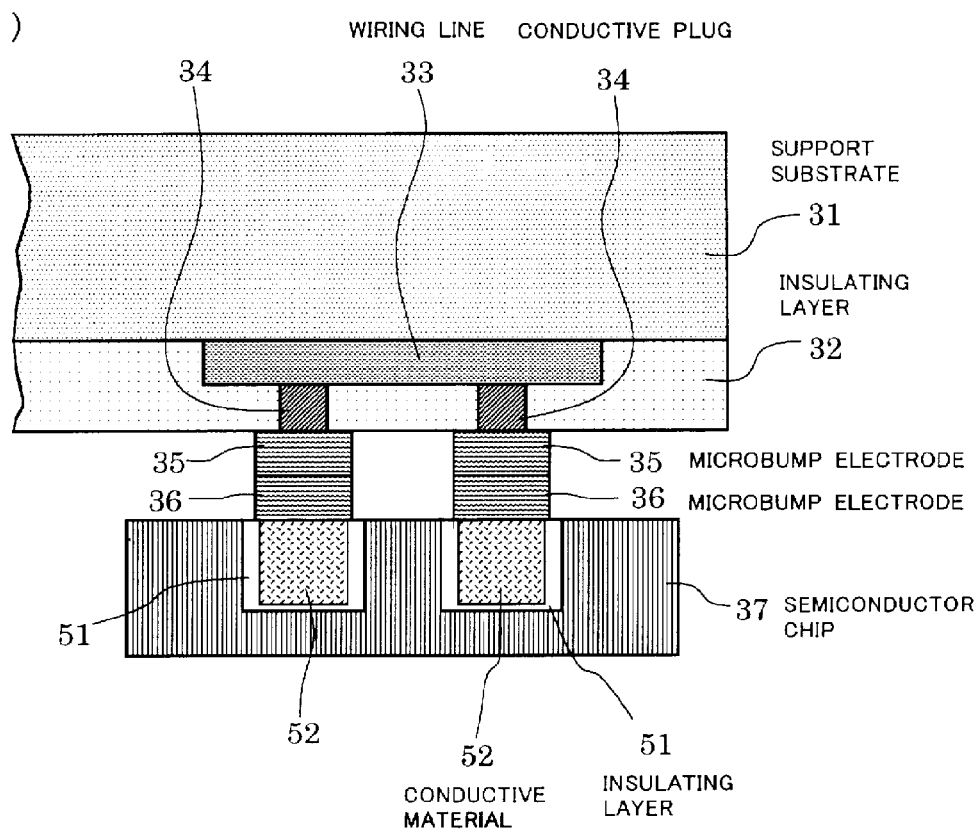
(FIG.26)

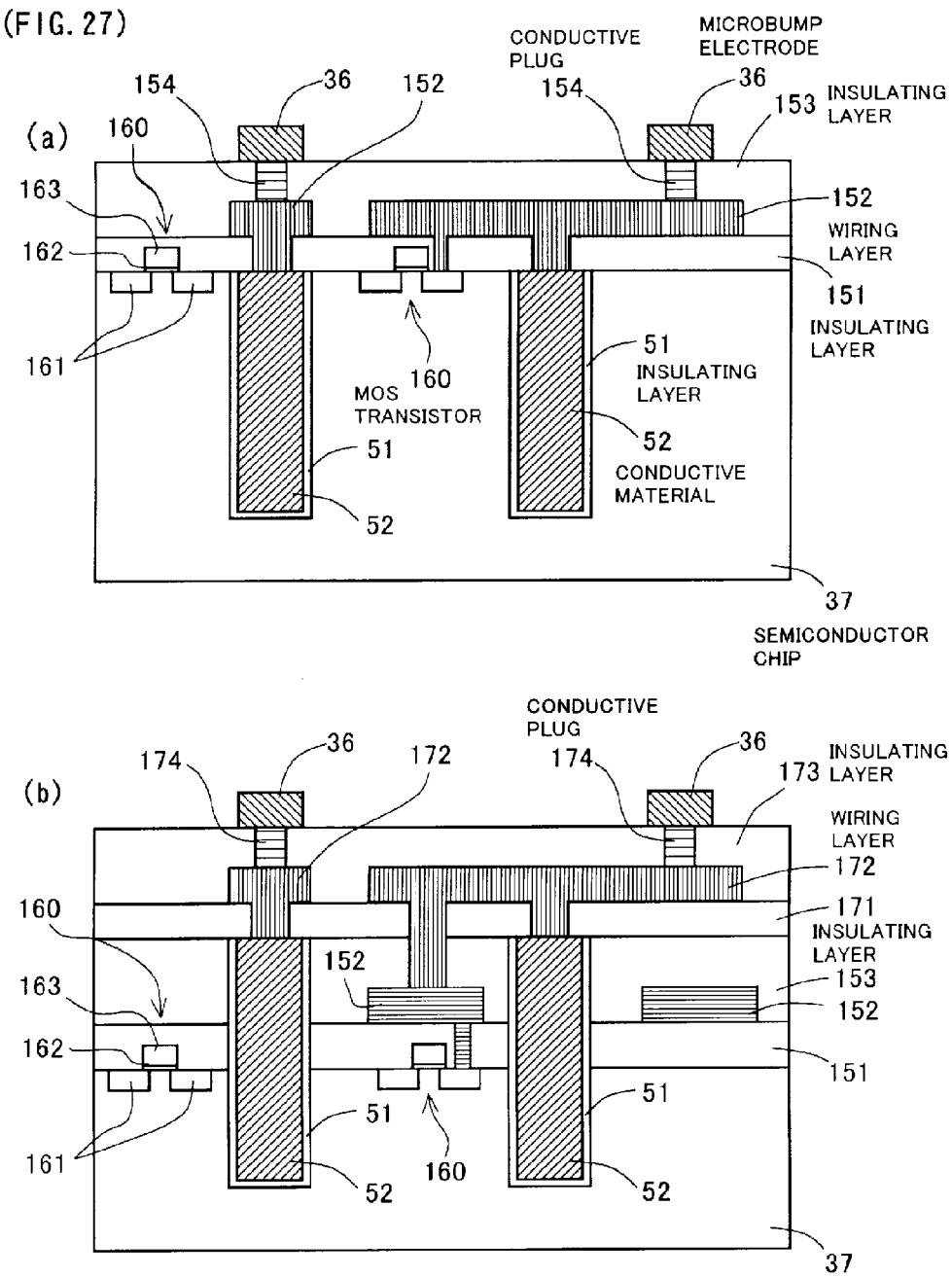

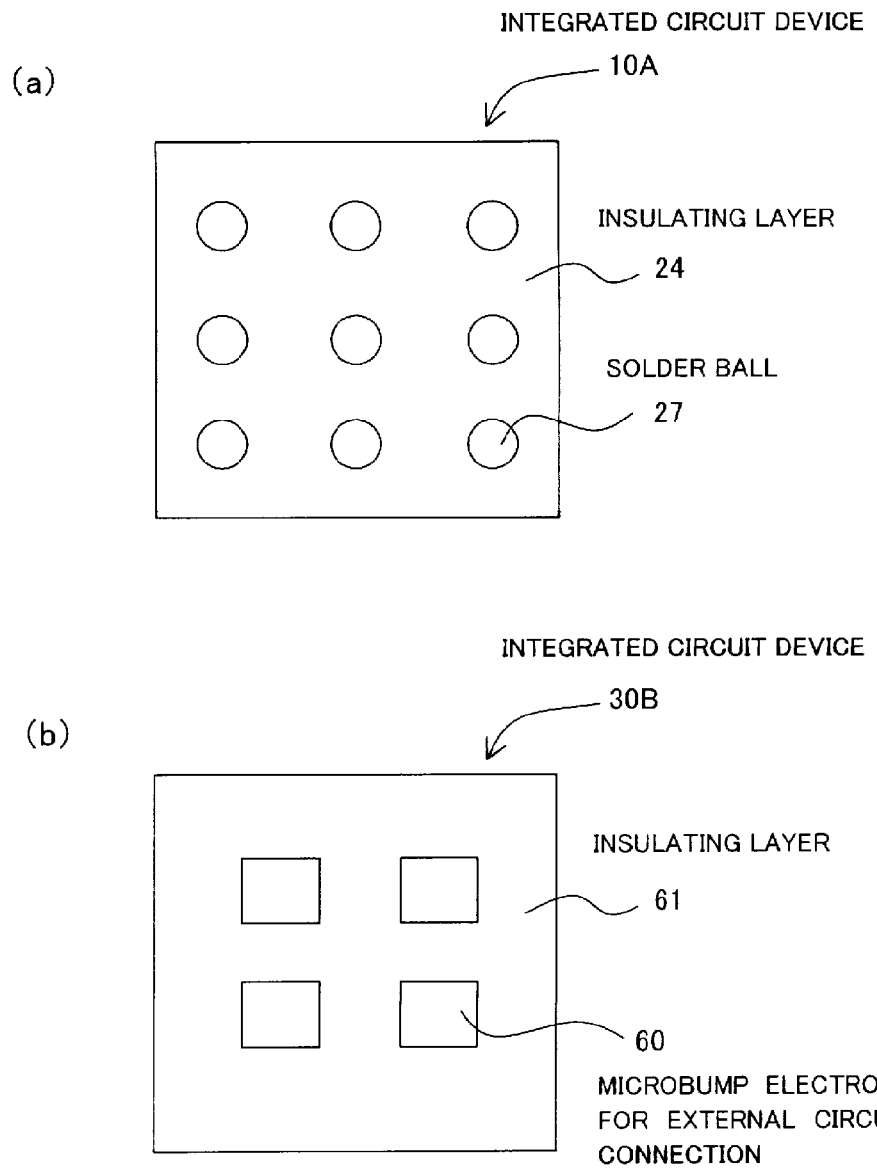

(FIG.29)
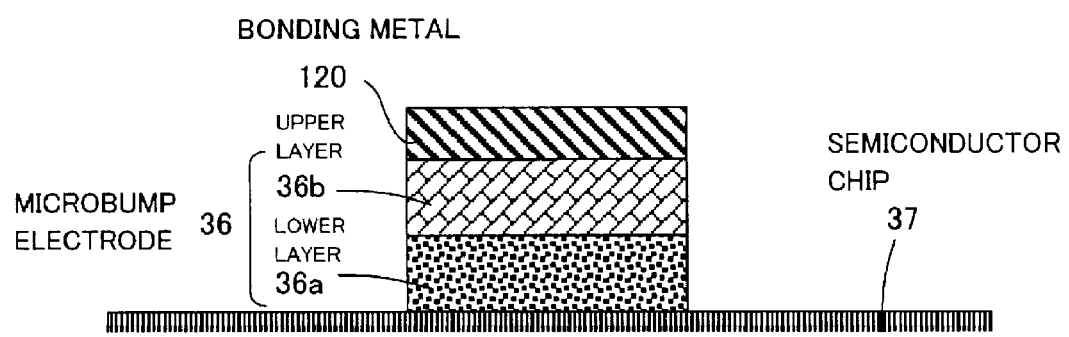

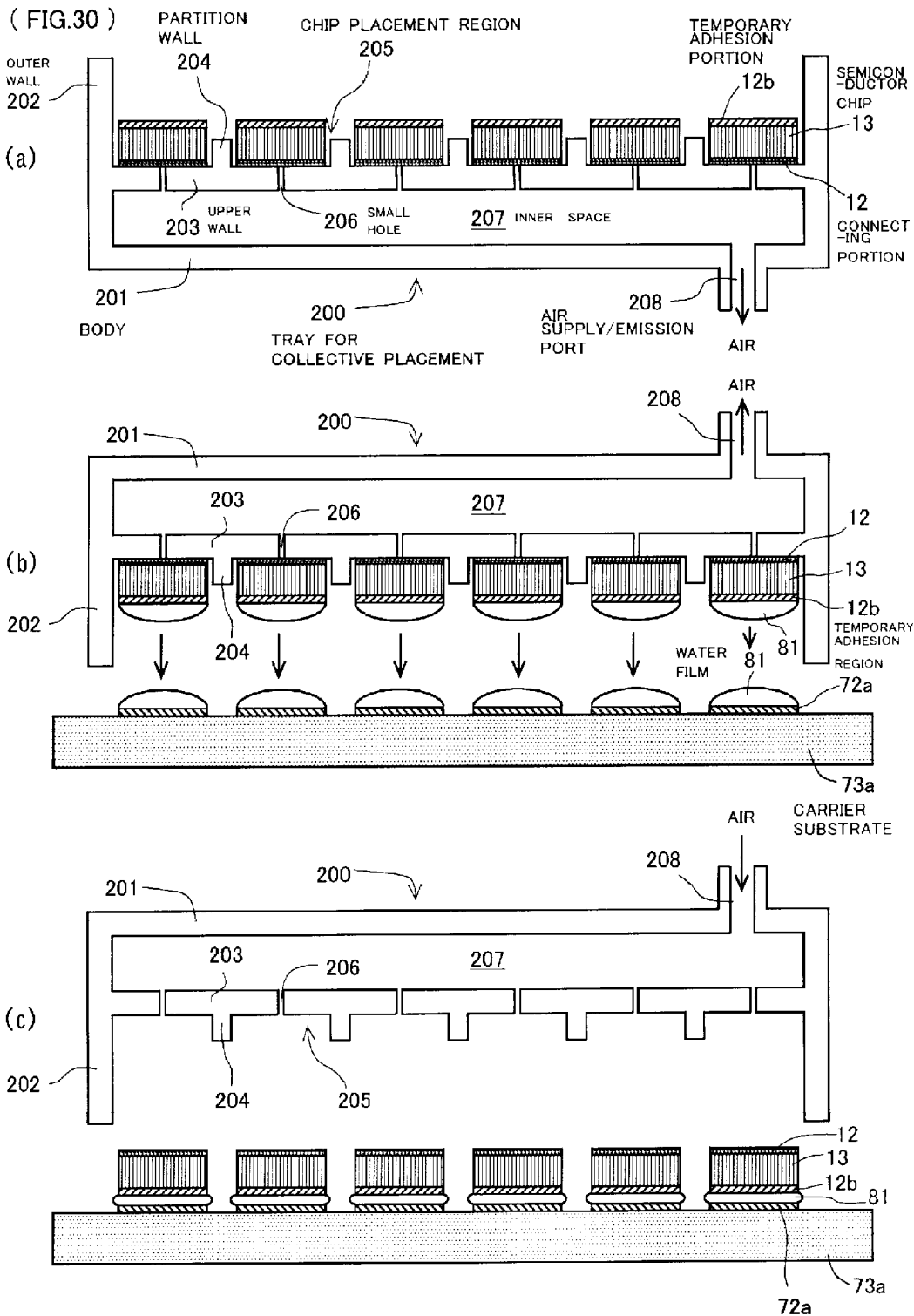

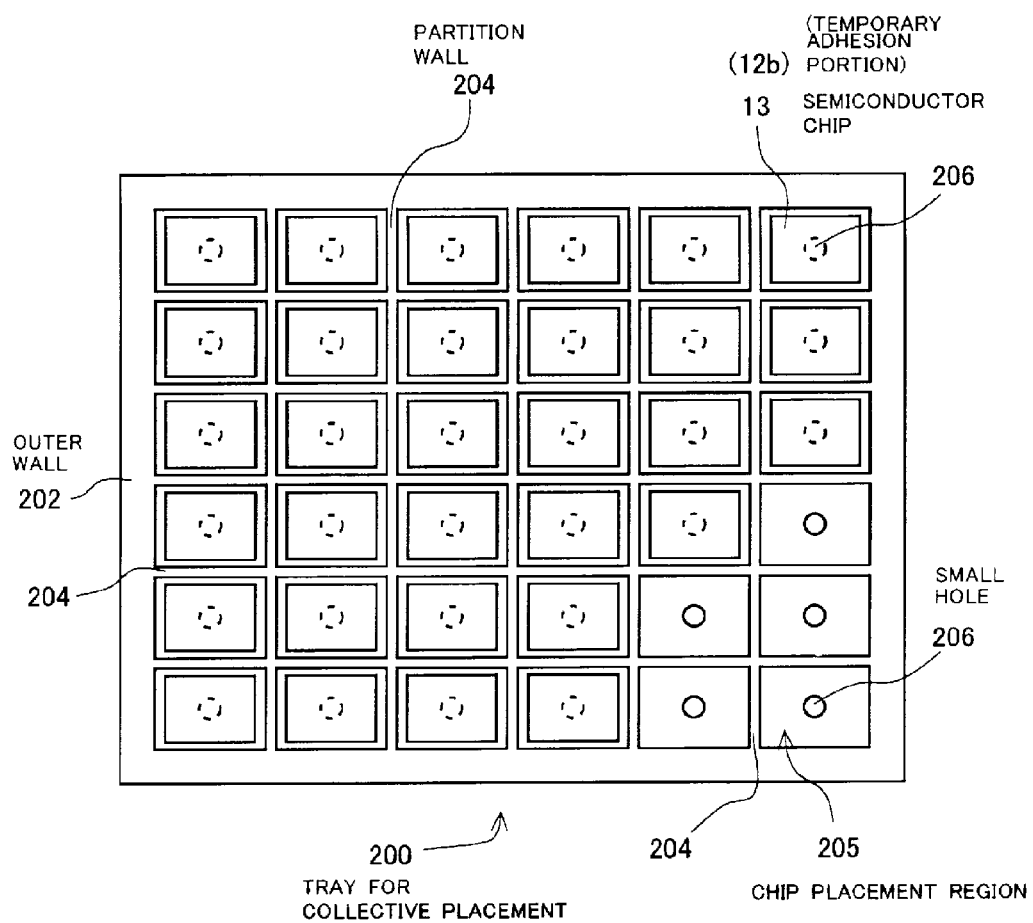

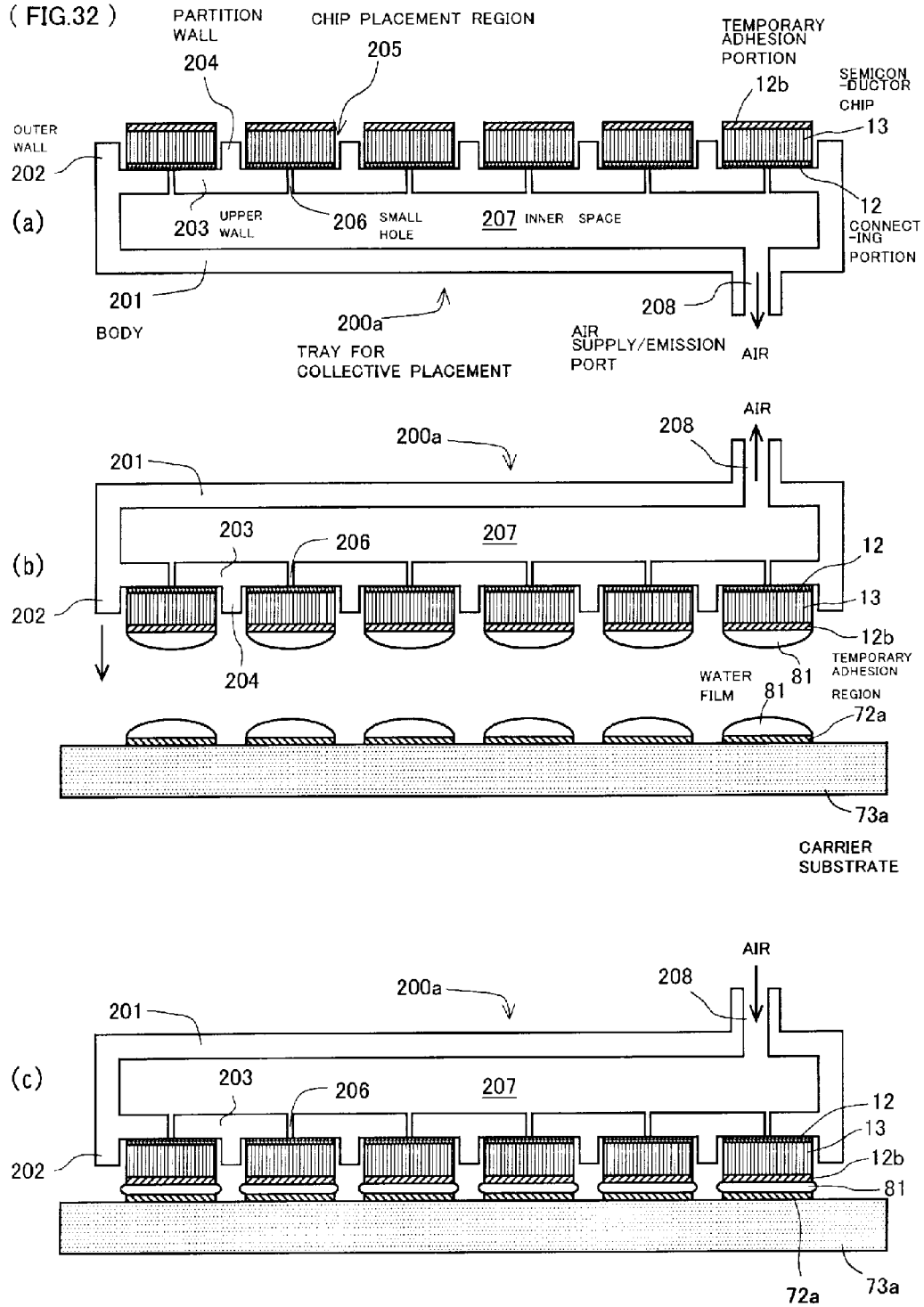

(FIG. 33)
(a)
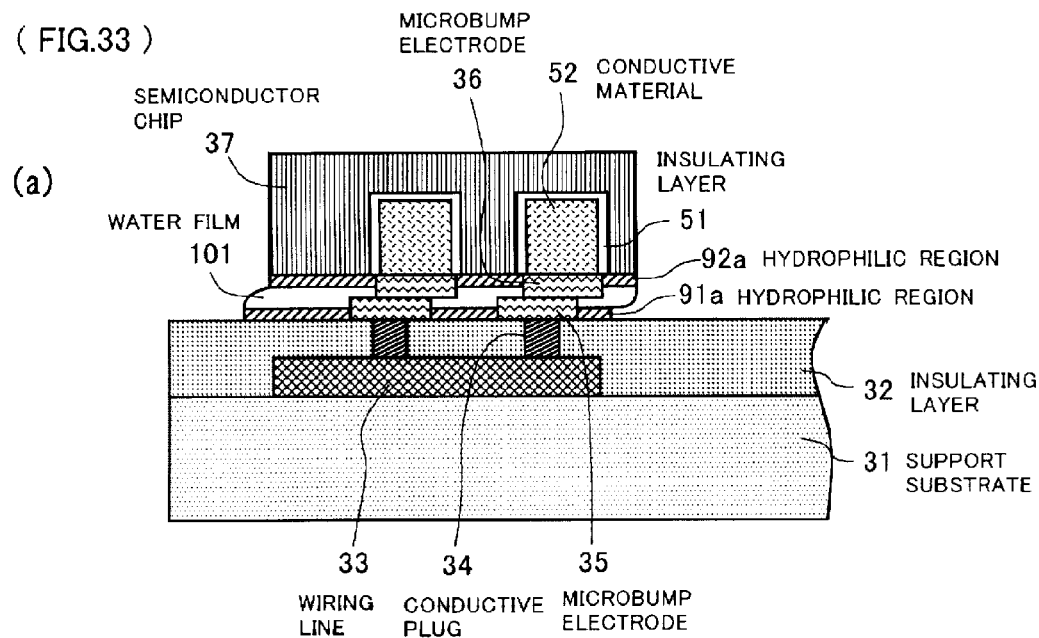
(b)
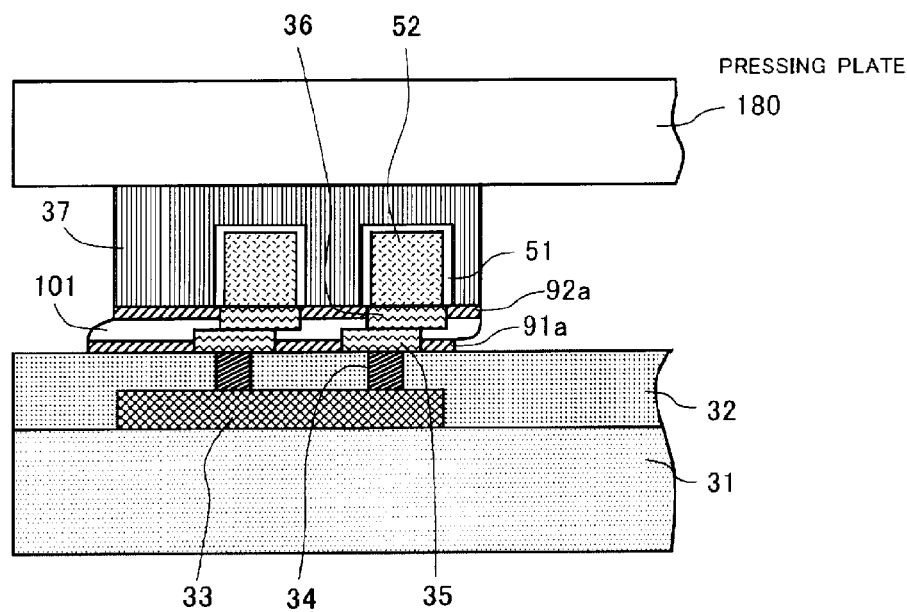

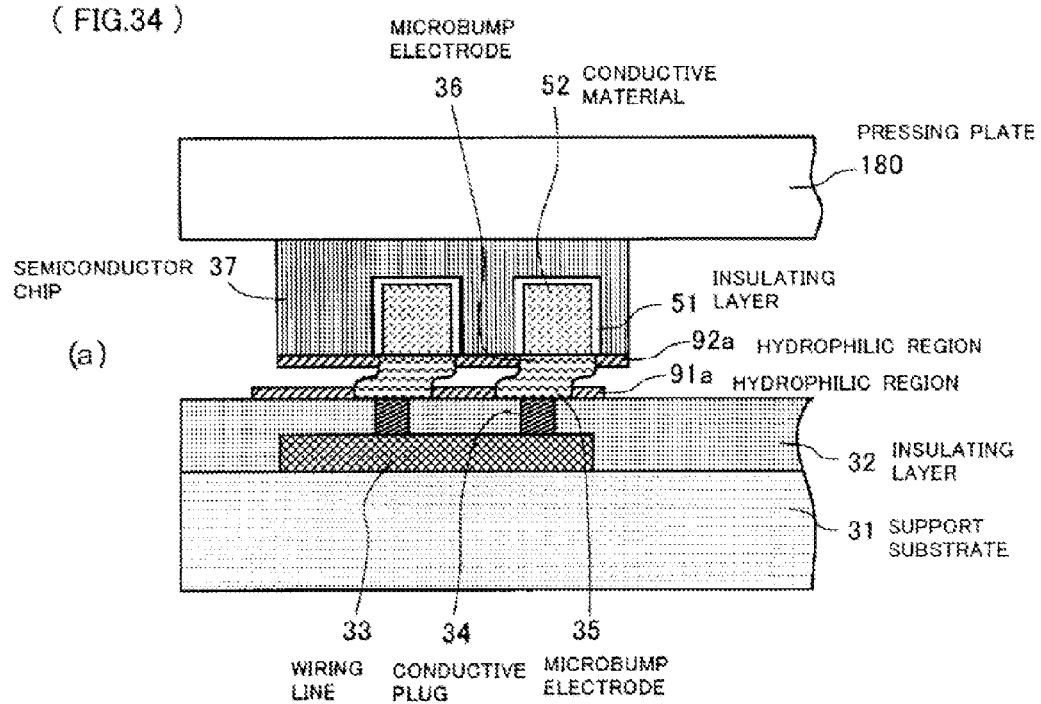
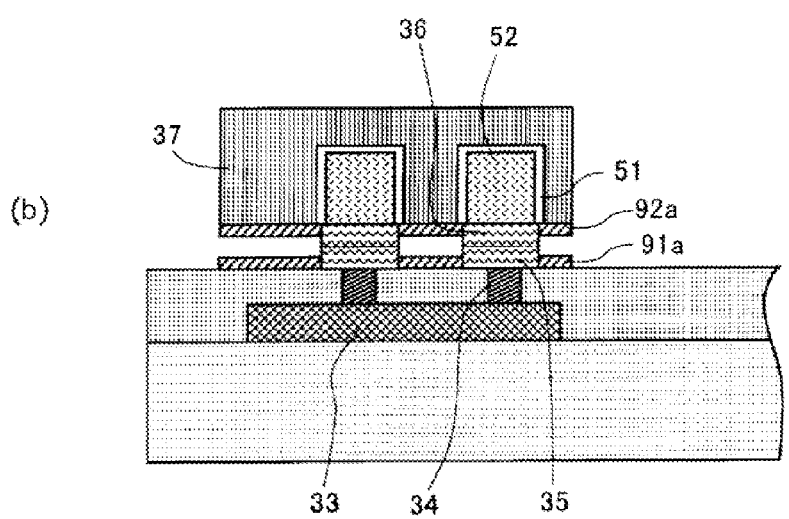
(FIG.34)

(FIG.35)
(a)
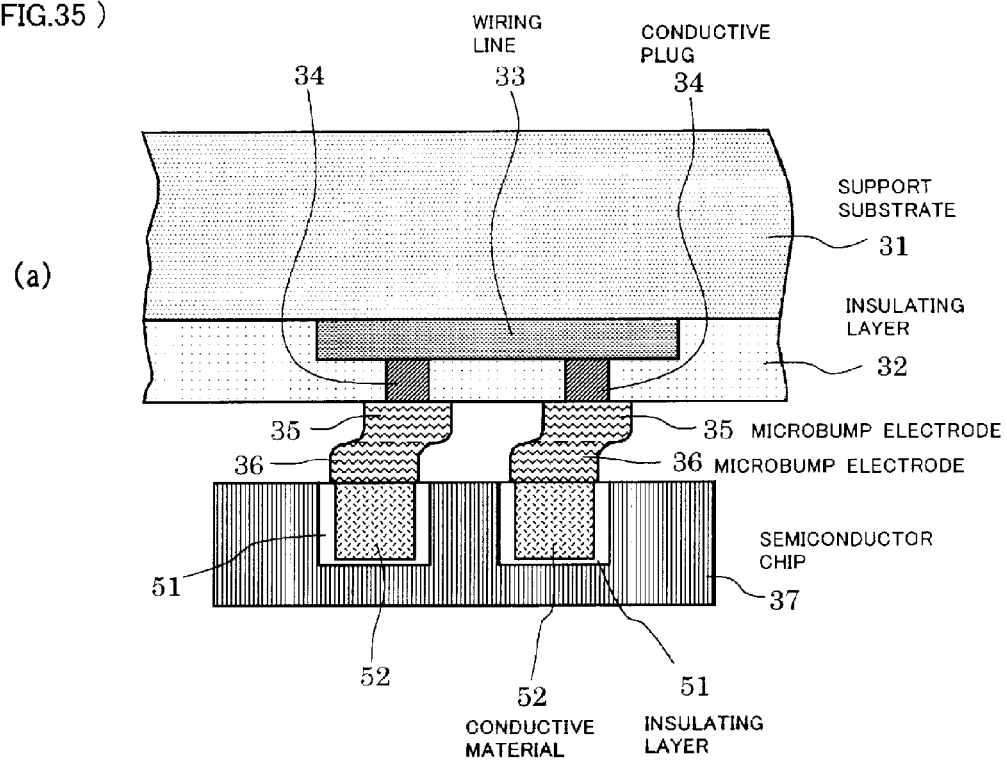
(b)
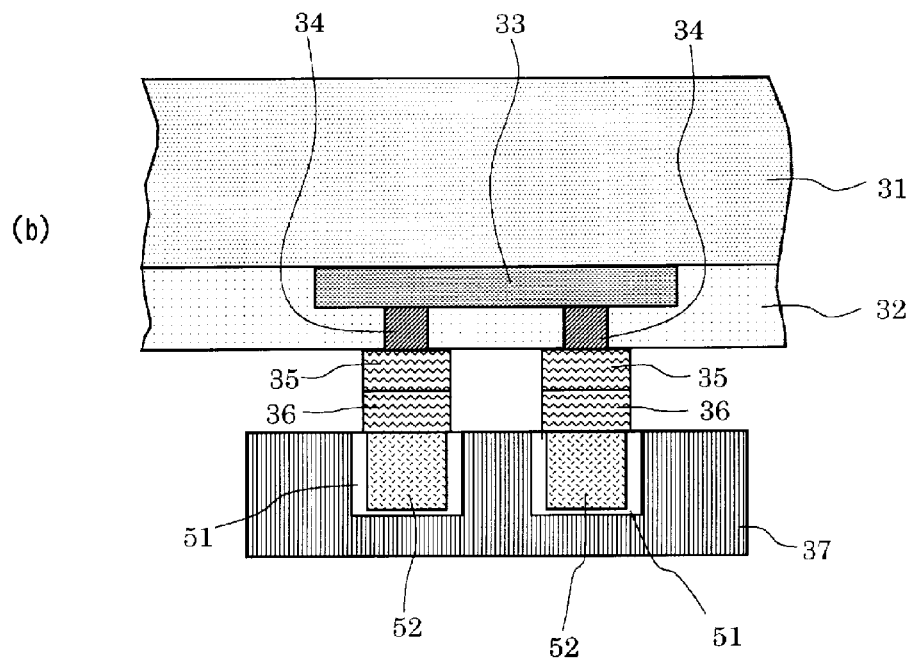

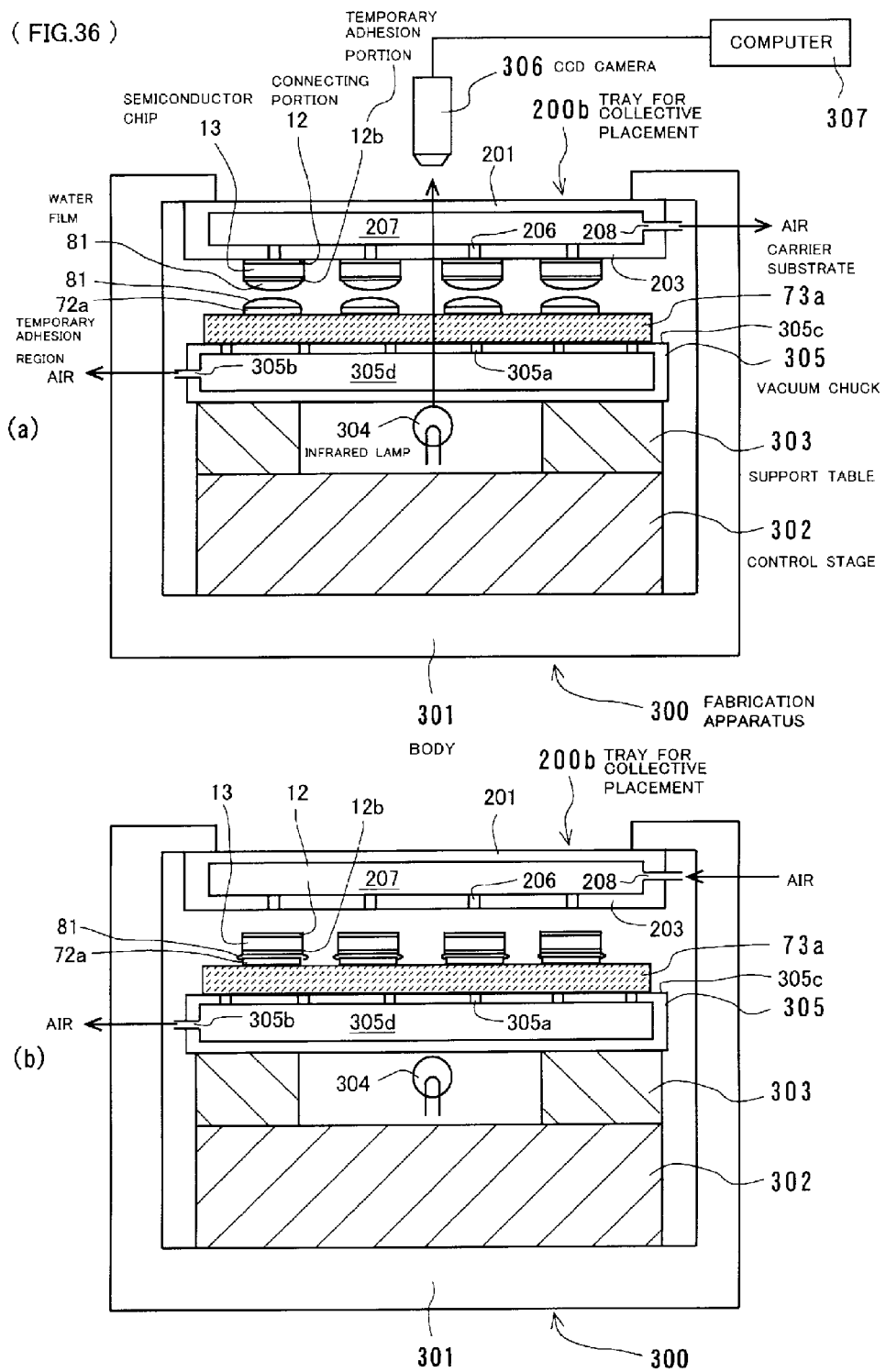

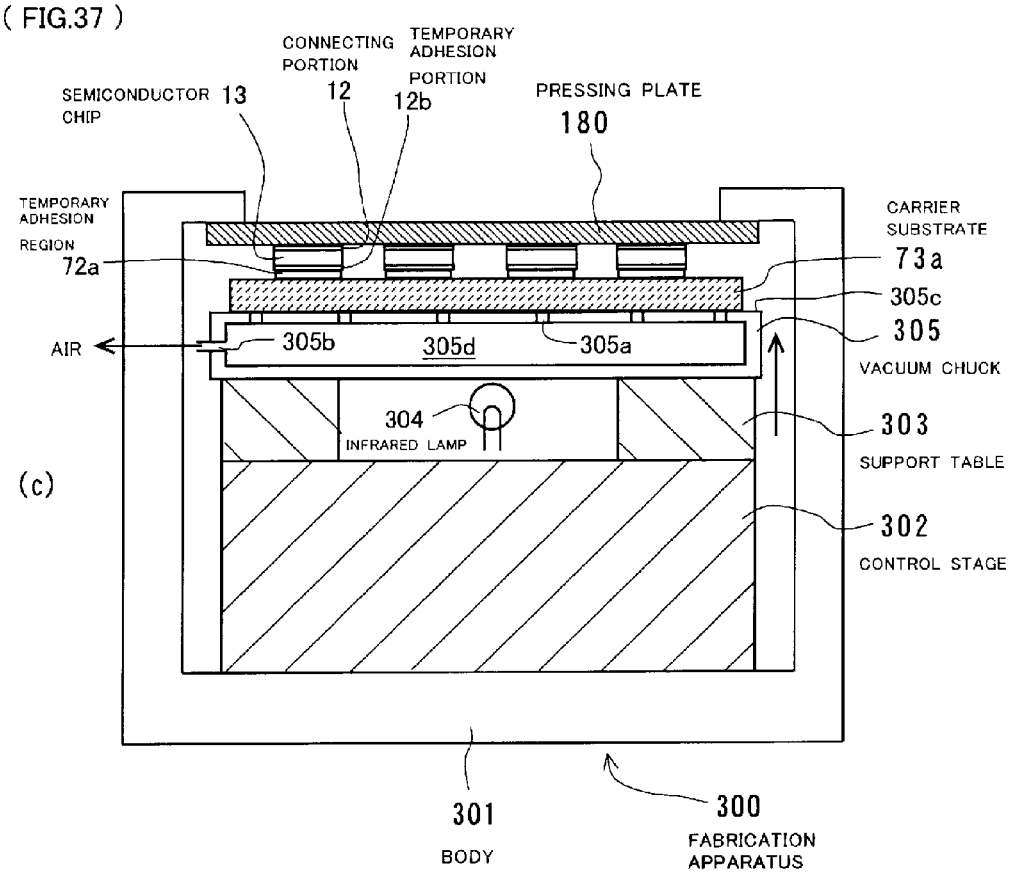
( FIG.37 )

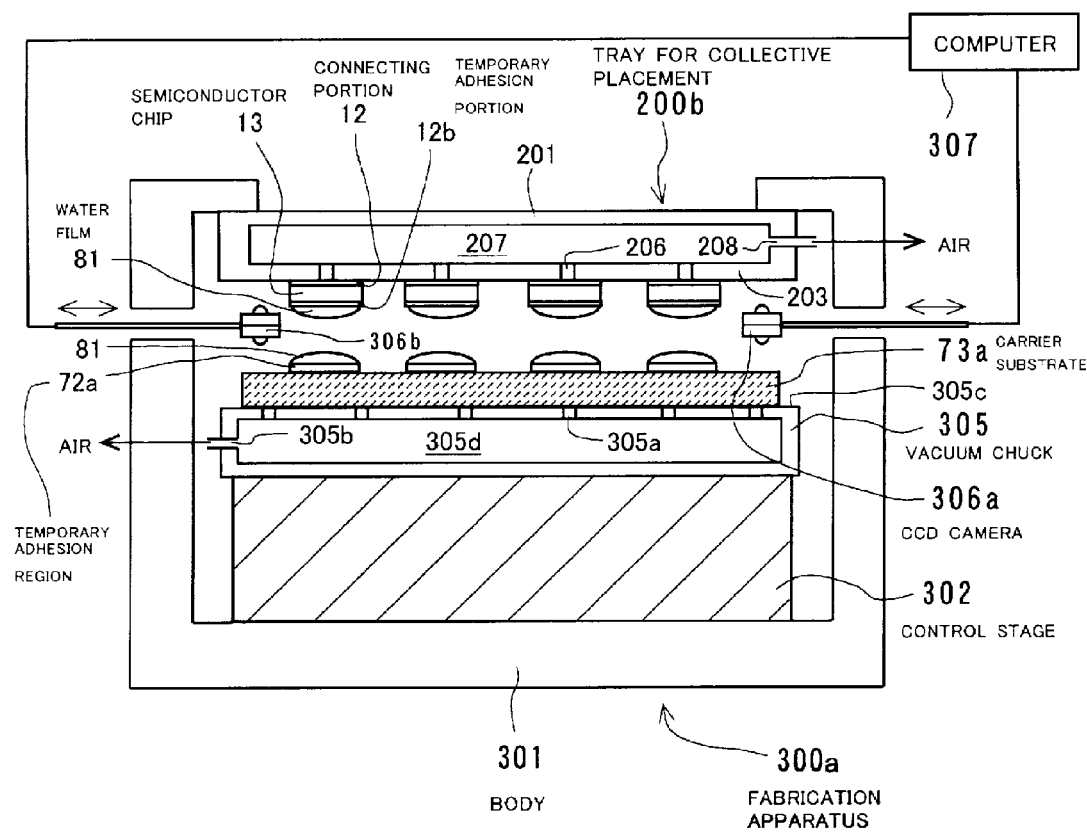
(FIG.38)

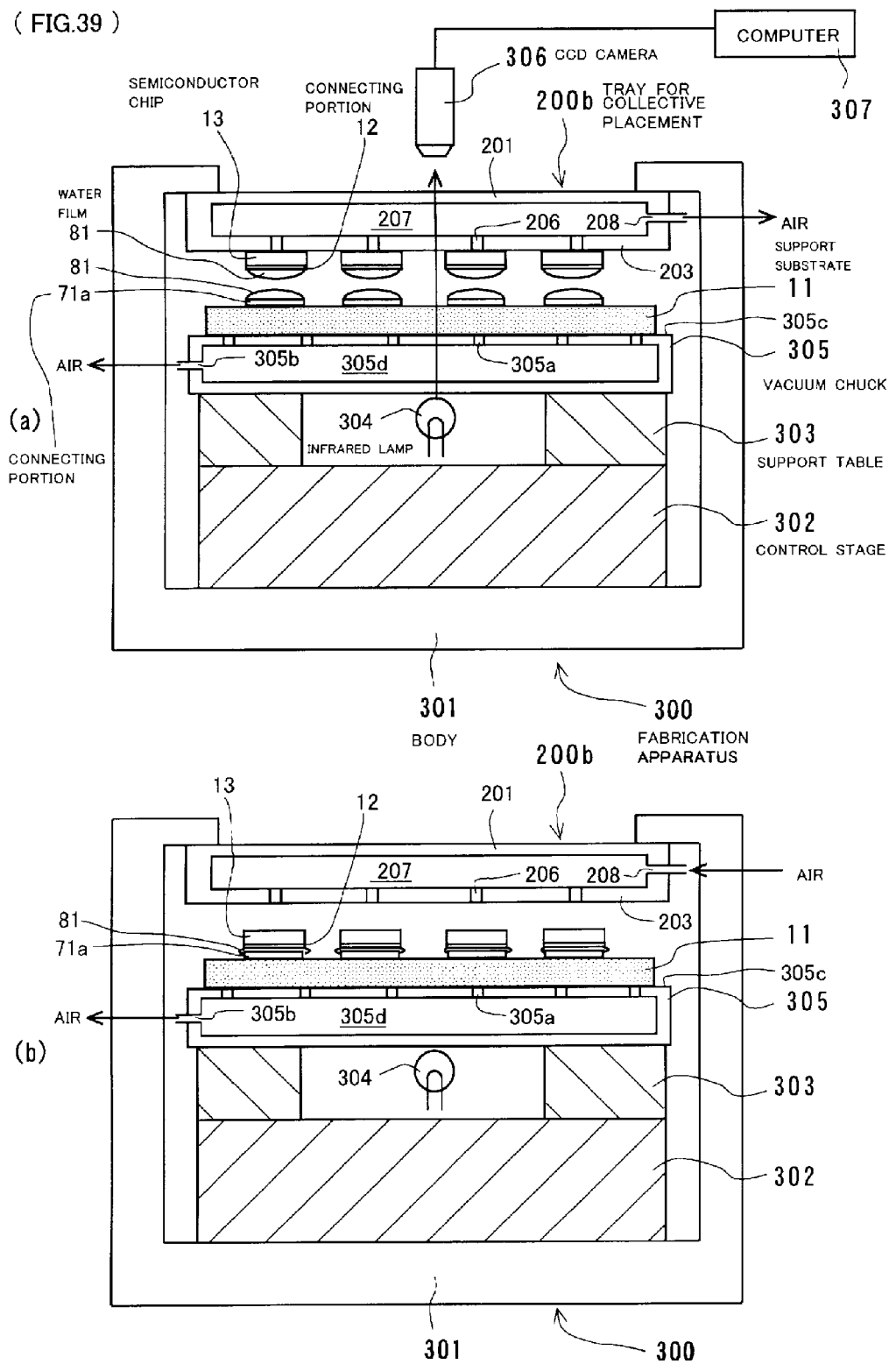

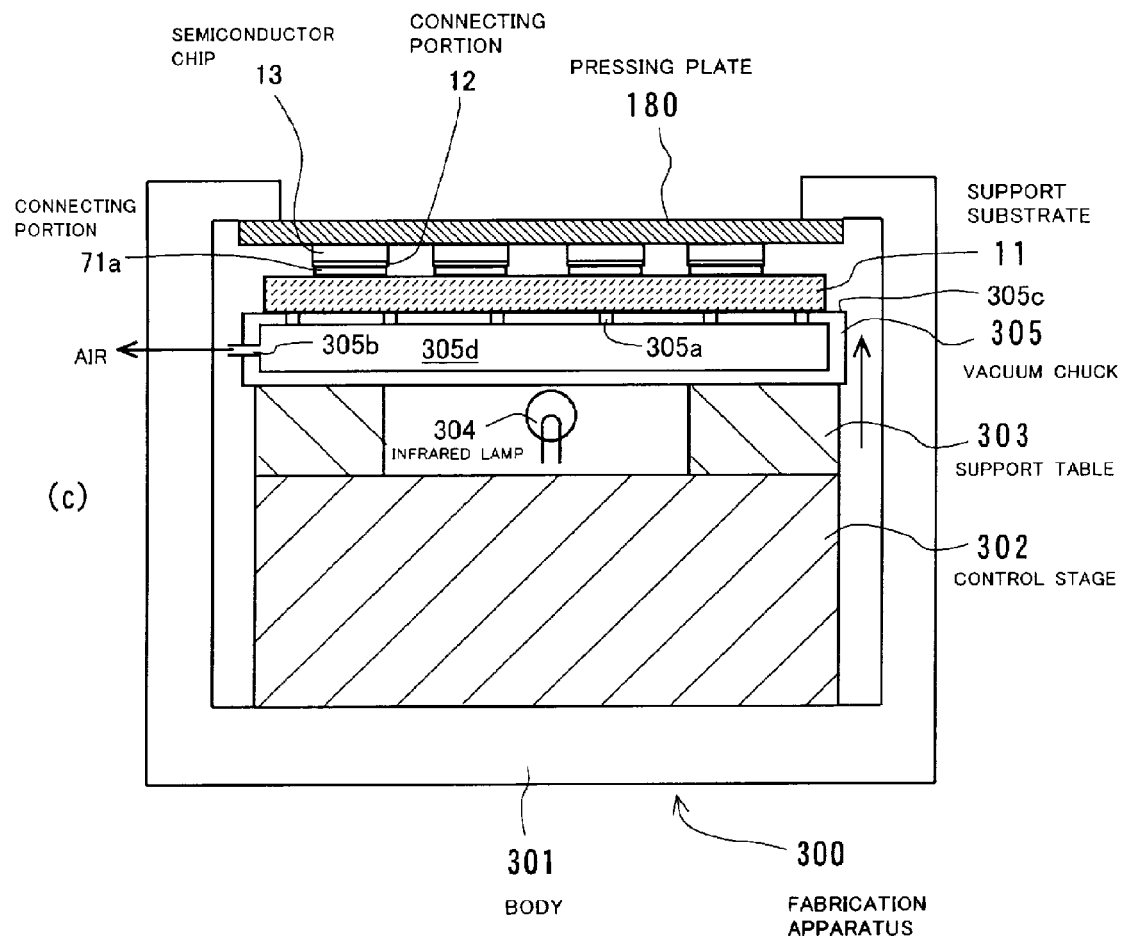

METHOD AND APPARATUS FOR FABRICATING INTEGRATED CIRCUIT DEVICE USING SELF-ORGANIZING FUNCTION

TECHNICAL FIELD

The present invention relates to a method and an apparatus for fabricating an integrated circuit device having a three-dimensional stacked structure formed by stacking circuit layers on a support substrate. More particularly, the invention relates to a method for fabricating an integrated circuit device having a three-dimensional stacked structure, which includes the step of fixing chip-shaped semiconductor circuits on a support substrate or a desired circuit layer to have a predetermined layout using the so-called self-organizing function, and an apparatus for performing the method.

BACKGROUND ART

In recent years, semiconductor devices (integrated circuit devices) with a three-dimensional structure formed by stacking semiconductor chips were announced. For example, Kurino et al. announced an "Intelligent Image Sensor Chip with Three-Dimensional Structure" in 1999 IEDM Technical Digest published in 1999 (see Non-Patent Document 1).

This image sensor chip has a four-layer structure, where a processor array and an output circuit are located in the first layer, data latches and masking circuits are located in the second layer, amplifiers and analog-to-digital converters are located in the third layer, and an image sensor array is located in the fourth layer. The uppermost surface of the image sensor array is covered with a quartz glass layer containing the microlens array. The microlens array is formed on the surface of the quartz glass layer. A photodiode is formed as the semiconductor light-receiving element in each image sensor of the image sensor array.

The respective layers constituting the four-layer structure are mechanically connected to each other with an adhesive, and are electrically connected to each other with buried interconnections using conductive plugs and microbump electrodes contacted with the interconnections.

Moreover, Lee et al. announced an image-processing chip comprising image sensors similar to the solid-state image sensor announced by Kurino et al. in Japan Journal of Applied Physics entitled "Development of Three-Dimensional Integration Technology for Highly Parallel Image-processing Chip" published in April 2000 (see Non-Patent Document 2).

The image sensor chip of Lee et al. has approximately the same configuration as the solid-stage imaging sensor announced by Kurino et al. in the above-described treatise.

With any one of the two above-described semiconductor devices (integrated circuit devices) having the three-dimensional stacked structure, a plurality of semiconductor wafers are stacked and adhered to each other to form a wafer stack and thereafter, the wafer stack is divided into a plurality of chips by cutting (dicing), resulting in the semiconductor devices (integrated circuit devices). In other words, semiconductor wafers in which integrated circuits have been respectively formed are stacked and fixed on the wafer level, realizing the three-dimensional stacked structure.

By the way, recently, a microelectro-mechanical system constituted by sequentially stacking a plurality of semiconductor device chips (semiconductor chips) and/or micro electronic components on a substrate has been attracting public attention. This is because there is a possibility that semiconductor chips having different functions and/or sizes can be combined and used for this system as necessary, and because if this is realized, there is an advantage that the degree of freedom in designing is expanded.

For example, Non-Patent Document 3 discloses a self-assembly technique of microdevices to be used for a micro-electro-mechanical system (MEMS). This technique is a technique to mount a plurality of micro electronic components on a single substrate by utilizing hydrophobicity and capillary force. The substrate has hydrophobic alkanethiol-coated gold binding sites. To perform assembly, hydrocarbon oil, which has been applied to the surface of the substrate, wets exclusively the hydrophobic binding sites in water. Next, micro electronic components are put into the water, and assembled respectively on the oil-wetted biding sites. Here, by using an electrochemical method to deactivate specific biding sites, the components are assembled at the biding sites by capillary forces as desired. By repeatedly conducting these steps, different batches of micro electronic components can be sequentially assembled onto the single substrate. After the assembly operation is completed, electrical connection between the substrate and the components thus assembled is established by electroplating.

Non-Patent Document 1: H. Kurino et al., "Intelligent Image Sensor Chip with Three Dimensional Structure", 1999 IEDM Technical Digest, pp. 36.4.1-36.4.4, 1999

Non-Patent Document 2: K. Lee et al., "Development of Three-Dimensional Integration Technology for Highly Parallel Image-processing Chip", Jpn. J. of Appl. Phys., Vol. 39, pp. 2474-2477, April 2000

Non-Patent Document 3: X. Xiong et al., "Controlled Multi-batch Self-Assembly of Microdevices", Journal of Michroelectromechanical Systems, Vol. 12, No. 2, pp. 117-127, April 2003

DISCLOSURE OF THE INVENTION

Problems to be Solved by the Invention

The semiconductor devices (integrated circuit devices) each having the three-dimensional structure formed by stacking semiconductor chips disclosed in above-described Non-Patent Documents 1 and 2 are each fabricated by stacking and fixing semiconductor wafers each including many integrated circuits to be unified together, and by dividing (dicing) the wafer stack thus formed. In this case, the many integrated circuits formed on each wafer are usually the same and therefore, there is a disadvantage that all the semiconductor devices (integrated circuit devices) fabricated by dividing the wafer stack are limited to those having the same structure and the same function.

In recent years, "system LSIs" each formed by packing integrated circuits having different functions (e.g., CPU (Central Processing Unit) or DSP (Digital Signal Processor)) on a single substrate were developed. However, it is not easy to realize such system LSIs. This is because preferred materials and/or preferred fabrication processes are very different according to the function of the integrated circuit. Moreover, mountable circuits on the substrate are limited. For this reason, there has been the strong demand that semiconductor circuits with various built-in integrated circuits are fabricated in advance by using preferred materials and preferred fabrication processes to the built-in integrated circuits and then, the integrated circuits thus fabricated having various functions are appropriately combined and mounted on a single support substrate to constitute a three-dimensional stacked structure, thereby realizing semiconductor devices (integrated circuit devices) each having a similar function to the system LSI. This is because if this is realized, systemized semiconductor devices (integrated circuit devices) in a similar way to the system LSI can be easily obtained by combining semiconductor circuits having different functions and/or different sizes according to the necessity.

By the way, to realize semiconductor devices (integrated circuit devices) each having such the three-dimensional stacked structure as above, it is necessary to arrange the semiconductor circuits (which are usually chip-shaped) on the support substrate or a corresponding one of the circuit layers at their predetermined positions and to perform the electrical and mechanical interconnection among them. In this case, a known chip bonder or the like may be used for arrangement of the semiconductor circuits; however, it is desirable to develop an easier and more efficient method in consideration of the fabrication cost reduction.

Regarding the arrangement and electrical and mechanical interconnection of such the semiconductor circuits as above, the self-assembly technique of microdevices disclosed in the above-described Non-Patent Document 3 is applicable. However, it is difficult to apply this technique as-is because of the following reason. With this technique, the micro electronic components are collected in water to the deactivated binding sites by an electrochemical method by utilizing capillary forces, thereby assembling the components at the biding sites as desired. Thereafter, electrical connection of the said micro electronic components is carried out by electroplating. This means that the semiconductor circuits need to be immersed in water and put on the support substrate or the circuit layer at their predetermined positions and thereafter, they need to be taken out of water to be fixed (i.e., electrically and mechanically connected). As a result, the process sequence is complicated and disadvantageous to fabrication cost.

Moreover, in the case where bump electrodes are used for electrical interconnection of the semiconductor circuits, many bump electrodes are formed to have a predetermined layout on the bonding face of each of the semiconductor circuits. These bump electrodes need to be opposingly fixed to the corresponding bump electrodes or connecting regions of the wiring in a one-to-one relationship accurately. The assembly technique of the Non-Patent Document 3 is insufficient from the viewpoint of such accuracy (precision).

The present invention was created in consideration of these points. A chief object of the present invention is to provide a method of fabricating an integrated circuit device having a three-dimensional stacked structure that makes it possible to dispose and fix many (e.g., several hundreds of) chip-shaped semiconductor circuits easily and efficiently with desired accuracy on the support substrate or a desired one of the circuit layers that constitute the three-dimensional stacked structure in such a way as to form a desired layout, and an apparatus preferably applicable to performing the method.

Another object of the present invention is to provide a method of fabricating an integrated circuit device having a three-dimensional stacked structure that makes it possible to fix correctly the bump electrodes, which have been formed with a desired layout on the respective connecting portions of the semiconductor circuits, to the corresponding bump electrodes or to the corresponding connection areas of wiring lines oppositely in a one-to-one correspondence, and an apparatus preferably applicable to performing the method.

The other objects not specifically mentioned here will become clear from the following description and attached drawings.

Means for Solving the Problems (1) A method of fabricating an integrated circuit device having a three-dimensional stacked structure according to the first aspect of the present invention, which is a method of fabricating an integrated circuit device having a three-dimensional stacked structure formed by stacking circuit layers on a support substrate, comprises:

when fixing chip-shaped semiconductor circuits included in one of the circuit layers on a mounting surface of the support substrate or other of the circuit layers which is adjacent to the one of the circuit layers to have a desired layout;

forming at least one temporary adhesion region on a surface of a support member for transfer;

forming a temporary adhesion portion, which can be adhered to the temporary adhesion region, at an opposite end of each of the chip-shaped semiconductor circuits to a connecting portion thereof;

placing the chip-shaped semiconductor circuits on the support member to have a layout equivalent to a mirror image of the desired layout by temporarily adhering the temporary adhesion portion of each of the chip-shaped semiconductor circuits to the temporary adhesion region;

bringing collectively the temporary adhesion portions of the chip-shaped semiconductor circuits into contact with the mounting surface at corresponding predetermined positions thereof by causing the support member on which the chip-shaped semiconductor circuits have been placed to approach the mounting surface of the support substrate or the other of the circuit layers;

disposing the chip-shaped semiconductor circuits on the mounting surface to have the desired layout by fixing the connecting portions of the chip-shaped semiconductor circuits to the corresponding predetermined positions, which have been brought into contact with each other; and detaching the support member from the temporary adhesion portions of the chip-shaped semiconductor circuits by separating the support member from the support substrate or the other of the circuit layers.

In this specification, this method is termed the "transfer type". This is because the chip-shaped semiconductor circuits are first placed on the supporting member for transfer and thereafter, the semiconductor circuits on the supporting member are transferred to the desired mounting surface collectively.

(2) With the method of fabricating an integrated circuit device having a three-dimensional stacked structure according to the first aspect of the present invention, as explained above, first, the at least one temporary adhesion region is formed on the surface of the support member for transfer. On the other hand, the temporary adhesion portion, which can be adhered to the temporary adhesion region, is formed at the opposite end of each of the chip-shaped semiconductor circuits to the connecting portion thereof. Thereafter, the temporary adhesion portion of each of the chip-shaped semiconductor circuits is temporarily adhered to the temporary adhesion region, thereby placing the chip-shaped semiconductor circuits on the support member to have the layout equivalent to the mirror image of the desired layout. At this time, the temporary adhesion portions of the chip-shaped semiconductor circuits, which are located at their opposite ends to the connecting portion thereof, are temporarily adhered to the temporary adhesion region detachably. Subsequently, by causing the support member on which the chip-shaped semiconductor circuits have been placed to approach the mounting surface of the support substrate or the other of the circuit layers, the temporary adhesion portions of the chip-shaped semiconductor circuits are collectively brought into contact with the mounting surface at the corresponding predetermined positions thereof. Moreover, by fixing the connecting portions of the chip-shaped semiconductor circuits to the corresponding predetermined positions, which have been brought into contact with each other in this way, the chip-shaped semiconductor circuits are disposed on the mounting surface to have the desired layout. Namely, the chip-shaped semiconductor circuits are collectively transferred to the mounting surface from the support member and fixed thereto, thereby arranging the semiconductor circuits on the mounting surface with the desired layout. Finally, the support member is separated from the support substrate or the other of the circuit layers, thereby detaching the support member from the temporary adhesion portions of the chip-shaped semiconductor circuits. Since the chip-shaped semiconductor circuits are simply adhered temporarily to the temporary adhesion regions of the support member for transfer, the said detachment is carried out without difficulty. Accordingly, this fabrication method can be carried out more simply and more efficiently than the conventional method that chip-shaped semiconductor circuits are individually fixed on the mounting surface using a known high-speed chip bonder or the like.

Moreover, the step of forming the temporary adhesion region on the surface of the support member for transfer, the step of forming the temporary adhesion portions of the chip-shaped semiconductor circuits, the step of temporarily adhering the chip-shaped semiconductor circuits to the temporary adhesion regions, and the step of bringing collectively the chip-shaped semiconductor circuits into contact with the mounting surface and fixing collectively them can be respectively realized with desired accuracy, if the techniques that have been used (or known) in the fabrication processes of a semiconductor device (an integrated circuit device) not having a three-dimensional stacked structure are used.

Accordingly, the many (e.g., several hundreds of) chip-shaped semiconductor circuits can be disposed and fixed easily and efficiently with desired accuracy on the support substrate or a desired one of the circuit layers that constitute the three-dimensional stacked structure in such a way as to form the desired layout.

Furthermore, the step of forming the temporary adhesion region on the surface of the support member for transfer, the step of forming the temporary adhesion portions of the chip-shaped semiconductor circuits, the step of temporarily adhering the chip-shaped semiconductor circuits to the temporary adhesion regions, and the step of bringing collectively the chip-shaped semiconductor circuits into contact with the mounting surface and fixing collectively them can be respectively realized with desired accuracy. Therefore, if bump electrodes are used for electrical interconnection among the semiconductor circuits, bump electrodes that have been formed with a desired layout on the respective connecting portions of the semiconductor circuits can be fixed correctly to the corresponding bump electrodes or to the corresponding connection areas of wiring lines oppositely in a one-to-one correspondence.

(3) With the method of fabricating an integrated circuit device according to the first aspect of the invention, the "support substrate" means a substrate that supports the "three-dimensional stacked structure formed by stacking the semiconductor layers on the support substrate". Any member may be used for the support substrate if it has enough rigidity for supporting the said "three-dimensional stacked structure". Any material may be used for the "support substrate"; semiconductor, insulator, or conductor may be used for this purpose. Moreover, the "support substrate" may comprise circuits or wiring lines on its contacting surface with the three-dimensional stacked structure. In this case, it is preferred that the circuits or wiring lines are electrically connected to any of the circuit layers in the "three-dimensional stacked structure".

Since the "three-dimensional stacked structure" is formed by stacking the "circuit layers" in sequence in the predetermined stacking direction on the support substrate, each of the "circuit layers" may have any structure if it includes at least one "semiconductor circuit", and the "three-dimensional stacked structure" can be formed by mechanical and electrical interconnection of the "circuit layers" by way of the connecting portions. Therefore, each of the "circuit layers" may include one "semiconductor circuit", or two or more "semiconductor circuits".

The "semiconductor circuit" means a solid-state circuit or circuits formed by any semiconductor. Typically, the "semiconductor circuit" is a discrete semiconductor chip (i.e., a chip-shaped semiconductor circuit or semiconductor device) realized by forming an integrated circuit or circuits on one surface of a substrate made of a single-crystal semiconductor (e.g., silicon, or compound semiconductor such as gallium arsenide). However, the invention is not limited to this. The "semiconductor circuit" may be formed by a single semiconductor chip or a combination of semiconductor chips.

The "circuit layer" means a layer that includes at least one "semiconductor circuit", i.e., a solid-state circuit or circuits formed by any semiconductor. Therefore, the "circuit layer" may be formed by at least one "semiconductor circuit" alone, or a combination of at least one "semiconductor circuit" and any other material or materials (an insulative layer, an adhesive, and so on).

When the "circuit layer" includes a single "semiconductor circuit", the said "semiconductor circuit" may occupy the whole "circuit layer", or any other material or materials (for example, the above-described electrically insulative adhesive or other electrically insulative material or conductive material) may be located in the periphery of the said "semiconductor circuit". When the said "semiconductor circuit" occupies the whole "circuit layer", the said "circuit layer" is formed by the said semiconductor circuit alone. When the "circuit layer" includes not only the "semiconductor circuit" but also some other material, the said "circuit layer" is formed by the said semiconductor circuit and the other material(s) located in its periphery.

When the "circuit layer" includes two or more "semiconductor circuits", the said "semiconductor circuits" may be arranged in the said "circuit layer" to be in contact with or to be apart from each other. The arrangement of the "semiconductor circuits" is optional. Some other material or materials (for example, the above-described electrically insulative adhesive or other electrically insulative material or conductive material) may be located among the said "semiconductor circuits" or in the periphery thereof. Moreover, the said "semiconductor circuits" may be electrically interconnected within the said "circuit layer" or may be electrically interconnected by way of wiring lines formed outside the said "circuit layer", as necessary. The said "semiconductor circuits" are typically arranged in the same orientation within the said "circuit layer" (for example, all the semiconductor circuits are arranged in such a way that their surfaces are placed upward); however, they may be arranged in different orientations from each other as necessary.

As the "support member for transfer", any member may be used if it can form the at least one temporary adhesion region for placing the chip-shaped semiconductor circuits with the layout equivalent to the mirror image of the desired layout on one surface of the member, and at the same time, it if it has enough rigidity for supporting the necessary number of the chip-shaped semiconductor circuits. Any material may be used for the "support member for transfer"; semiconductor, insulator, or conductor may be used for this purpose.

The "connecting portion" of the semiconductor circuit is a portion used for electrical connection between the said semiconductor circuit and the outside thereof. Typically, the "connecting portion" includes bump electrodes; however, the invention is not limited to this. The "connecting portion" may have any structure if it can realize the electrical connection between the said semiconductor circuit and the outside thereof.

The "layout" of the semiconductor circuits is the arrangement or allocation of the semiconductor circuits on the support substrate or in the circuit layer.

(4) In a preferred embodiment of the method of fabricating an integrated circuit device according to the first aspect of the invention, the semiconductor circuits are temporarily adhered to the temporary adhesion region of the support member for transfer using a sticking force of a sticky material. As the sticky material, for example, photoresist, wax, polyimide resin, silicone resin, or the like is preferably used; however, the invention is not limited to these materials. Any sticky material may be used if it can perform temporary adhesion of the semiconductor circuits without giving any bad effect to the semiconductor circuits and the subsequent steps.

In this embodiment, it is preferred that the total number of the temporary adhesion regions of the support member for transfer is equal to that of the semiconductor circuits, and that the semiconductor circuits and the temporary adhesion regions are in a one-to-one correspondence. Moreover, it is preferred that in the step of detaching the support member for transfer from the semiconductor circuits, the sticking force of the sticky material is decreased or destroyed by heating, irradiation of ultraviolet rays, or addition of a chemical agent.

In the aforementioned embodiment where the temporary adhesion is preformed using a sticking force of a sticky material, the temporary adhesion portions of the semiconductor circuits are preferably formed by the sticky material. In this case, the temporary adhesion portions can be formed by the same sticky material as that for the temporary adhesion region of the support member for transfer and thus, there is an advantage that the selection of the sticky material is easy.

In another preferred embodiment of the method of fabricating an integrated circuit device according to the first aspect of the invention, the total number of the temporary adhesion regions of the support member for transfer is equal to that of the semiconductor circuits; the semiconductor circuits and the temporary adhesion regions are in a one-to-one correspondence; and the semiconductor circuits are temporarily adhered to the temporary adhesion regions of the support member for transfer using an absorption force of a liquid.

As the said liquid, for example, water, glycerin, acetone, alcohol, a SOG (Spin-On-Glass) material, or the like is preferably used; however, the invention is not limited to these liquids. Any liquid may be used if it can perform temporary adhesion of the semiconductor circuits without giving any bad effect to the semiconductor circuits and the subsequent process steps.

It is preferred that an additive for enhancing the surface tension is added to the said liquid. This is because the self-aligning function can be enhanced due to the enhancement of the surface tension by the additive, which raises the positional accuracy of the semiconductor circuits given by the self-alignment. As the additive for such the surface tension enhancement, for example, hydrofluoric acid (water solution of hydrofluoric acid) or ammonium fluoride is preferably used.

It is more preferred that water is selected from the above-described liquids and used. It is preferred that "ultrapure water", which has been generally used in the fabrication processes of semiconductor devices, is used as the said water. This is because "ultrapure water" is easily available and at the same time, "ultrapure water" does not give any bad effects to the semiconductor circuits, and the post-treatment (elimination treatment) after temporarily adhering the semiconductor circuits is extremely easy.

Moreover, it is preferred that an additive for enhancing the surface tension is added to the water or ultrapure water. As the additive for such the surface tension enhancement, for example, hydrofluoric acid is preferably used. In addition to hydrofluoric acid, ammonium fluoride may be also used for this purpose.

In the aforementioned embodiment where the temporary adhesion is performed by using an absorption force of a liquid, preferably, the semiconductor circuits are temporarily adhered to the temporary adhesion regions through the steps of:

forming films of the liquid on at least one of the opposite ends of the semiconductor circuits to the connecting portions and the temporary adhesion regions corresponding to the said ends;

respectively linking the said ends with the corresponding temporary adhesion regions in an opposed state thereof using the films of the liquid; and respectively bringing the said ends into contact with the corresponding temporary adhesion regions by applying a pressing force to between the said ends and the corresponding temporary adhesion regions, thereby temporarily adhering the semiconductor circuits to the corresponding temporary adhesion regions detachably.

In this case, the temporary adhesion of the semiconductor circuits to the temporary adhesion regions is performed utilizing the absorption force of the liquid remaining between the ends of the semiconductor circuits and the temporary adhesion regions that have been in contact with each other. In this case, there is an advantage that the semiconductor circuits are positioned in self-alignment with respect to the corresponding temporary adhesion regions due to the surface tension of the liquid in the step of respectively linking the ends of the semiconductor circuits with the corresponding temporary adhesion regions in an opposed state thereof using the liquid.

In the aforementioned embodiment where the temporary adhesion is performed using the absorption force of the liquid, preferably, the temporary connecting portions of the semiconductor circuits are formed by a material having a lyophilic property for the said liquid. In this case, there is an advantage that the films of the liquid are easily formed on the temporary adhesion regions.

In the aforementioned embodiment where the temporary adhesion is performed using the absorption force of the liquid, preferably, the temporary adhesion regions are defined by a film selectively formed on a surface of the support member for transfer using a material having a lyophilic property for the said liquid. Alternately, the temporary adhesion regions are defined by a film selectively formed on a surface of the support member for transfer using a material not having a lyophilic property for the said liquid (in other words, having a lyophobic property for the said liquid).

In still another preferred embodiment of the method of fabricating an integrated circuit device according to the first aspect of the invention, exposed conductive contacts are formed at each of the predetermined positions, where the semiconductor circuits are respectively fixed to the support substrate or the said circuit layer at the corresponding predetermined positions using the conductive contacts. In this case, it is preferred that each of the conductive contacts penetrates through a corresponding one of the predetermined positions to protrude to the outside. Moreover, it is preferred that the semiconductor circuits are fixed to the support substrate or the said circuit layer using the conductive contacts due to bonding with a bonding metal, bonding by pressure welding without a bonding metal, or bonding by fusion welding without a bonding metal.

In a further preferred embodiment of the method of fabricating an integrated circuit device according to the first aspect of the invention, exposed conductive contacts are formed at each of the predetermined positions of the semiconductor circuits, where the semiconductor circuits are respectively fixed to the support substrate or the said circuit layer at the corresponding predetermined positions using the conductive contacts. In this case, it is preferred that each of the conductive contacts penetrates through a corresponding one of the connecting portions to protrude to the outside. Moreover, it is preferred that the semiconductor circuits are fixed to the support substrate or the said circuit layer using the conductive contacts due to bonding with a bonding metal, bonding by pressure welding without a bonding metal, or bonding by fusion welding without a bonding metal.

In a still further preferred embodiment of the method of fabricating an integrated circuit device according to the first aspect of the invention, the step of placing the semiconductor circuits on a tray to have the desired layout is performed before the step of placing the semiconductor circuits on the support member for transfer, where the semiconductor circuits are collectively placed on the support member from the tray.

(5) A method of fabricating an integrated circuit device having a three-dimensional stacked structure according to the second aspect of the present invention, which is a method of fabricating an integrated circuit device having a three-dimensional stacked structure formed by stacking circuit layers on a support substrate, comprises:

when fixing chip-shaped semiconductor circuits included in one of the circuit layers on a mounting surface of the support substrate or other of the circuit layers which is adjacent to the one of the circuit layers to have a desired layout;

forming a lyophilic region at each of predetermined positions defined on the mounting surface, to which connecting portions of the chip-shaped semiconductor circuits will be respectively fixed;

forming a film of a liquid on each of the lyophilic regions;

respectively linking the connecting portions of the chip-shaped semiconductor circuits with the corresponding lyophilic regions in an opposed state thereof where the films of the liquid intervene therebetween;

respectively bringing the connecting portions into contact with the corresponding predetermined positions by applying a pressing force to between the connecting portions and the corresponding lyophilic regions; and disposing the chip-shaped semiconductor circuits on the mounting surface to have the desired layout by fixing the connecting portions to the corresponding predetermined positions that have been brought into contact with each other.

In this specification, this method is termed the "non-transfer type". This is because, unlike the aforementioned method of fabricating an integrated circuit device according to the first aspect of the invention, the action of transferring the chip-shaped semiconductor circuits from the support member for transfer is not performed.

(6) With the method of fabricating an integrated circuit device having a three-dimensional stacked structure according to the second aspect of the invention, as explained above, first, the lyophilic region is formed at each of the predetermined positions defined on the mounting surface of the support substrate or the desired one of the circuit layers that constitute the three-dimensional stacked structure, to which the connecting portions of the chip-shaped semiconductor circuits will be respectively fixed. Typically, these lyophilic regions are formed to have the same structure as that of the connecting portions of the chip-shaped semiconductor circuits; however, the invention is not limited to this. The lyophilic regions may have any structure if the connecting portions of the chip-shaped semiconductor circuits can be fixed with it. Next, the film of the liquid is formed on each of the lyophilic regions and thereafter, the connecting portions of the chip-shaped semiconductor circuits are respectively linked with the corresponding lyophilic regions in the opposed state thereof where the films of the liquid intervene therebetween. In this linking state, the positions of the said ends and those of the corresponding lyophilic regions are aligned by the surface tension of the liquid and therefore, the positional deviation between the connecting portions and the corresponding lyophilic regions is automatically corrected. In addition, such the linking state is maintained by the surface tension of the liquid. Then, by applying a pressing force to between the connecting portions and the corresponding lyophilic regions, the connecting portions are respectively brought into contact with the corresponding predetermined positions. As a result, the liquid is pushed out from between the connecting portions and the corresponding lyophilic regions; however, the oppositely contacting state of the connecting portions is maintained by the absorption force of the liquid remaining between the connecting portions and the corresponding lyophilic regions. Finally, the connecting portions and the corresponding predetermined positions, which have been brought into contact with each other, are fixed to each other. In this way, the chip-shaped semiconductor circuits are disposed on the mounting surface with the desired layout. Accordingly, this fabrication method can be carried out more simply and more efficiently than the conventional method that chip-shaped semiconductor circuits are individually fixed on the mounting surface using a known high-speed chip bonder or the like.

Moreover, the step of forming the lyophilic regions, the step of respectively linking the connecting portions of the chip-shaped semiconductor circuits with the corresponding lyophilic regions, the step of respectively bringing the connecting portions into contact with the corresponding predetermined positions, and the step of fixing and disposing the connecting portions to the corresponding predetermined positions can be respectively realized with desired accuracy, if the techniques that have been used or known in the fabrication processes of a semiconductor device (an integrated circuit device) not having a three-dimensional stacked structure are used.

Accordingly, the many (e.g., several hundreds of) chip-shaped semiconductor circuits can be disposed and fixed easily and efficiently with desired accuracy on the support substrate or a desired one of the circuit layers that constitute the three-dimensional stacked structure in such a way as to form the desired layout.

Furthermore, the step of forming the lyophilic regions, the step of linking the connecting portions of the chip-shaped semiconductor circuits with the lyophilic regions, the step of bringing the connecting portions into contact with the corresponding predetermined positions, and the step of fixing and disposing the connecting portions to the corresponding predetermined positions can be respectively realized with desired accuracy. Therefore, if bump electrodes are used for electrical interconnection among the semiconductor circuits, the bump electrodes that have been formed with a desired layout on the respective connecting portions of the semiconductor circuits can be fixed correctly to the corresponding bump electrodes or to the corresponding connection areas of wiring lines oppositely in a one-to-one correspondence.

(7) With the method of fabricating an integrated circuit device according to the second aspect of the invention, the meanings of the terms, such as, "support substrate", "three-dimensional stacked structure", "semiconductor circuit", "circuit layer", "connecting portion", and "layout" are the same as those explained about the method of fabricating an integrated circuit device according to the first aspect of the invention, except for those relating to the support member for transfer.

The "lyophilic region" means a region having a lyophilic property for the liquid used for linking with the connecting portion of the semiconductor circuit. The "lyophilic region" is formed at each of the predetermined positions to which the connecting portions of the chip-shaped semiconductor circuits will be respectively fixed, where the predetermined positions are set on the support substrate or the desired one of the circuit layers that constitutes the three-dimensional stacked structure. As the said liquid, water (e.g., ultrapure water) is typically used; however, the invention is not limited to this. Any liquid to be used in the method of fabricating an integrated circuit device according to the first aspect of the invention may be used for the said liquid.

(8) As the liquid usable in the method of fabricating an integrated circuit device according to the second aspect of the invention, any one of the liquids mentioned as the usable ones for the method of fabricating an integrated circuit device according to the first aspect of the invention may be used.

In a preferred embodiment of the method of fabricating an integrated circuit device according to the second aspect of the invention, the total number of the lyophilic regions is equal to that of the semiconductor circuits; where the semiconductor circuits and the temporary adhesion regions are in a one-to-one correspondence.

In another preferred embodiment of the method of fabricating an integrated circuit device according to the second aspect of the invention, a lyophilic region is formed on each of the connecting portions of the semiconductor circuits.

In still another preferred embodiment of the method of fabricating an integrated circuit device according to the second aspect of the invention, the lyophilic regions formed respectively at the predetermined positions of the support substrate or the circuit layer are defined by a film selectively formed on a surface of the support substrate or the said circuit layer using a material having a lyophilic property for the liquid. Alternately, the lyophilic regions are defined by a film selectively formed on a surface of the support substrate or the said circuit layer using a material not having a lyophilic property for the liquid (in other words, having a lyophobic property for the liquid).

In a further preferred embodiment of the method of fabricating an integrated circuit device according to the second aspect of the invention, exposed conductive contacts are formed on each of the lyophilic regions, where the semiconductor circuits are respectively fixed to the support substrate or the said circuit layer at the corresponding predetermined positions using the conductive contacts. In this case, it is preferred that each of the conductive contacts penetrates through a corresponding one of the lyophilic regions to protrude to the outside. Moreover, it is preferred that the semiconductor circuits are fixed to the support substrate or the said circuit layer using the conductive contacts due to bonding with a bonding metal, bonding by pressure welding without a bonding metal, or bonding by fusion welding without a bonding metal. In these two cases, it is preferred that the film of the liquid is formed on the lyophilic region to cover the conductive contacts.

In still further preferred embodiment of the method of fabricating an integrated circuit device according to the second aspect of the invention, exposed conductive contacts are formed on each of the connecting portions of the semiconductor circuits, where the semiconductor circuits are respectively fixed to the support substrate or the said circuit layer at the corresponding predetermined positions using the conductive contacts. In this case, it is preferred that each of the conductive contacts penetrates through a corresponding one of the lyophilic regions formed on the connecting portions to protrude to the outside. Moreover, it is preferred that the semiconductor circuits are fixed to the support substrate or the said circuit layer using the conductive contacts due to bonding with a bonding metal, bonding by pressure welding without a bonding metal, or bonding by fusion welding without a bonding metal. In these two cases, it is preferred that the film of the liquid is formed on the lyophilic region to cover the conductive contacts.

In still further preferred embodiment of the method of fabricating an integrated circuit device according to the second aspect of the invention, the step of placing the semiconductor circuits on a tray to have the desired layout is performed before the step of respectively linking the connecting portions of the semiconductor circuits with the corresponding lyophilic regions in the opposed state thereof, wherein the semiconductor circuits are collectively placed on the support substrate or the said circuit layer from the tray.

(9) An apparatus for fabricating an integrated circuit device according to the third aspect of the present invention, which is an apparatus used for the method of fabricating an integrated circuit device according to the above-described first or second aspect, comprises:

a body;

a workpiece holding system for holding a support member for transfer or a support substrate;

a tray holding system, provided on the body, for holding a tray for collective placement;

a control stage, provided on the body, for making at least one of the workpiece holding system and the tray holding system displaceable; and a position aligning means for performing positional alignment of the support member for transfer or the support substrate held by the workpiece holding system and the tray for collective placement held by the tray holding system.

(10) With the apparatus for fabricating an integrated circuit device according to the third aspect of the present invention, the above-described structure is provided. Therefore, if the support member for transfer or the support substrate is held by the workpiece holding system and the tray for collective placement is held by the tray holding system, the positional alignment of the support member or the support substrate and the tray is performed using the position aligning means, and thereafter, at least one of the workpiece holding system and the tray holding system is displaced using the control stage, the semiconductor chips held on the tray can be collectively placed on the support member or the support substrate at the predetermined positions. This means that the method of fabricating an integrated circuit device according to the aforementioned first or second aspect using the tray for collective placement can be performed by this apparatus.

(11) In a preferred embodiment of the apparatus for fabricating an integrated circuit device according to the third aspect of the invention, the position aligning means comprises:

a light source;

an image pickup device for receiving a light beam emitted from the light source by way of the workpiece holding system and the tray holding system to pick up an image; and an arithmetic unit for conducting an arithmetic operation using image data obtained by the image pickup device;

wherein the positional alignment of the support member or the support substrate and the tray for collective placement is performed using the arithmetic unit.

In another preferred embodiment of the apparatus for fabricating an integrated circuit device according to the third aspect of the invention, the position aligning means comprises:

an image pickup device for picking up images of the support member for transfer or the support substrate held by the workpiece holding system and the tray for collective placement held by the tray holding system; and an arithmetic unit for conducting an arithmetic operation using image data obtained by the image pickup device;

wherein the positional alignment of the support member or the support substrate and the tray is performed using the arithmetic unit.

Advantageous Effects of the Invention

With the methods of fabricating an integrated circuit device having a three-dimensional stacked structure according to the first and second aspects of the present invention, the many (e.g., several hundreds of) chip-shaped semiconductor circuits can be disposed and fixed easily and efficiently with desired accuracy on the support substrate or a desired one of the circuit layers that constitute the three-dimensional stacked structure in such a way as to form the desired layout. Moreover, if bump electrodes are used for electrical interconnection among the semiconductor circuits, the bump electrodes that have been formed with a desired layout on the respective connecting portions of the semiconductor circuits can be fixed correctly to the corresponding bump electrodes or to the corresponding connection areas of wiring lines oppositely in a one-to-one correspondence.

The apparatus for fabricating an integrated circuit device according to the third aspect of the present invention can be preferably used for performing the method of fabricating an integrated circuit device according to the aforementioned first or second aspect of the present invention.

BRIEF DESCRIPTION OF THE DRAWINGS

FIGS. 6(a) to 6(d) are cross-sectional views showing the step of fixing the semiconductor chips constituting the first semiconductor layer on the support substrate (transfer type) in a method of fabricating an integrated circuit device having a three-dimensional stacked structure according to a second embodiment of the invention, respectively.

FIGS. 7(e) to 7(g) are cross-sectional views showing the step of fixing the semiconductor chips constituting the first semiconductor layer on the support substrate (transfer type) in the method of fabricating an integrated circuit device having a three-dimensional stacked structure according to the second embodiment of the invention, respectively, which are subsequent to FIG. 6(d).

FIGS. 8(a) and 8(b) are cross-sectional views showing the steps of a method of fabricating an integrated circuit device having a three-dimensional stacked structure according to a third embodiment of the invention, respectively.

FIGS. 9(c) and 9(d) are cross-sectional views showing the steps of the method of fabricating an integrated circuit device having a three-dimensional stacked structure according to the third embodiment of the invention, respectively, which are subsequent to FIG. 8(b).

FIG. 10(e) is a cross-sectional view showing the steps of the method of fabricating an integrated circuit device having a three-dimensional stacked structure according to the third embodiment of the invention, which is subsequent to FIG. 9(d).

FIGS. 11(a) and 11(b) are cross-sectional views showing the step of fixing the semiconductor chips constituting the first semiconductor layer on the support substrate (transfer type) in the method of fabricating an integrated circuit device having a three-dimensional stacked structure according to the third embodiment of the invention, respectively.

FIG. 12(a) is a cross-sectional view showing the step of fixing the semiconductor chips constituting the third semiconductor layer on the second semiconductor layer (transfer type) in the method of fabricating an integrated circuit device having a three-dimensional stacked structure according to the third embodiment of the invention.

FIG. 13(b) is a cross-sectional view showing the step of fixing the semiconductor chips constituting the third semiconductor layer on the second semiconductor layer (transfer type) in the method of fabricating an integrated circuit device having a three-dimensional stacked structure according to the third embodiment of the invention, which is subsequent to FIG. 12(a).

FIGS. 14(a) and 14(b) are cross-sectional views showing the concept of the step of fixing the semiconductor chips constituting the first semiconductor layer on the support substrate (non-transfer type) in a method of fabricating an integrated circuit device according to a fourth embodiment of the invention, respectively.

FIGS. 15(a) to 15(d) are cross-sectional views showing the step of fixing the semiconductor chips constituting the first semiconductor layer on the support substrate (non-transfer type) in the method of fabricating an integrated circuit device having a three-dimensional stacked structure according to the fourth embodiment of the invention, respectively.

FIGS. 16(e) to 16(g) are cross-sectional views showing the step of fixing the semiconductor chips constituting the first semiconductor layer on the support substrate (non-transfer type) in the method of fabricating an integrated circuit device having a three-dimensional stacked structure according to the fourth embodiment of the invention, respectively, which are subsequent to FIG. 15(d).

FIGS. 17(a) and 17(b) are cross-sectional views showing the step of fixing the semiconductor chips constituting the third semiconductor layer on the second semiconductor layer (non-transfer type) in the method of fabricating an integrated circuit device having a three-dimensional stacked structure according to the fourth embodiment of the invention, respectively.

FIGS. 18(a) and 18(b) are cross-sectional views showing the step of fixing the semiconductor chips constituting the first semiconductor layer on the support substrate (non-transfer type) in a method of fabricating an integrated circuit device having a three-dimensional stacked structure according to a fifth embodiment of the invention, respectively.

FIG. 19(a) is a cross-sectional view showing the step of fixing the semiconductor chips constituting the third semiconductor layer on the second semiconductor layer (non-transfer type) in the method of fabricating an integrated circuit device having a three-dimensional stacked structure according to the fifth embodiment of the invention.

FIG. 20(b) is a cross-sectional view showing the step of fixing the semiconductor chips constituting the third semiconductor layer on the second semiconductor layer (non-transfer type) in the method of fabricating an integrated circuit device having a three-dimensional stacked structure according to the fifth embodiment of the invention, which is subsequent to FIG. 19(a).

FIGS. 21(a) to 21(c) are cross-sectional views showing the step of fixing the semiconductor chips constituting the first semiconductor layer on the support substrate (non-transfer type) in a method of fabricating an integrated circuit device having a three-dimensional stacked structure according to a sixth embodiment of the invention, respectively.

FIGS. 22(d) to 22(f) are cross-sectional views showing the step of fixing the semiconductor chips constituting the first semiconductor layer on the support substrate (non-transfer type) in the method of fabricating an integrated circuit device having a three-dimensional stacked structure according to the sixth embodiment of the invention, respectively, which are subsequent to FIG. 21(c).

FIG. 23 is a partial cross-sectional view showing in detail the step of bonding the semiconductor chip (where bonding metals are used) in detail in the method of fabricating the integrated circuit device according to the third embodiment of the invention.

FIG. 24 is a partial cross-sectional view showing in detail the step of bonding the semiconductor chip in detail in the method of fabricating the integrated circuit device according to the third embodiment of the invention, which is subsequent to FIG. 23.

FIG. 25 is a partial cross-sectional view showing in detail the step of bonding the semiconductor chip (where the bonding metals are left after the bonding) in detail in the method of fabricating the integrated circuit device according to the third embodiment of the invention, which is subsequent to FIG. 24.

FIG. 26 is a partial cross-sectional view showing in detail the step of bonding the semiconductor chip (where the bonding metals are not left after the bonding, or the bonding metals are not used) in detail in the method of fabricating the integrated circuit device according to the third embodiment of the invention, which is subsequent to FIG. 24.

FIGS. 27(a) and 27(b) are schematic cross-sectional views showing the detailed structure of the semiconductor chip used in the method of fabricating the integrated circuit device having a three-dimensional stacked structure according to the invention, respectively.

FIGS. 28(a) and 28(b) are schematic plan views showing the arrangements of the solder balls for external circuit connection and the microbump electrodes regarding the semiconductor chip used in the method of fabricating the integrated circuit device having a three-dimensional stacked structure according to the invention.

FIG. 29 is an enlarged partial cross-sectional view showing the detailed structure of the microbump electrode used in the method of fabricating the integrated circuit device according to the third embodiment of the invention.

FIGS. 30(a) to 30(c) are cross-sectional views showing in detail the step of collectively placing the semiconductor chips constituting the first semiconductor layer on the carrier substrate used in a method of fabricating an integrated circuit device having a three-dimensional stacked structure according to a seventh embodiment of the invention, respectively.

FIG. 31 is a plan view of the tray for collective placement used in the fabrication method according to the seventh embodiment of the invention.

FIGS. 32(a) to 32(c) are cross-sectional views showing in detail the step of collectively placing the semiconductor chips constituting the first semiconductor layer on the carrier substrate used in a method of fabricating an integrated circuit device having a three-dimensional stacked structure according to an eighth embodiment of the invention, respectively.

FIGS. 33(a) and 33(b) are partial cross-sectional views showing a method of correcting the positions of the semiconductor chips used in a method of fabricating an integrated circuit device having a three-dimensional stacked structure according to a ninth embodiment of the invention, respectively.

FIGS. 34(a) and 34(b) are partial cross-sectional views showing the method of correcting the positions of the semiconductor chips used in the method of fabricating an integrated circuit device having a three-dimensional stacked structure according to the ninth embodiment of the invention, respectively, which are subsequent to FIG. 33(b).

FIGS. 35(a) and 35(b) are partial cross-sectional views showing a method of correcting the positions of the semiconductor chips used in a method of fabricating an integrated circuit device having a three-dimensional stacked structure according to a tenth embodiment of the invention, respectively.

FIGS. 36(a) and 36(b) are explanatory partial cross-sectional views showing an apparatus for fabricating an integrated circuit device according to an eleventh embodiment of the invention, respectively, where FIG. 36(a) shows the state where the temporary adhesion regions on the carrier substrate are opposed apart to the semiconductor chips on the tray for collective placement, and FIG. 36(b) shows the state where the semiconductor chips are respectively placed on the temporary adhesion regions.

FIG. 37(c) is an explanatory partial cross-sectional view showing the apparatus for fabricating an integrated circuit device according to the eleventh embodiment of the invention, where the semiconductor chips placed on the temporary adhesion regions are pressed toward the pressing plate.

FIG. 38 is an explanatory partial cross-sectional view showing an apparatus for fabricating an integrated circuit device according to a twelfth embodiment of the invention, where the temporary adhesion regions on the carrier substrate are opposed apart to the semiconductor chips on the tray for collective placement.

FIGS. 39(a) and 39(b) are figures similar to FIGS. 36(a) and 36(b) in the case where the support substrate is used instead of the carrier substrate in the apparatus for fabricating an integrated circuit device according to the eleventh embodiment of the invention.

FIG. 40(c) is a figure similar to FIG. 37 in the case where the support substrate is used instead of the carrier substrate in the apparatus for fabricating an integrated circuit device according to the eleventh embodiment of the invention.

Figure 1:
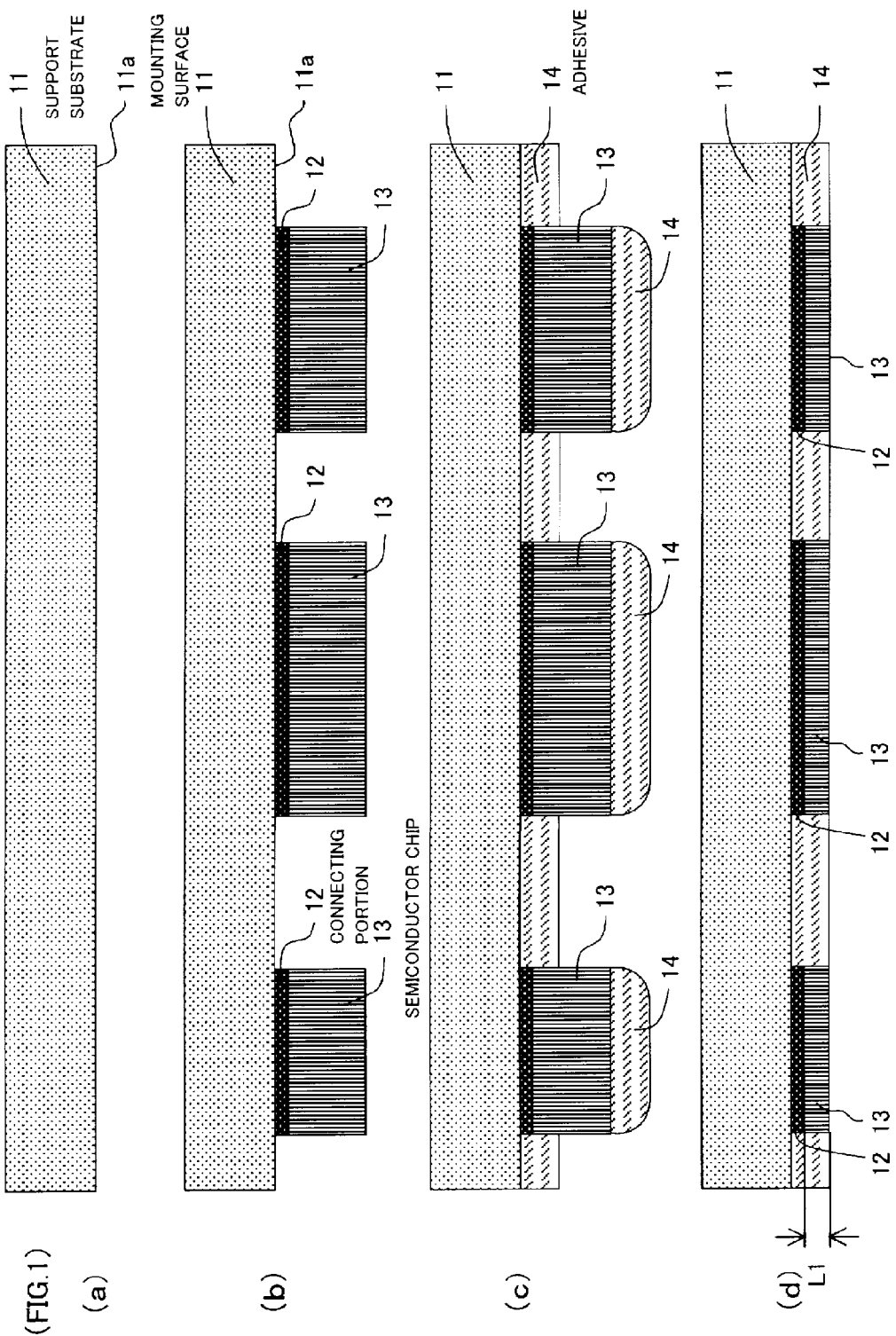
FIGS. 1(a) to 1(d) are cross-sectional views showing the basic concept of a method of fabricating an integrated circuit device having a three-dimensional stacked structure according to the invention, respectively.

DESCRIPTION OF THE REFERENCE SYMBOLS 10A, 10B, 10C, 10D integrated circuit device
11 support substrate
11a mounting surface of support substrate
12 connecting portion
12a, 12b temporary adhesion portion
13 semiconductor chip
14 adhesive
15 connecting region
16 semiconductor chip
17 adhesive
18 connecting region
19 semiconductor chip
20 adhesive
21 connecting region
22 semiconductor chip
23 adhesive
24 insulating layer
25 conductive plug
26 microbump electrode for external circuit connection
27 solder ball
30A, 30B, 30C, 30A', 30B', 30C' integrated circuit device
31 support substrate
32 insulating layer
33 wiring line
34 conductive plug
35, 36 microbump electrode
36a lower layer of microbump electrode
36b upper layer of microbump electrode
37 semiconductor chip
37a temporary adhesion portion
38, 38a adhesive
39 insulating layer
40 conductive plug
41, 42 microbump electrode
43 semiconductor chip
44 adhesive
45 insulating layer
46 conductive plug
47, 48 microbump electrode
49 semiconductor chip
49a temporary adhesion portion
50 adhesive
51, 53, 55 insulating layer
52, 54, 56 conductive material
57, 57a, 57b, 58, 59 stopper
60 microbump electrode for external circuit connection
61 insulating layer
71, 71a connecting portion
72, 72a temporary adhesion region
73, 73a carrier substrate
74 connecting portion
75 connecting portion
76 temporary adhesion region
77 carrier substrate
78 hydrophilic region
79 hydrophobic region
81, 82 water film
83 film of hydrophobic liquid
85a connecting portion
86a connecting portion
91a, 92a, 93a, 94a, 95a, 96a hydrophilic region
92 temporary adhesion region
93 carrier substrate
95 temporary adhesion region
95a hydrophilic region
96 carrier substrate
96a hydrophilic region
101 water film
120 bonding metal
151, 153 insulating layer
152 wiring layer
154 conductive plug
160 MOS transistor
161 source/drain region
162 gate insulating layer
163 gate electrode
171, 173 insulating layer
172 wiring layer
174 conductive plug
180 pressing plate
200, 200a, 200b tray for collective placement
201 body
202 outer wall
203 upper wall
204 partition wall
205 chip placement region
206 small hole
207 inner space
208 air supply/emission port
300, 300a apparatus for fabricating integrated circuit device
301 body
302 control stage
303 support table
304 infrared lamp
305 vacuum chuck
306, 306a, 306b CCD camera
307 computer
R1, R2 connecting portion
C semiconductor integrated circuit (semiconductor solid-state circuits) formed in semiconductor chip
L1 first semiconductor circuit layer
L2 second semiconductor circuit layer
L3 third semiconductor circuit layer
L4 fourth semiconductor circuit layer

BEST MODE FOR CARRYING OUT THE INVENTION

Preferred embodiments of the present invention will be described in detail below while referring to the drawings attached. The basic concept of the present invention will be initially described and thereafter, the first to tenth embodiments will be sequentially described below. In the following explanation of each of the embodiments, the same explanation as that of the said basic concept is omitted while the emphasis is put on the characterized part of each embodiment.

Basic Concept of the Invention

FIGS. 1(a) to 3(j) are schematic cross-sectional views showing the basic concept of a method of fabricating an integrated circuit device having a three-dimensional stacked structure according to the invention, respectively.

First, a support substrate 11 having a desired rigidity is prepared, as shown in FIG. 1(a). The substrate 11 comprises a flat mounting surface 11a for mounting semiconductor chips (i.e., chip-shaped semiconductor circuits) thereon at one side thereof. As the substrate 11, for example, a glass, a single-crystal silicon (Si) wafer (an integrated circuit is formed in its surface area, or no integrated circuit is formed), or the like may be preferably used.

Next, as shown in FIG. 1(b), semiconductor chips 13, each of which has a known structure, are fixed at predetermined positions on the mounting surface 11a of the substrate 11. Predetermined gaps are formed between the adjoining chips 13. These chips 13, which are so-called Known Good Dies (KGDs), may have any structure (which includes a desired built-in integrated circuit or circuits), and may be fabricated by any method as necessary. These chips (chip-shaped semiconductor circuits) 13 and a cured adhesive 14 located in the gaps among the chips 13 and on their peripheries constitute a first semiconductor circuit layer L1. In other words, the first semiconductor circuit layer L1 is constituted by the chips (chip-shaped semiconductor circuits) 13 and the adhesive 14 located on the peripheries thereof.

Actually, it is usual that several to several hundreds of the chips 13 are fixed. However, three chips as shown will be explained here for the sake of simplification of explanation.

The fixing of the semiconductor chips 13 onto the mounting surface 11a of the support substrate 11 is performed by using connecting portions 12 formed on the surfaces of the respective chips 13. Although the concrete structure of the connecting portion 12 is explained later, the portion 12 can be realized by using, for example, microbump electrodes. The mechanical and electrical connection between the chips 13 and the mounting surface 11a is simultaneously accomplished with the connecting portions 12. The state at this stage is shown in FIG. 1(b). The chips 13 may be fixed, for example, in one-to-one correspondence with a known high-speed chip bonder. Alternately, all the chips 13 may be located on a support member for transfer (not shown) in advance according to a predetermined layout and then, all the chips 13 may be fixed onto the mounting surface 11a in a lump with the support member.

Corresponding to the connecting portions 12 of the chips 13, connecting portions (not shown) similar to the connecting portions 12 may be formed at predetermined positions on the mounting surface 11a of the support substrate 11. In this case, the connection portions 12 of the chips 13 and the connecting portions of the mounting surface 11a are respectively joined, thereby accomplishing the mechanical and electrical connection between the chips 13 and the surface 11a.

Next, as shown in FIG. 1(c), the liquid or fluid adhesive 14 is placed in an appropriate way in the gaps on the peripheries of the semiconductor chips 13 fixed onto the mounting surface 11a by way of the connecting portions 12. Thereafter, the adhesive 14 is cured by applying heat, irradiating ultraviolet rays, or the like. It is preferred that the adhesive 14 is made of electrically insulative synthetic resin. This is because the adjoining chips 13 need to be electrically insulated from each other, and because the resin 14 serves as part of the package of the said integrated circuit device. At this time, it is not necessary that the thickness of the cured layer of the adhesive 14 formed on the mounting surface 11a amounts to the overall height of the chips 13. It is sufficient that the gaps (which include the connecting portions 12) are designed in such a way as to be entirely filled with the adhesive 14 when the chips 13 are thinned by polishing in the next step.

Here, the support substrate 11 is turned upside down and then, a method of spraying the liquid adhesive 14 (spraying method) is used in the state where the mounting surface 11a faces upward. Therefore, the adhesive 14 is attached to the opposite faces (i.e., the reverses) of the semiconductor chips 13 to the connecting portions 12 also. Since the parts of the adhesive 14 placed on the reverses of the chips 13 are removed in the subsequent semiconductor-chip polishing step, no problem will occur.

Next, the opposite faces (i.e., the reverses) of all the semiconductor chips 13 to their adhered surface, which have been fixed to the mounting surface 11a of the support substrate 11, are polished in a lump by the mechanical polishing method and the CMP (Chemical Mechanical Polishing) method. As shown in FIG. 1(d), these polishing steps are carried out in such a way that the reverses of the respective chips 13 form the same plane as the cured layer of the adhesive 14 existing around the chips 13. Practically, it is preferred that these steps are carried out until the cured layer of the adhesive 14 is slightly polished, thereby planarizing the exposed surface of the cured layer of the adhesive 14 simultaneously with the polishing of the reverses of the chips 13.

The polishing of the reverses of the semiconductor chips 13 in the CMP process will cause no obstacle relating to the operation of the chips 13. This is because the integrated circuit incorporated in each chip 13 is formed only in the surface area of the chip 13 on its surface side at a very small depth and therefore, the remaining part of the chip 13 is unconcerned about the circuit operation.

Through the above-described steps, as shown in FIG. 1(d), the first semiconductor circuit layer L1 including the semiconductor chips 13 is formed on the mounting surface 11a of the support substrate 11. Therefore, it may be said that the first semiconductor circuit layer L1 including the chips 13 is fixed onto the surface 11a with the connecting portions 12 of the respective chips 13 and the adhesive 14. Since the mechanical connection of the chips 13 to the mounting surface 11a is performed by not only the connecting portions 12 but also the adhesive 14, sufficient connection strength is obtained.

Next, in approximately the same way as above, a plurality of semiconductor chips 16 are arranged on the first semiconductor circuit layer L1 formed through the above-described steps, thereby forming a second semiconductor circuit layer L2.

Specifically, as shown in FIG. 2(e), semiconductor chips 16 (i.e., chip-shaped semiconductor circuits), each of which has a connecting portion 15 on its surface, are respectively fixed to the reverses of the chips 13 exposed from the cured layer of the adhesive 14 in such a way as to be superposed on the corresponding chips 13. The structure of the connecting portion 15 of the chip 16 is the same as that of the connecting portion 12 of the chip 13 of the first semiconductor circuit layer L1. The mechanical and electrical connection between the chips 16 and the chips 13 is simultaneously accomplished with the connecting portions 15.

If the chip 16 is smaller than the chip 13, the whole connecting portion 15 of the chip 16 is included within the reverse of the chip 13. However, if the chip 16 is larger than the chip 13, part of the connecting portion 15 of the chip 16 protrude from the reverse of the chip 13, where the protruding part contacts the adhesive 14.

Figure 2:
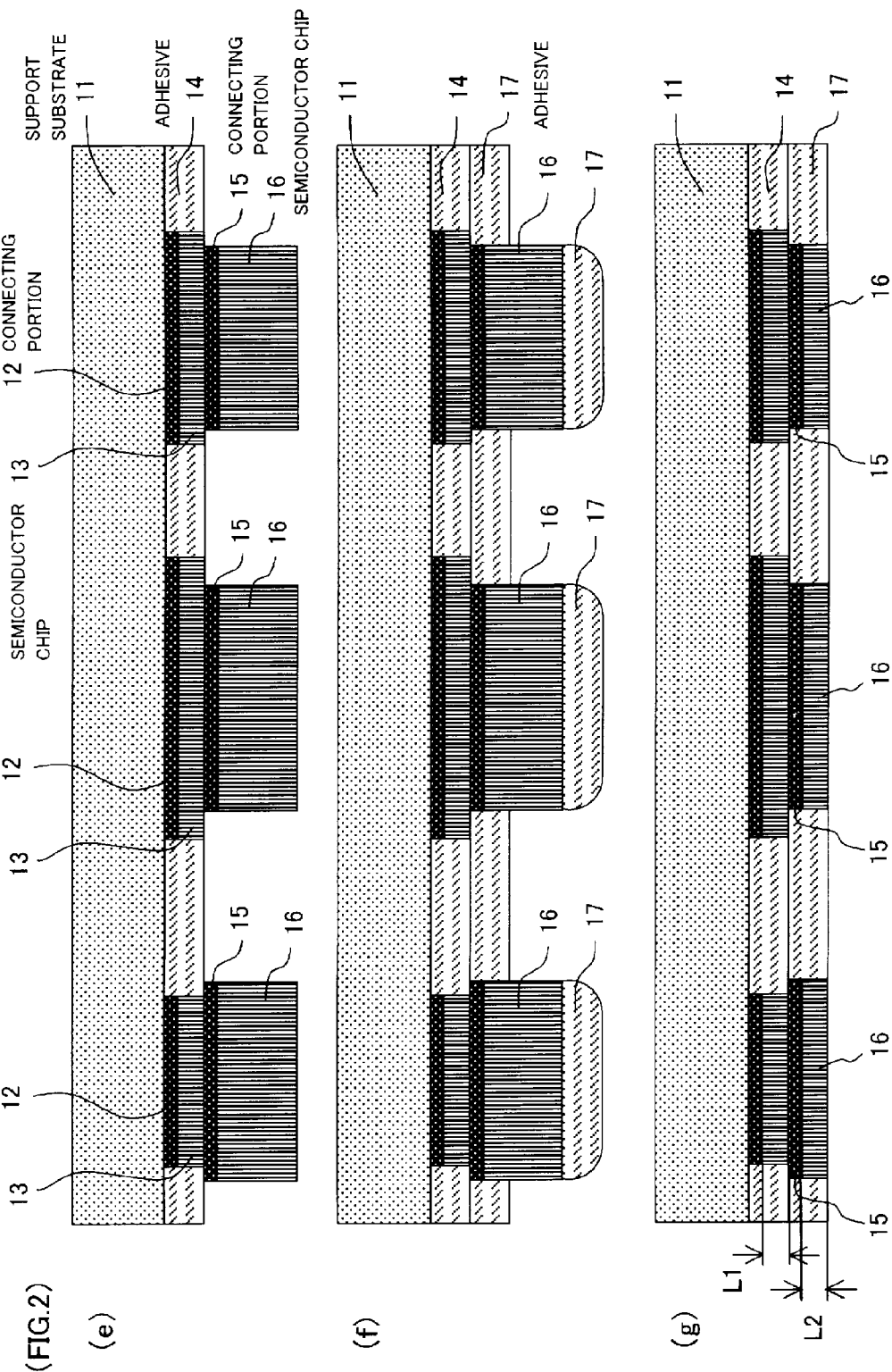
FIGS. 2(e) to 2(g) are cross-sectional views showing the basic concept of the method of fabricating the integrated circuit device having a three-dimensional stacked structure according to the invention, respectively, which are subsequent to FIG. 1(d).

Thereafter, as shown in FIG. 2(e), the gaps formed on the peripheries of the chips 16 fixed to the corresponding chips 13 of the first semiconductor circuit layer L1 by way of the connection portions 15 are filled with a liquid or fluid adhesive 17 in the same way as used for the chips 13. Then, the adhesive 17 is cured by applying heat, irradiating ultraviolet rays, or the like. The state at this stage is shown in FIG. 2(*f*).

Next, the opposite faces (i.e., the reverses) of the fixed chips 16 to their fixed faces are polished by the mechanical polishing method and the CMP method, thereby making the reverses of the respective chips 16 located in the same plane as the cured layer of the adhesive 17, as shown in FIG. 2(*g*). In this way, the chips 16 are mechanically and electrically connected to the corresponding chips 13 with the connecting portions 15. Thus, a second semiconductor circuit layer L2 including the chips 16 and the cured layer of the adhesive 17 is formed to be superposed on the first semiconductor circuit layer L1. The mechanical and electrical connection between the second semiconductor circuit layer L2 and the first semiconductor circuit layer L1 is carried out with the connecting portions 15 of the respective chips 16.

Next, in approximately the same way as above, a plurality of semiconductor chips 19 are arranged on the second semiconductor circuit layer L2 formed through the above-described steps, thereby forming a third semiconductor circuit layer L3.

Figure 3:
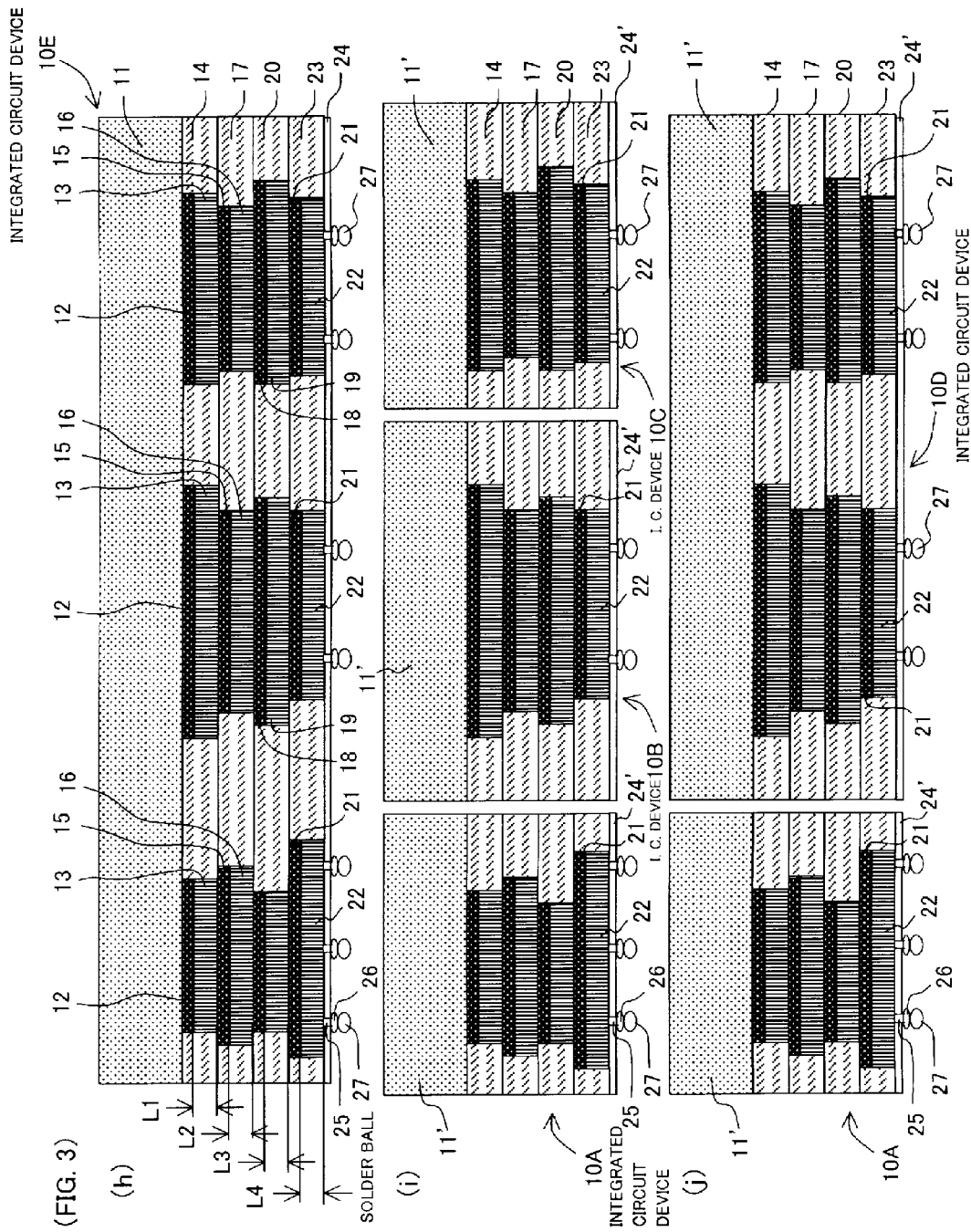
FIGS. 3(h) to 3(j) are cross-sectional views showing the basic concept of the method of fabricating the integrated circuit device having a three-dimensional stacked structure according to the invention, respectively, which are subsequent to FIG. 2(g).

Specifically, as shown in FIG. 3(*h*), semiconductor chips 19 (i.e., chip-shaped semiconductor circuits), each of which has a connecting portion 18 in its surface, are respectively fixed to the reverses of the chips 16 exposed from the cured layer of the adhesive 17 of the second semiconductor circuit layer L2 in such a way as to be superposed thereon. The structure of the connecting portion 18 of the chip 19 is the same as that of the connecting portion 12 of the chip 13 of the first semiconductor circuit layer L1. The mechanical and electrical connection between the chips 19 and the chips 16 is simultaneously accomplished by the connecting portions 18.

If the chip 19 is smaller than the chip 16, the whole connecting portion 18 of the chip 19 is included within the reverse of the chip 16. However, if the chip 19 is larger than the chip 16, part of the connecting portion 18 of the chip 19 protrude from the reverse of the chip 16, where the protruding part contacts the adhesive 17.

Thereafter, the gaps formed on the peripheries of the chips 19 fixed to the corresponding chips 16 of the second semiconductor circuit layer L2 by way of the connection portions 18 are filled with a liquid or fluid adhesive 20 in the same way as used for the chips 13. Then, the adhesive 20 is cured by applying heat, irradiating ultraviolet rays, or the like.

Next, the opposite faces (i.e., the reverses) of the fixed chips 19 to their fixed faces are polished by the mechanical polishing method and the CMP method, thereby making the reverses of the respective chips 19 located in the same plane as the cured layer of the adhesive 20. In this way, the chips 19 are mechanically and electrically connected to the corresponding chips 16 with the connecting portions 18. Thus, a third semiconductor circuit layer L3 including the chips 19 and the cured layer of the adhesive 20 is formed to be superposed on the second semiconductor circuit layer L2. The mechanical and electrical connection between the third semiconductor circuit layer L3 and the second semiconductor circuit layer L2 is carried out by the connecting portions 18 of the respective chips 19.

Next, in approximately the same way as above, a plurality of semiconductor chips 22 are arranged on the third semiconductor circuit layer L3 formed through the above-described steps, thereby forming a fourth semiconductor circuit layer L4.

Specifically, as shown in FIG. 3(*h*), semiconductor chips 22 (i.e., chip-shaped semiconductor circuits), each of which has a connecting portion 21 on its surface, are respectively fixed to the reverses of the chips 19 exposed from the cured layer of the adhesive 20 of the third semiconductor circuit layer L3 in such a way as to be superposed thereon. The structure of the connecting portion 21 of the chip 22 is the same as that of the connecting portion 12 of the chip 13 of the first semiconductor circuit layer L1. The mechanical and electrical connection between the chips 22 and the chips 19 is simultaneously accomplished by the connecting portions 21.

If the chip 22 is smaller than the chip 19, the whole connecting portion 21 of the chip 22 is included in the reverse of the chip 19. However, if the chip 22 is larger than the chip 19, part of the connecting portion 21 of the chip 22 protrude from the reverse of the chip 19, where the protruding part contacts the adhesive 20.

Thereafter, the gaps formed on the peripheries of the chips 22 fixed to the corresponding chips 19 of the third semiconductor circuit layer L3 by way of the connection portions 21 are filled with a liquid or fluid adhesive 23 in the same way as used for the chips 13. Then, the adhesive 23 is cured by applying heat, irradiating ultraviolet rays, or the like.

Next, the opposite faces (i.e., the reverses) of the fixed chips 22 to their fixed faces are polished by the mechanical polishing method and the CMP method, thereby making the reverses of the respective chips 22 located in the same plane as the cured layer of the adhesive 23. In this way, the chips 22 are mechanically and electrically connected to the corresponding chips 19 with the connecting portions 21. Thus, a fourth semiconductor circuit layer L4 including the chips 22 and the cured layer of the adhesive 23 is formed to be superposed on the third semiconductor circuit layer L3. The mechanical and electrical connection between the fourth semiconductor circuit layer L4 and the third semiconductor circuit layer L3 is carried out by the connecting portions 21 of the respective chips 22.

Subsequently, an insulating layer 24 is formed on the surface formed by the chips 22 and the cured layer of the adhesive 23 of the fourth semiconductor circuit layer L4, thereby covering the entirety of the said surface. Conductive plugs 25 (buried interconnections), which are connected to the internal integrated circuits of the corresponding chips 22 through the insulating layer 24, are formed at the predetermined positions. Then, microbump electrodes (electrodes formed by microbumps) 26, each of which is fixed to one end of the corresponding plug 25, are formed. Finally, ball-shaped solders (solder balls) 27 are fixed onto the respective electrodes 26. The solder balls 27 may be cancelled.

Through the above-described steps, as shown in FIG. 3(*h*), a stacked structure formed by sequentially stacking the first to fourth semiconductor circuit layers L1 to L4 on the mounting surface 11*a* of the support substrate 11 is obtained. This stacked structure includes chip stacks each of which is formed by four stacked chips 13, 16, 19, and 22 (chip-shaped semiconductor circuits). These chip stacks are arranged apart from each other in a direction parallel to the support substrate 11, and the gaps on the peripheries of the said chip stacks are filled with the cured adhesives 14, 17, 20, and 23. In each of the chip stacks, the stacked chips 13, 16, 19, and 22 are electrically interconnected.

Subsequently, the stacked structure comprising the first to fourth semiconductor circuit layers L1 to L4 is subjected to a dicing process by a known method, thereby dividing the stacked structure into desired integrated circuit devices. This dicing process is performed in such a way that the dicing blade passes through between the adjoining chip stacks. In this way, integrated circuit devices 10A, 10B and 10C as shown in FIG. 3(*i*) are obtained. Each of the devices 10A, 10B and 10C comprises a three-dimensional stacked structure, wherein a set of four semiconductor chips 13, 16, 19, and 22 having different sizes and different functions are stacked on the divided substrate 11'.

FIG. 28(a) is a schematic plan view showing the layout of the solder balls 27 of the integrated circuit device 10A. The solder balls 27 (i.e., the microbump electrodes 26) for external circuit connection are regularly arranged on the flat surface opposite to the support substrate 11. This is applicable to the integrated circuit devices 10B and 10C. The microbump electrodes 26 themselves may be used as the terminals for external circuit connection by omitting the solder balls 27.

The dicing process is not limited to the above-described method. For example, like the integrated circuit device 10D shown in FIG. 3(j), the dicing process may be carried out in such a way as to include the two adjoining chip stacks, or to include the three or more chip stacks as necessary. Alternately, the entirety of the stacked structure shown in FIG. 3(h) may be used as a wafer-level integrated circuit device 10E without the dicing process.

As explained above, with the method of fabricating an integrated circuit device having a three-dimensional stacked structure according to the invention, by combining the semiconductor chips 13, 16, 19, and 22 (the chip-shaped semiconductor devices) having different functions together on the support substrate 11 as necessary, the integrated circuit device 10A, 10B, 10C, 10D or 10E each having a three-dimensional stacked structure and capable of a desired systemized function can be fabricated. Accordingly, not only systemized integrated circuit devices in a similar way to the conventional system LSI can be easily obtained but also diversified functions can be realized according to the necessity.

Moreover, the semiconductor chips 13, 16, 19, and 22 located respectively in the first to fourth semiconductor circuit layers L1 to L4 are arranged to be apart from each other in a direction parallel to the support substrate 11 in the semiconductor circuit layer L1, L2, L3, or L4. The chips 13, 16, 19, and 22 are respectively fixed by the insulative adhesives 14, 17, 20, and 23 and then, are polished from their reverse sides to adjust their thicknesses. For this reason, even if the chips 13, 16, 19, and 22 to be combined (i.e., semiconductor circuits to be combined) are different in size, shape and/or thickness from each other, the chips 13, 16, 19, and 22 can be combined and mounted on the single support substrate 11.

Furthermore, with the fabrication method of the invention, the integrated circuit devices 10A, 10B and 10C, or the semiconductor devices 10A and 10D, or the semiconductor device 10E, each having a three-dimensional stacked structure, is/are obtained. Each of the devices 10A, 10B, 10C, 10D, and 10E comprises the support substrate 11 or the substrate 11' formed by dividing the substrate 11, and the chips 13, 16, 19, and 22 having different functions mounted in combination on the substrate 11 or 11' according to the necessity. The opposite face of the three-dimensional stacked structure to the substrate 11 or 11' is covered with the insulating layer 24 or the insulating layer 24' formed by dividing the layer 24. The solder balls 27 for external circuit connection are arranged on the insulating layer 24 or 24'. The side face(s) of the stacked structure or structures is/are covered with the covering materials, i.e., the adhesives 14, 17, 20, and 23 made of the insulative synthetic resins.

As explained above, with the integrated circuit devices 10A, 10B, 10C, 10D, and 10E, the electrical interconnection among the semiconductor circuit layers L1 to L4 is realized by the connecting portions 12, 15, 18, and 21. Moreover, the substrate 11 or 11', the covering materials (the adhesives 14, 17, 20, and 23), and the insulating layer 24 or 24' has a function of the package that accommodates and protects the semiconductor circuit layers L1 to L4. Electrical connection to an external circuit or device can be performed using the microbump electrodes 26 or the solder balls 27 arranged on the opposite face of the stacked structure to the substrate 11 or 11'. Therefore, each of the integrated circuit devices 10A, 10B, 10C, 10D, and 10E has a structure that the semiconductor circuit layers L1 to L4 and the package are unified, in other words, a package-integrated three-dimensional stacked structure. As a result, similar systemization to the conventional system LSIs can be easily realized while the difficulty in the electrical interconnection (wiring) between the internal circuits and in the packaging is eliminated or suppressed and at the same time, diversified functions can be realized according to the necessity.

In the above explanation, semiconductor chips (chip-shaped semiconductor circuits) are used as the semiconductor circuits constituting each of the first to fourth semiconductor circuit layers L1 to L4. However, each of the first to fourth semiconductor circuit layers L1 to L4 may be partially formed by using a semiconductor wafer (a wafer-shaped semiconductor circuits). Although one semiconductor chip located in one of the semiconductor circuit layers L1 to L4 is superposed on a corresponding semiconductor chip located in an adjoining one of the semiconductor circuit layers L1 to L4 in the above explanation, the invention is not limited to this. One semiconductor chip located in one of the semiconductor circuit layers may be superposed on two or more corresponding semiconductor chips in an adjoining one of the semiconductor circuit layers.

Moreover, although semiconductor chips judged as KGDs are used in each of the first to fourth semiconductor circuit layers L1 to L4 in the above explanation, it is unnecessary for the invention that all the semiconductor chips in each of the semiconductor circuit layers are KGDs. With the semiconductor chip judged as a KGD, it is unnecessary that all the circuits formed in this chip are used (or operated), which means that an unused (or non-operable) circuit or circuits (e.g., a redundant section) may be included therein. Here, the "redundant section" means that redundant components are added to the chip in advance in such a way that the chip operates to conduct all the functions even if part of the components in the said chip has a malfunction. If a defect is found in some of the circuit components in the first to fourth semiconductor circuit layers L1 to L4 in the inspection operation after the stacking, adjustment is applied to the said components so that the circuit components in the redundant section are used instead of the defective components. This is easily carried out by cutting the wiring lines connected to the defective components by, for example, supplying a predetermined electric current from the outside and then, switching the wiring lines in such a way as to be connected to the redundant components. Since this is well known in the said art, explanation is omitted here. Because of the preparation of the "redundant section", there is an additional advantage that the fabrication yield of the said integrated circuit device having a three-dimensional stacked structure is increased.

If the semiconductor chip providing specific circuit functions in one of the first to fourth semiconductor circuit layers L1 to L4 is unnecessary, it is preferred that the position of the said chip is filled with a so-called dummy chip. Here, the dummy chip means a semiconductor chip having the same external form as a KGD and no inner circuit, or a semiconductor chip having the same external form as a KGD and inner circuits all of which are unused. In this case, only buried interconnections for electrical connection to another adjoining semiconductor chip or chips are formed in the dummy chip as necessary. This is because if a vacant position where no semiconductor chip exists is generated in one of the semiconductor circuit layers L1 to L4, some obstacle may occur in the execution of the step of stacking the semiconductor chip (the step of forming one of the semiconductor circuit layers), or some problem about the mechanical strength may arise in the integrated circuit device thus fabricated. However, if such the problem can be avoided, the vacant position may be filled with any filling material other than the dummy chip.

First Embodiment

Next, a method of fabricating an integrated circuit device having a three-dimensional stacked structure according to a first embodiment of the invention will be explained below.

This method is based on the above-described basic concept of the invention with reference to FIGS. 1(a) to 3(j). Therefore, the whole process steps of this method are the same as those shown in FIGS. 1 to 3. As shown in FIGS. 4(a) and 5(b), this method is characterized in that the step of fixing the semiconductor chips constituting each of the first to fourth semiconductor circuit layers L1 to L4 to the support substrate 11 or the first, second, or third semiconductor circuit layer L1, L2, or L3 (i.e., the semiconductor chip fixing step) is carried out by collective transfer of the semiconductor chips using a "carrier substrate" as a support member for transfer. Such the method is termed the "transfer type" here.

FIGS. 4(a) and 4(b) are cross-sectional views showing the step of fixing the semiconductor chips constituting the first semiconductor layer L1 at the predetermined positions on the support substrate in the method of fabricating an integrated circuit device according to the first embodiment of the invention. FIGS. 5(a) and 5(b) cross-sectional view showing the step of fixing the semiconductor chips constituting the third semiconductor layer L3 at the predetermined positions on the second semiconductor layer in the said method.

Figure 4:
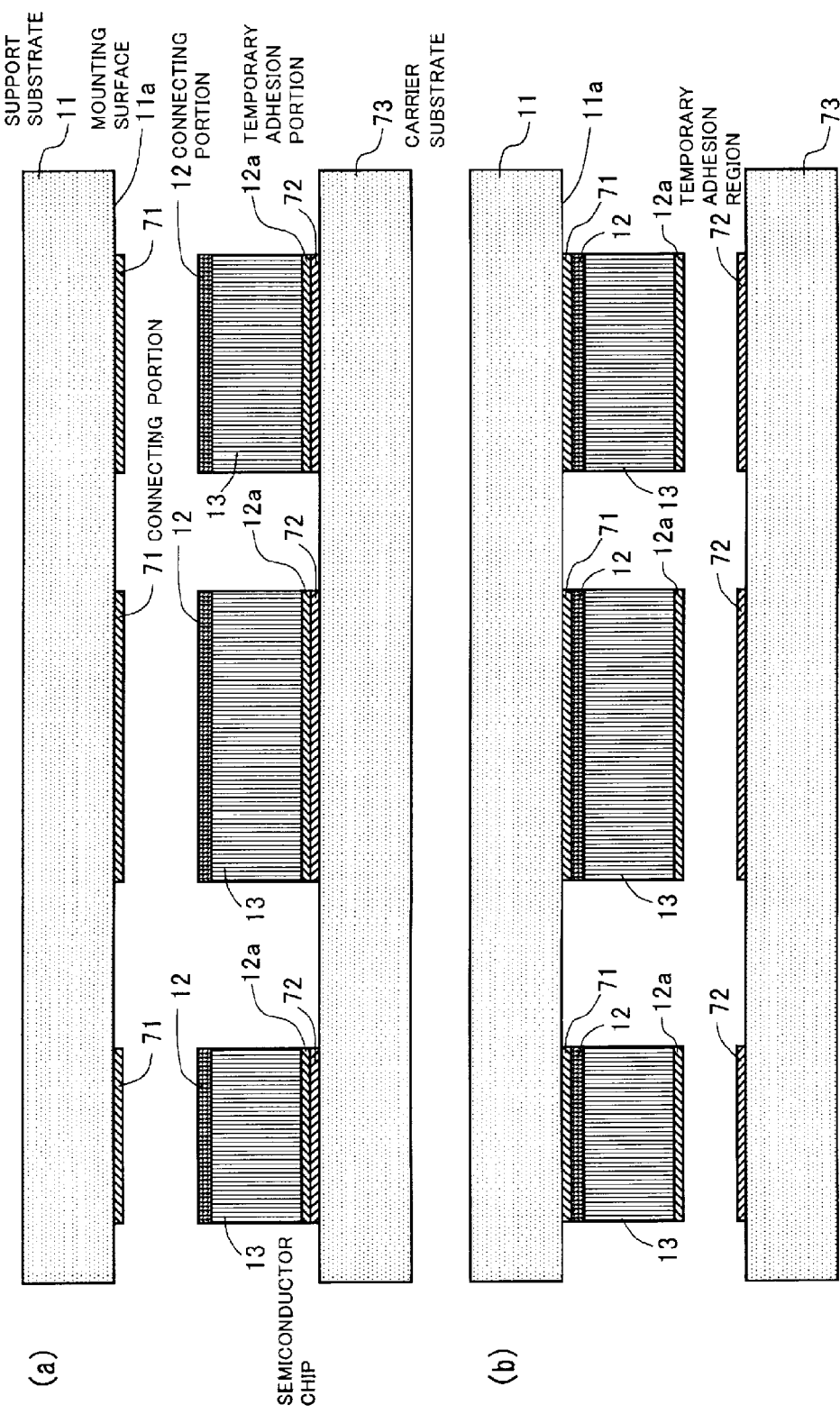
FIGS. 4(a) and 4(b) are cross-sectional views showing the step of fixing the semiconductor chips constituting the first semiconductor layer on the support substrate (transfer type) in a method of fabricating an integrated circuit device having a three-dimensional stacked structure according to a first embodiment of the invention, respectively.
Figure 5:
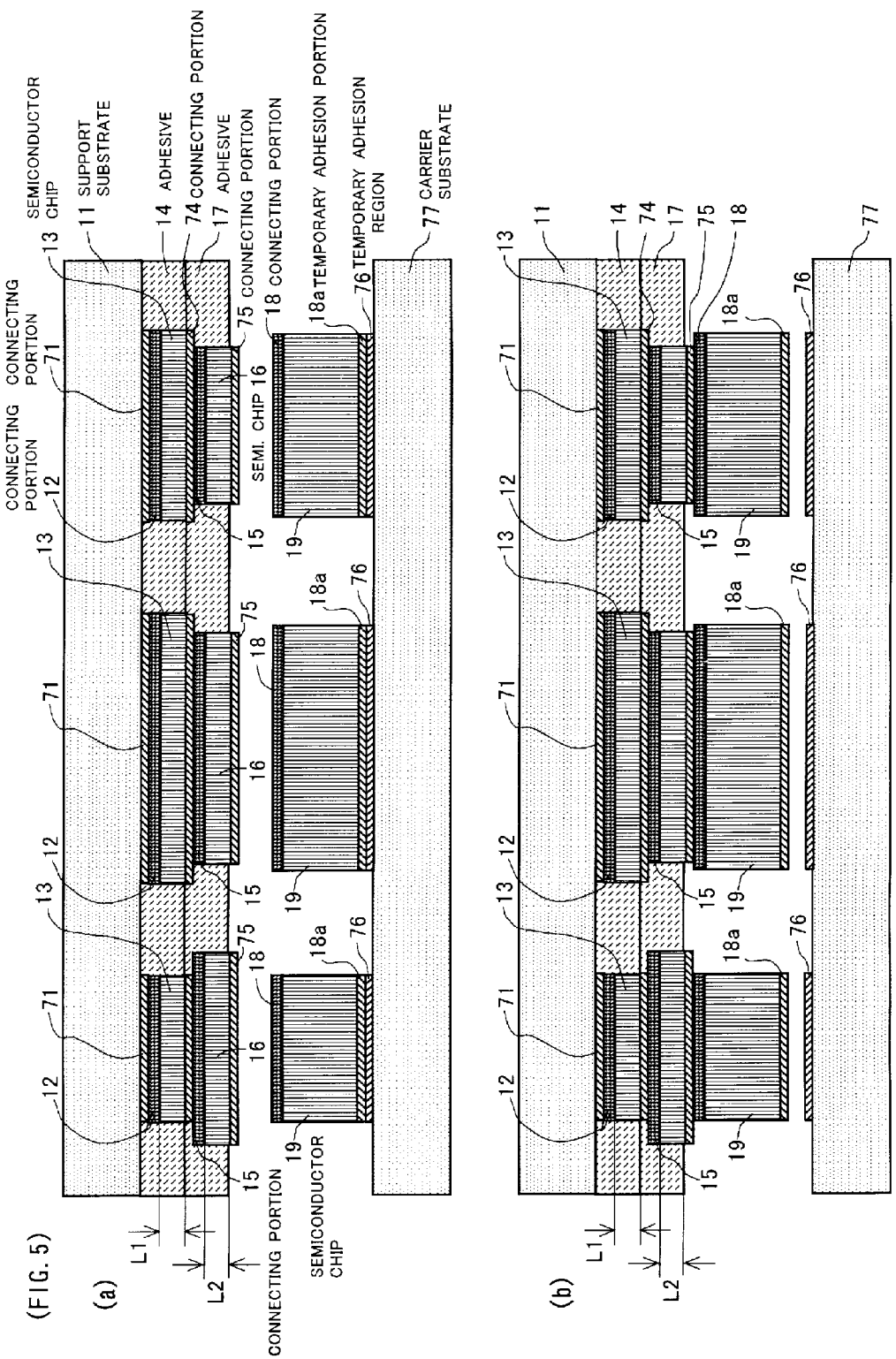
FIGS. 5(a) and 5(b) are cross-sectional views showing the step of fixing the semiconductor chips constituting the third semiconductor layer on the second semiconductor layer (transfer type) in the method of fabricating an integrated circuit device having a three-dimensional stacked structure according to the first embodiment of the invention, respectively.

In the method of fabricating an integrated circuit device according to the first embodiment, as shown in FIG. 4, in the step of fixing the semiconductor chips 13 constituting the first semiconductor layer L1 at the predetermined positions on the mounting surface 11a of the support substrate 11, all the chips 13 are temporarily adhered on a carrier substrate 73 serving as the "support member for transfer" and thereafter, all the chips 13 are transferred to the desired positions on the mounting surface 11a in a lump and fixed thereon.

Specifically, first, the carrier substrate 73 is prepared. The substrate 73 has an enough size for placement of the semiconductor chips 13 with a layout equivalent to a mirror image of a desired layout and an enough rigidity for withstanding the weight of the necessary number of the semiconductor chips 13. As the carrier substrate 73, for example, a glass substrate, a semiconductor wafer, or the like, which has an enough rigidity, may be used.

Rectangular thin film-shaped temporary adhesion regions 72, the total number of which is equal to the total number of the chips 13 (here, only the three regions 72 are shown), are formed on one surface of the carrier substrate 73, as shown in FIG. 4(a). These temporary adhesion regions 72 have a sticky property such that all the chips 13 can be held temporarily until they are transferred to the support substrate 11. The position of each temporary adhesion region 72 is set in such a way that the chips 13 are arranged on the mounting surface 11a of the support substrate 11 with a layout equivalent to a mirror image of the desired layout. The size and shape of each temporary adhesion region 72 are approximately in accordance with the size and shape (here, rectangular shape) of the chip 13 (correctly speaking, a temporary adhesion portion 12a formed on the reverse of the chip 13) to be placed thereon, respectively. Accordingly, if the temporary adhesion portion 12a (i.e., the opposite end to the connecting portion 12) of each chip 13 is temporarily adhered to the corresponding temporary adhesion region 72, the layout of the chips 13 will be a mirror image of the desired layout of the chips 13 on the support substrate 11.

The temporary adhesion region 72 is formed, for example, in the following way. Specifically, first, a thin metal film, or a thin insulative film, or a stack of a thin metal film and a thin insulative film (which has a thickness of, for example, 0.1 μm) is deposited on the whole surface of the carrier substrate 73 by a known method. Then, an appropriate sticky material (which has a thickness of, for example, 1 μm) is thinly coated on the metal film, the insulative film, or the stack of the metal and insulative films thus deposited. Thereafter, the metal film, the insulative film, or the stack of the metal and insulative films, and the sticky material coated thereon are selectively etched out. In this way, the temporary adhesion regions 72 whose surfaces are covered with the sticky material can be formed on the surface of the carrier substrate 73 in such a way as to have a layout equivalent to a mirror image of the desired layout of the chips 13 on the support substrate 11. In the case where the temporary adhesion regions 72 are formed by the metal film, the insulative film, or the stack of the metal and insulative films, and the sticky material in such the manner as above, there is an advantage that the position and attitude of the temporarily adhered chips 13 are more stabilized.

Indium (In), tin (Sn), or the like may be used as the metal film usable for the temporary adhesion region 72. Silicon dioxide ($SiO_2$), silicon nitride ($Si_3N_4$), or the like may be used as the insulative film usable for the temporary adhesion region 72. A photoresist, wax, polyimide resin, silicone resin, or the like may be used as the sticky material.

If no problem about the stability of the position and attitude of the temporarily adhered chips 13 occurs, the temporary adhesion region 72 may be formed by the sticky material only. In this case, for example, it is sufficient that an appropriate sticky material is thinly coated on the whole surface of the carrier substrate 67 (which has a thickness of, for example, 1 μm) and then, the sticky material thus coated is patterned by a known lithography method. Alternately, a sticky material may be printed on one surface of the carrier substrate 73 to have a desired pattern. If so, there is an advantage that not only the number of the necessary process steps is decreased but also the process steps themselves are simplified compared with the case where the metal film, the insulative film, or the stack of the metal and insulative films is used along with the sticky material. On the other hand, if the stability of the position and attitude of the temporarily adhered chips 13 is considered important, it is preferred that the metal film, the insulative film, or the stack of the metal and insulative films is used in combination with the sticky material, as explained above.

The temporary adhesion portions 12a formed on the respective reverses of the chips 13 are formed for the purpose of facilitating the temporary adhesion of the chips 13 to the sticky material placed on the temporary adhesion regions 72 when the temporary adhesion portions 12a are brought into contact with the said sticky material. Here, the temporary adhesion portions 12a are formed to be film-shaped by thinly coating the same sticky material as used for the temporary adhesion regions 72 (which has a thickness of, for example, 1μ). Since the temporary adhesion portions 12a has the above-described purpose, it is needless to say that the temporary adhesion portions 12a may be omitted if the reverses of the chips 13 are clean and flat enough for temporary adhesion of the chips 13 to the sticky material of the temporary adhesion regions 72. In this case, the reverses of the chips 13 themselves serve as the temporary adhesion portions.

The connecting portions 12 formed on the reverses of the respective chips 13 are realized by utilizing, for example, microbump electrodes, as described in the explanation of the basic concept of the present invention. However, the connecting portions 12 may have any other structure if the respective chips 13 can be electrically connected using them.

On the other hand, a necessary number of connecting portions 71 are formed on the mounting surface 11a of the support substrate 11 at the predetermined chip-fixing positions. These connecting portions 71 are portions to which the connecting portions 12 formed on the surfaces of the corresponding chips 13 are respectively connected. The connecting portions 71 are realized by utilizing, for example, microbump electrodes, similar to the connecting portions 12 of the respective chips 13. However, the connecting portions 71 may have any other structure if the respective chips 13 can be electrically connected using them.

In the first embodiment, the connecting portions 71 formed on the support substrate 11 are not essential and they may be omitted (see FIG. 1(a)). If the connecting portions 71 are omitted, the chips 13 will be directly fixed to the predetermined positions of the mounting surface 11a (e.g., the connecting positions defined in the wiring regions formed on the mounting surface 11a).

Next, the temporary adhesion portions 12a of the respective chips 13 are lightly contacted with the corresponding temporary adhesion regions 72, or they are lightly pressed against the corresponding temporary adhesion regions 72, thereby temporarily adhering the chips 13 to the temporary adhesion regions 72 utilizing the sticking action of the sticky material. The state at this time is shown in FIG. 4(a). It is preferred that this step is carried out by pressing the chips 13 against the temporary adhesion regions 72 after all the chips 13 have been individually placed on the temporary adhesion regions 72 using a known chip bonder.

Thereafter, the carrier substrate 73, on which all the necessary chips 13 have been temporarily adhered on the corresponding temporary adhesion regions 72, is raised in a state parallel to the support substrate 11 that is being held horizontally in such a way that the mounting surface 11a is faced downward. Alternately, on the contrary, the support substrate 11 is lowered in a state parallel to the carrier substrate 73 on which all the necessary chips 13 have been temporarily adhered. Thus, the connecting portions 12 existing on the surfaces of the respective chips 13 are contacted with the corresponding connecting portions 71 on the support substrate 11 in a lump. Subsequently, the connecting portions 12 of the chips 13 are respectively fixed to the corresponding connecting portions 71 on the support substrate 11 by an appropriate method. (For example, the microbump electrodes are bonded with each other using bonding metals intervening between them, the microbump electrodes are bonded with each other by pressure welding without bonding metals, or the microbump electrodes are bonded with each other by fusion welding without bonding metals.) A concrete example of the step of fixing the connecting portions 12 to the connecting portions 71 will be described in the following explanation about the third embodiment with reference to FIGS. 23 to 26.

After the fixing of the connecting portions 12 and 71 is completed, the carrier substrate 73 needs to be detached from the chips 13. The detachment of the carrier substrate 73 from the chips 13 may be performed in various methods. For example, when the carrier substrate 73 is made of quartz glass and the temporary adhesion regions 72 are made of only the sticky material, ultraviolet rays may be irradiated to the temporary adhesion regions 72 by way of the carrier substrate 73 to cure the sticky material that forms the temporary adhesion regions 72, thereby destroying the sticking force of the said material. Alternately, the sticking force of the sticky material may be lowered by raising the temperature of the sticky material for the temporary adhesion regions 72 due to application of heat, thereby weakening the sticking force of the said material. If the sticking force of the sticky material for the temporary adhesion regions 72 is not so strong, the carrier substrate 73 and the support substrate 11 may be moved away from each other by simply pulling the carrier substrate 73 or the support substrate 11. The temporary adhesion regions 72 themselves may be fluidized or removed using an appropriate chemical agent.

When the temporary adhesion regions 72 are made of the metal film, the insulative film, or the stack of the metal and insulative films, and the sticky material covering the surface thereof, it is not easy to remove the metal film, the insulative film, or the stack of the metal and insulative films. Therefore, it is preferred to break or lower the sticky property of the sticky material by raising the temperature thereof, or to fluidize or remove the sticky material using an appropriate chemical agent. If the sticking force of the sticky material for the temporary adhesion regions 72 is not so strong, the carrier substrate 73 and the support substrate 11 may be moved away from each other by simply pulling the carrier substrate 73 or the support substrate 11.

When the carrier substrate 73 is detached from the chips 13 after completing the fixing of the connecting portions 12 and 71, the state shown in FIG. 4(b) is obtained. The state of the support substrate 11 at this time is substantially the same as that of FIG. 1(b). After the fixing of the chips 13 to the mounting surface 11a of the support substrate 11 is completed in this way, the gaps on the peripheries of the chips 13 are filled with the liquid or fluid adhesive 14 and then, the adhesive 14 is cured by applying heat, irradiating ultraviolet rays, or the like, as shown in FIG. 1(c). Thereafter, in the same manner as the aforementioned one about the basic concept of the invention, the first semiconductor circuit layer L1 is formed (see FIG. 1(d)).

In FIGS. 4(a) and 4(b), a necessary number of the chips 13 are placed on the carrier substrate 73 that has been faced upward and thereafter, these chips 13 are collectively transferred and fixed to the mounting surface 11a of the support substrate 11 that has been faced downward. However, the said embodiment is not limited to this. A necessary number of the chips 13 may be placed on the carrier substrate 73 that has been faced downward and thereafter, these chips 13 may be collectively transferred and fixed to the mounting surface 11a of the support substrate 11 that has been faced upward. In summary, it is sufficient that the chips 13 can be collectively transferred to the mounting surface 11a using the carrier substrate 73.

The steps of respectively fixing the semiconductor chips 16, 19, and 22 that constitute the second to fourth semiconductor circuit layers L2 to L4 to the first to third semiconductor circuit layers L1 to L3 at their corresponding positions are substantially the same as the aforementioned step with reference to FIGS. 4(a) and 4(b). Here, the step of fixing the semiconductor chips 19 constituting the third semiconductor circuit layer L3 to the second semiconductor circuit layer L2 at the corresponding positions thereof will be explained below with reference to FIGS. 5(a) and 5(b).

With the fixing step of the semiconductor chips 19 constituting the third semiconductor circuit layer L3, similar to the case of the semiconductor chips 13 constituting the first semiconductor circuit layer L1, a necessary number of the chips 19 are temporarily adhered on a carrier substrate 77 serving as the "support member for transfer" to have a predetermined layout and thereafter, all the chips 19 are fixed to the corresponding positions on the second semiconductor circuit layer L2 in a lump.

Specifically, first, the carrier substrate 77 is prepared. The substrate 77 has an enough size for placement of the semiconductor chips 19 with a layout equivalent to a mirror image of a desired layout and an enough rigidity for withstanding the weight of the necessary number of the semiconductor chips 19. As the carrier substrate 77, for example, a glass substrate, a semiconductor wafer, or the like, which has an enough rigidity, may be used.

Rectangular thin film-shaped temporary adhesion regions 76, the total number of which is equal to the total number of the chips 19 (here, only the three regions 76 are shown), are formed on one surface of the carrier substrate 77, as shown in FIG. 5(a). These temporary adhesion regions 76 have a sticky property such that all the chips 19 can be held temporarily thereon until they are transferred to the second semiconductor circuit layer L2. The position of each temporary adhesion region 76 is set in such a way that the chips 19 are arranged with a layout equivalent to a mirror image of the desired layout on the mounting surface of the second semiconductor circuit layer L2. The size and shape of each temporary adhesion region 76 is approximately in accordance with the size and shape (here, rectangular shape) of the chip 19 (correctly speaking, a temporary adhesion portion 18a formed on the reverse of the chip 19) to be placed thereon, respectively. Accordingly, if the temporary adhesion portion 18a (i.e., the opposite end to the connecting portion 18) of each chip 19 is temporarily adhered to the corresponding temporary adhesion region 76, the layout of the chips 19 will be a mirror image of the desired layout of the chips 19 on the second semiconductor circuit layer L2.

The temporary adhesion region 76 is formed by the same material as the temporary adhesion region 72 in the same manner as that of the region 72.

The temporary adhesion portions 18a formed on the respective reverses of the chips 18 are formed for the purpose of facilitating the temporary adhesion of the chips 19 to the sticky material placed on the temporary adhesion regions 76, when the temporary adhesion portions 18a are brought into contact with the said sticky material. Here, the temporary adhesion portions 18a are formed using the same material as that of the temporary adhesion portions 12a of the chips 13 in the same manner as that of the portions 12a. Similar to the portions 12a, the portions 18a may be omitted.

The connecting portions 18 formed on the reverses of the respective chips 19 are realized by utilizing, for example, microbump electrodes, as described in the explanation of the basic concept of the present invention. However, the connecting portions 18 may have any other structure if the respective chips 19 can be electrically connected using them.

On the other hand, a necessary number of connecting portions 75 are formed at the desired chip-fixing positions (in other words, on the reverses of the respective semiconductor chips 16 that constitute the second semiconductor circuit layer L2). These connecting portions 75 are portions to which the connecting portions 18 formed on the surfaces of the corresponding chips 19 are respectively connected. The connecting portions 75 are realized by utilizing, for example, microbump electrodes, similar to the connecting portions 12 of the respective chips 13. However, the connecting portions 75 may have any other structure if the respective chips 19 can be electrically connected using them.

In the first embodiment, the connecting portions 75 are not essential and they may be omitted (see FIG. 3(h)). If the connecting portions 75 are omitted, the chips 19 will be directly fixed to the mounting surface of the second semiconductor circuit layer L2, that is, at the predetermined connecting positions defined on the reverses of the respective chips 16.

Next, the temporary adhesion portions 18a of the respective chips 19 are lightly contacted with the corresponding temporary adhesion regions 76, or they are lightly pressed against the corresponding temporary adhesion regions 76, thereby temporarily adhering the chips 19 to the temporary adhesion regions 76 utilizing the sticking action of the sticky material. The state at this time is shown in FIG. 5(a). It is preferred that this step is carried out by pressing the chips 19 against the temporary adhesion regions 76 after all the chips 19 have been individually placed on the temporary adhesion regions 76 using a known chip bonder.

Thereafter, the carrier substrate 77, on which all the necessary chips 19 have been temporarily adhered, is raised in a state parallel to the support substrate 11 that is being held horizontally in such a way that the mounting surface 11a is faced downward. Alternately, on the contrary, the support substrate 11 is lowered in a state parallel to the carrier substrate 77 on which all the necessary chips 19 have been temporarily adhered. Thus, the connecting portions 18 existing on the surfaces of the respective chips 19 are contacted with the corresponding connecting portions 75 on the second semiconductor circuit layer L2 in a lump. Subsequently, the connecting portions 18 of the chips 19 are respectively fixed to the corresponding connecting portions 75 on the second semiconductor circuit layer L2 by an appropriate method. (For example, the microbump electrodes are bonded with each other using bonding metals intervening between them, the microbump electrodes are bonded with each other by pressure welding without bonding metals, or the microbump electrodes are bonded with each other by fusion welding without bonding metals.) This step is the same as that of fixing the connecting portions 12 to the corresponding connecting portions 71.

After the fixing of the connecting portions 18 and 75 is completed, the carrier substrate 77 needs to be detached from the chips 19. The detachment of the carrier substrate 77 from the chips 19 may be performed in various methods. For example, when the carrier substrate 77 is made of quartz glass and the temporary adhesion regions 76 are made of only the sticky material, ultraviolet rays may be irradiated to the temporary adhesion regions 76 by way of the carrier substrate 77 to cure the sticky material that forms the temporary adhesion regions 76, thereby destroying the sticking force of the said material. Alternately, the sticking force of the sticky material for the temporary adhesion regions 76 may be lowered by raising the temperature of the sticky material due to application of heat, thereby weakening the sticking force of the said material. If the sticking force of the sticky material for the temporary adhesion regions 76 is not so strong, the carrier substrate 77 and the support substrate 11 may be moved away from each other by simply pulling the carrier substrate 77 or the support substrate 11. The temporary adhesion regions 76 themselves may be fluidized or removed using an appropriate chemical agent.

When the temporary adhesion regions 76 are made of the metal film, the insulative film, or the stack of the metal and insulative films, and the sticky material covering the surface thereof, it is not easy to remove the metal film, the insulative film, or the stack of the metal and insulative films. Therefore, it is preferred to break or lower the sticky property of the sticky material by raising the temperature thereof, or to fluidize or remove the sticky material using an appropriate chemical agent. If the sticking force of the sticky material for the temporary adhesion regions 76 is not so strong, the carrier substrate 77 and the support substrate 11 may be moved away from each other by simply pulling the carrier substrate 77 or the support substrate 11.

When the carrier substrate 77 is detached from the chips 19 after completing the fixing of the connecting portions 18 and 75, the state shown in FIG. 5(b) is generated. After the fixing of the chips 19 to the second semiconductor circuit layer L2 is completed in this way, the gaps on the peripheries of the chips 19 are filled with the liquid or fluid adhesive 20 and then, the adhesive 20 is cured by applying heat, irradiating ultraviolet rays, or the like. Thereafter, in the same manner as the aforementioned one about the basic concept of the invention, the third semiconductor circuit layer L3 is formed (see FIG. 3(h)).

In FIGS. 5(a) and 5(b), a necessary number of the chips 19 are placed on the carrier substrate 77 that has been faced upward and thereafter, these chips 19 are collectively transferred and fixed to the second semiconductor circuit layer L2 that has been faced downward. However, the said embodiment is not limited to this. A necessary number of the chips 19 may be placed on the carrier substrate 77 that has been faced downward and thereafter, these chips 19 may be collectively transferred and fixed to the second semiconductor circuit layer L2 that has been faced upward. In summary, it is sufficient that the chips 19 can be collectively transferred to the second semiconductor circuit layer L2 using the carrier substrate 77.

With the method of fabricating an integrated circuit device having a three-dimensional stacked structure according to the first embodiment of the present invention, as explained above, first, the carrier substrates 73 and 77 (each of which corresponds to the "support member for transfer") are prepared. Each of the carrier substrates 73 and 77 comprises on its surface the temporary adhesion regions 72 or 76 for arranging the semiconductor chips (chip-shaped semiconductor circuits) 13 or 19 with a layout equivalent to a mirror image of the desired layout. Next, the opposite ends of the chips 13 and 19 to the connecting portions 12 and 18 are temporarily adhered to the temporary adhesion regions 72 and 76, respectively, thereby placing the chips 13 and 19 on the carrier substrates 73 and 77, respectively. Further, by causing respectively the carrier substrates 73 and 77 on which the chips 13 and 19 have been respectively placed to approach the support substrate 11 and the second semiconductor circuit layer L2, the temporary adhesion portions 12 and 18 of the chips 13 and 19 on the carrier substrates 73 and 77 are respectively brought into contact with the predetermined positions of the support substrate 11 and those of the second semiconductor circuit layer L2. Subsequently, by connecting respectively the connecting portions 12 and 18 of the chips 13 and 19 to the predetermined positions of the support substrate 11 and those of the second semiconductor circuit layer L2, which have been brought into contact with each other, the chips 13 and 19 are respectively fixed on the support substrate 11 and the second semiconductor circuit layer L2 with their desired layouts.

Moreover, the step of forming the temporary adhesion regions 72 and 76 on the carrier substrates 73 and 77, the step of temporarily adhering the chips 13 and 19 to the temporary adhesion regions 72 and 76, and the positioning in the step of contacting the connecting portions 12 and 18 of the chips 13 and 19 with the predetermined positions of the support substrate 11 and those of the second semiconductor circuit layer L2 can be respectively carried out with desired accuracy, if known techniques that have been used in the fabrication processes of an integrated circuit device not having a three-dimensional stacked structure are utilized.

These points are applicable to the fixing of the semiconductor chips 16 to the first semiconductor circuit layer L1 and the fixing of the semiconductor chips 22 to the third semiconductor circuit layer L3 (which are not explained with reference to FIGS. 4(a) to 5(b)).

Accordingly, the many (e.g., several hundreds of) semiconductor chips 13, 16, 19, or 22 can be respectively fixed easily and efficiently with desired accuracy on the support substrate 11, and the first, second, and third semiconductor circuit layers L1, L2, and L3 in such a way as to form the desired layouts.

As a result, if bump electrodes are used for electrical interconnection among the semiconductor chips 13, 16, 19, and 22, the bump electrodes that have been formed with a desired layout on the respective connecting surfaces of the chips 13, 16, 19, and 22 can be fixed correctly to the corresponding bump electrodes or to the corresponding connection areas of the wiring lines oppositely in a one-to-one correspondence.

In addition, with the above-described first embodiment, the temporary adhesion regions 72 and 76 on the carrier substrates 73 and 77 are respectively patterned to have the same shape as those of the semiconductor chips 13 and 19, and the total numbers of the temporary adhesion regions 72 and 76 are respectively equal to those of the chips 13 and 19. However, the invention is not limited to these. In other words, it is unnecessary that the temporary adhesion regions 72 and 76 are respectively patterned to have the same shape as those of the semiconductor chips 13 and 19. Any structure may be adopted if the chips 13 or 19 can be arranged with a desired layout by it. For example, a single temporary adhesion region formed in such a way as to cover the approximately entire surface of the carrier substrate 73 (or 76) may be used. Such the temporary adhesion region 72 (or 76) can be easily formed if a metal or insulative film or a stack of metal and insulative films is thinly deposited on the whole surface of the carrier substrate 73 and thereafter, an appropriate sticky material is thinly coated on the metal or insulative film or the stack of metal and insulative films, or if only an appropriate sticky material is thinly coated on the whole surface of the carrier substrate 73. In this case, there is an advantage that the step of patterning both the metal or insulative film or the stack of metal and insulative films, and the sticky material, or the step of patterning the sticky material is unnecessary.

Second Embodiment

Subsequently, a method of fabricating an integrated circuit device having a three-dimensional stacked structure according to a second embodiment of the invention will be explained be reference to FIGS. 6(a) to 7(e). FIGS. 6(a) to 7(e) are cross-sectional views showing the step of disposing the semiconductor chips that constitute the first semiconductor layer on the carrier substrate in the method of fabricating an integrated circuit device according to the second embodiment of the invention. The second embodiment is of the "transfer type" similar to the first embodiment.

Since the method of the second embodiment is based on the above-described basic concept of the invention with reference to FIGS. 1(a) to 3(j), the whole process steps of this method are the same as those shown in FIGS. 1(a) to 3(j). However, as shown in FIGS. 6(a) and 7(g), this method is characterized in that the step of fixing the semiconductor chips constituting each of the first to fourth semiconductor circuit layers L1 to L4 to the support substrate 11 or the first, second, or third semiconductor circuit layer L1, L2, or L3 (i.e., the semiconductor chip fixing step) is carried out by collective transfer of the semiconductor chips using a "carrier substrate" as a support member for transfer. This is the same as the aforementioned first embodiment except for the following.

Specifically, a "sticky material" is used for temporarily adhering the semiconductor chips on the corresponding temporary adhesion regions in the above-described first embodiment; unlike this, "water" is used for that in the second embodiment. In other words, the semiconductor chips are placed on the corresponding temporary adhesion regions in self-alignment utilizing the surface tension of water and thereafter, the chips are pressed against the corresponding temporary adhesion regions with a pressing plate, thereby temporarily adhering the respective chips to the corresponding temporary adhesion regions using an absorption force generated by the water remaining in the minute gaps between the temporary adhesion portions of the respective chips and the corresponding temporary adhesion regions. Since the other steps are the same as the aforementioned steps described in the explanation of the basic concept of the invention (see FIGS. 1(a) to 3(j)), the explanation about these steps is omitted here.

First, similar to the first embodiment, a carrier substrate 73a is prepared. The substrate 73a has an enough size for placement of the semiconductor chips 13 with a layout equivalent to a mirror image of a desired layout and an enough rigidity for withstanding the weight of the necessary number of the chips 13. As the carrier substrate 73a, for example, a glass substrate, a semiconductor wafer, or the like, which has enough rigidity, may be used.

Rectangular thin film-shaped temporary adhesion regions 72a, the total number of which is equal to the total number of the chips 13 (here, only the three regions 72a are shown), are formed on one surface of the carrier substrate 73a, as shown in FIG. 6(a). These temporary adhesion regions 72a, which are provided for temporarily holding all the chips 13 until they are transferred to the support substrate 11, has a hydrophilic property. The position of each temporary adhesion region 72a is set in such a way that the chips 13 are arranged with a layout equivalent to a mirror image of the desired layout on the mounting surface 11a of the support substrate 11. The size and shape of each temporary adhesion region 72a are approximately in accordance with the size and shape (here, rectangular shape) of the chip 13 (correctly speaking, a temporary adhesion portion 12b formed on the reverse of the chip 13) to be placed thereon, respectively. Accordingly, if the temporary adhesion portion 12b (i.e., the opposite end to the connecting portion 12) of each chip 13 is temporarily adhered to the corresponding temporary adhesion region 72a, the layout of the chips 13 will be a mirror image of the desired layout of the chips 13 on the support substrate 11.

In the aforementioned first embodiment, a "sticky material" with a sticky property is used as the material for temporarily adhering the chips 13. On the other hand, in the second embodiment, "water" is used as the material for temporarily adhering the chips 13 and therefore, the temporary adhesion regions 72a are formed to have a hydrophilic property. Such the temporary adhesion regions 72a can be easily realized by using, for example, a silicon dioxide ($SiO_2$) film with a hydrophilic property. Specifically, a $SiO_2$ film (which has a thickness of, for example, 0.1 μm) is formed on the entire mounting surface of the carrier substrate 73a by a known method and thereafter, the $SiO_2$ film is selectively removed by a known etching method. In this way, the temporary adhesion regions 72a with a hydrophilic property can be easily obtained. Since the temporary adhesion regions 72a have a hydrophilic property, if a small amount of water is placed on the temporary adhesion regions 72a, the water will conform to the whole surface of each region 72a (in other words, the whole surface of each region 72a will be wetted with the water), forming a water film 81 (i.e., a waterdrop) that covers the said surface entirely. The temporary adhesion regions 72a are island-shaped and apart from each other; therefore, the water will not flow to the outside from the respective regions 72a.

As the material usable for the temporary adhesion regions 72a with a hydrophilic property, $Si_3N_4$, a two-layer film (Al/$Al_2O_3$) of aluminum (Al) and alumina ($Al_2O_3$), and a two-layer film (Ta/$Ta_2O_5$) of tantalum (Ta) and tantalum oxide ($Ta_2O_5$) may be used in addition to $SiO_2$.

To further ensure the prevention of the flowing out of the water from the temporary adhesion regions 72a and the accumulation thereof, it is preferred that the mounting surface of the carrier substrate 73a is not hydrophilic. For example, it is preferred that the carrier substrate 73a itself is formed by single-crystal silicon (Si), fluoropolymer, silicone resin, Teflon resin, polyimide resin, resist, wax, BCB (benzocyclobutene), or the like, which has a hydrophobic property, or that the mounting surface of the carrier substrate 73a, on which the temporary adhesion regions 72a are formed, is covered with polycrystalline silicon, amorphous silicon, fluoropolymer, silicone resin, Teflon resin, polyimide resin, resist, wax, BCB, or the like.

Next, a small amount of water is dropped on the respective temporary adhesion regions 72a, or the carrier substrate 73a is dipped into water and taken out of it, thereby wetting the respective regions 72a with water. Since the temporary adhesion regions 72a are hydrophilic, the water spreads on the entire surface of each region 72a, resulting in a thin film 81 of the water covering the whole surface of each region 72a, as shown in FIG. 6(b). These water films 81 are naturally curved mildly convexly due to the surface tension. It is preferred that the amount of the water is adjusted, for example, in such a way that the water films 81 are formed on the respective temporary adhesion regions 72a, as shown in FIG. 6(b).

On the other hand, the temporary adhesion portions 12b with a hydrophilic property are formed on the reverses (the faces on the opposite side to the connecting portions 12) of the respective semiconductor chips 13 in advance. Such the temporary adhesion portions 12b can be easily realized by, for example, covering the whole reverse of each chip 13 with a $SiO_2$ film having a hydrophilic property. Then, a small amount of water is dropped on each temporary adhesion portion 12b, or each chip 13 is entirely dipped into water or only the temporary adhesion portion 12b of each chip 13 is dipped into water and taken out of it, thereby wetting each of the portions 12b with water. Since the temporary adhesion portions 12b are hydrophilic, the water spreads on the entire surface of each portion 12b, forming a film 81 of the water (i.e., a waterdrop) that covers entirely the surface of the portion 12b, as shown in FIG. 6(c). These water films 81 are naturally curved convexly due to the surface tension. It is preferred that the amount of the water is adjusted, for example, in such a way that the water films 81 are formed on the respective temporary adhesion portions 12b, as shown in FIG. 6(c). At this time, the water is not attached to the respective chips 13 except for their temporary adhesion portions 12b (their reverses). This is because hydrophobic single-crystal silicon is exposed except for the temporary adhesion portion 12b (the reverses) of each chip 13. If the connecting portion 12 of each chip 13 is covered with a $SiO_2$ film, water is attached to the connecting portion 12 too. However, no obstacle arises in the step of disposing the chips 13 on the carrier substrate 73a even if water exists on the connecting portion 12.

Next, the respective chips 13 where the water films 81 have been formed on the temporary adhesion portions 12b are placed over the corresponding temporary adhesion regions 72a on which the water films 81 have been formed. This step can be carried out using a known chip bonder. Then, the water film 81 on each temporary adhesion portions 12b is unified with the water film 81 on the corresponding temporary adhesion region 72a. At this time, it is not always necessary to position correctly the chip 13 on the corresponding temporary adhesion region 72a. This is because even if the position of the chip 13 is slightly deviated from the position of the corresponding temporary adhesion region 72a horizontally (i.e., in the direction parallel to the carrier substrate 73a), as shown in FIG. 6(d), the position of the chip 13 is automatically agreed with that of the corresponding temporary adhesion region 72a due to the action of the surface tension, as shown in FIG. 7(e). This is a different point from the first embodiment that necessitates the correct positioning of the chips 13 on the corresponding temporary adhesion regions 72.

Subsequently, as shown in FIG. 7(f), a flat surface of a pressing plate 180 having a sufficient rigidity is contacted with the connecting portions 12 of all the chips 13 and then, all the chips 13 are pressed toward the carrier substrate 73a. Then, the water existing between the temporary adhesion portions 12b of the respective chips 13 and the corresponding temporary adhesion regions 72a is pushed out and as a result, the temporary adhesion portions 12b are brought into intimate contact with the corresponding temporary adhesion regions 72a. In this state, the respective chips 13 are temporarily adhered by the absorption force induced by the very small quantity of the water remaining in the gaps between the temporary adhesion portions 12b and the corresponding temporary adhesion regions 72a in the said intimate contacting state. The state at this time is shown in FIG. 7(g).

The state of FIG. 7(g) is the same as that of the carrier substrate 73 of the first embodiment shown in FIG. 4(a). Therefore, following this, the carrier substrate 73a, on which all the necessary chips 13 have been temporarily adhered, is raised in a state parallel to the support substrate 11, where the carrier substrate 73a is held horizontally such that the mounting surface 11a is faced downward. Alternately, on the contrary, the support substrate 11 is lowered in a state parallel to the carrier substrate 73a on which all the necessary chips 13 have been temporarily adhered. Thus, the connecting portions 12 existing on the surfaces of the respective chips 13 are contacted with the corresponding connecting portions 71 on the support substrate 11 in a lump. Subsequently, the connecting portions 12 of the chips 13 are respectively fixed to the corresponding connecting portions 71 on the support substrate 11 by an appropriate method. (For example, the microbump electrodes are bonded with each other using bonding metals intervening between them, the microbump electrodes are bonded with each other by pressure welding without intervening bonding metals, or the microbump electrodes are bonded with each other by fusion welding without intervening bonding metals.) The state at this time is shown in FIG. 4(b), which is the same as that of FIG. 1(b).

After the fixing of the connecting portions 12 and 71 is completed, the carrier substrate 73a needs to be detached from the chips 13. In the said second embodiment, the chips 13 are temporarily adhered to the carrier substrate 73a utilizing the absorption force induced by the very small quantity of the water remaining in the gaps between the temporary adhesion portions 12b and the temporary adhesion regions 72a, and therefore, the said water evaporates naturally due to the heat applied during the step of fixing the connecting portions 12 of the chips 13 and the connecting portions 71. Accordingly, by applying a force in a direction separating the carrier substrate 73a from the chips 13 after the fixing of the connecting portions 12 and 71 is completed, the carrier substrate 73a and the chips 13 can be detached from each other easily. At this point, there is an advantage that the detaching operation of the carrier substrate 73a and the chips 13 is extremely easy compared with the first embodiment. If the heat is not applied in the fixing step of the connecting portions of the chips 13 and the connecting portions 71, the chips 13 and the carrier substrate 73a are heated to a low temperature (e.g., near 90° C. to 100° C.) prior to the fixing step, thereby evaporating the water.

After the fixing of the chips 13 to the mounting surface 11a of the support substrate 11 is completed in this way, the liquid or fluid adhesive 14 is placed in the gaps on the peripheries of the chips 13, as shown in FIG. 1(c), and then, the adhesive 14 is cured by applying heat, irradiating ultraviolet rays, or the like. Thereafter, in the same manner as the aforementioned one in the explanation about the basic concept of the invention, the first semiconductor circuit layer L1 is formed (see FIG. 1(d)).

Here, the step of collectively transferring the semiconductor chips 13 that have been temporarily adhered to the carrier substrate 73a to the mounting surface 11a of the support substrate 11 is explained. The step of collectively transferring the semiconductor chips 16, 19, or 20 that have been temporarily adhered to the carrier substrate 73a to the second, third, or fourth semiconductor circuit layer L2, L3, or L4 can be carried out in the same manner as that of the above-described step for the chips 13. Therefore, the explanation about them is omitted here.

With the method of fabricating an integrated circuit device having a three-dimensional stacked structure according to the second embodiment of the present invention, as explained above, first, the carrier substrate 73a (i.e., the support member for transfer) is prepared. The carrier substrate 73a comprises on its surface the temporary adhesion regions 72a for arranging the semiconductor chips 13 with a layout equivalent to a mirror image of the desired layout. Next, the temporary adhesion 12b of the chips 13, which are provided on the opposite side to the connecting portions 12, are temporarily adhered to the corresponding temporary adhesion regions 72a, thereby placing the chips 13 on the carrier substrate 73a. Further, by causing the carrier substrates 73a on which the chips 13 have been placed to approach the support substrate 11, the connecting portions 12 of the chips 13 on the carrier substrate 73a are brought into contact with the predetermined positions on the support substrate 11. Subsequently, by fixing the connecting portions 12 of the chips 13 to the predetermined positions of the support substrate 11, which have been brought into contact with each other, the chips 13 are fixed on the support substrate 11 to have the desired layout.

Moreover, the step of forming the temporary adhesion regions 72a on the carrier substrate 73a, the step of temporarily adhering the chips 13 to the temporary adhesion regions 72a, and the positioning in the step of contacting the connecting portions 12 of the chips 13 with the predetermined positions of the support substrate 11 can be carried out with desired accuracy, if known techniques that have been used in the fabrication processes of an integrated circuit device not having a three-dimensional stacked structure are utilized.

These points are applicable to the fixing of the semiconductor chips 16, 19, or 20 that constitute the second, third, or fourth semiconductor circuit layer L2, L3, or L4.

Accordingly, the many (e.g., several hundreds of) semiconductor chips 13, 16, 19, or 22 can be respectively fixed easily and efficiently with desired accuracy on the support substrate 11, or the first, second, or third semiconductor circuit layer L1, L2, or L3 in such a way as to form the desired layout.

As a result, if bump electrodes are used for electrical interconnection among the semiconductor chips 13, 16, 19, and 22, the bump electrodes that have been formed with a desired layout on the respective connecting surfaces of the chips 13, 16, 19, and 22 can be fixed correctly to the corresponding bump electrodes or to the corresponding connection areas of the wiring lines oppositely in a one-to-one correspondence.

Moreover, with the fabrication method according to the second embodiment, a hydrophilic property is given to the temporary adhesion regions 72a on the carrier substrate 73a and the temporary adhesion portions 12b of the semiconductor chips 13 in advance and then, the respective chips 13 are positioned at the corresponding temporary adhesion regions 72a in self-alignment utilizing the surface tension of the water attached to the temporary adhesion regions 72a and the temporary adhesion portions 12b. Therefore, the advantages that the necessary positioning accuracy in the fixing step of the chips 13 to the temporary adhesion regions 72a can be lowered, the preparation of such a material as the sticky material used in the first embodiment is unnecessary, and the remaining water can be removed easily occur, in addition to the above-described advantages.

In the aforementioned second embodiment, the water films 81 are formed on both the temporary adhesion regions 72a of the carrier substrate 73a and the temporary adhesion portions 12b of the semiconductor chips 13. However, the invention is not limited to this. Needless to say, the water films 81 may be formed on either the temporary adhesion regions 72a or the temporary adhesion portions 12b.

As the "water" used in the aforementioned second embodiment, "ultrapure water" that has been generally used in the fabrication processes of semiconductor devices is preferred. However, it is more preferred that "ultrapure water" containing an additive for enhancing the self-aligning function to the semiconductor chips is used as the "water". This is because the positional accuracy of the chips due to the self-alignment is enhanced. As the additive for such the surface tension enhancement, for example, hydrofluoric acid (water solution of hydrofluoric acid) may be used. Ammonium fluoride may be also used for this purpose. As the material having a "hydrophilic property", the above-described $SiO_2$ is preferably used.

Other inorganic or organic liquid may be used instead of the "water". For example, glycerin, acetone, alcohol, a SOG (Spin-On-Glass) material, or the like is preferably used. In this case, a material having a "lyophilic property" for such the liquid as described here is necessary to form the temporary adhesion regions and the temporary adhesion portions. For example, silicon nitride ($Si_3N_4$), various metals, thiol, or alkanethiol or the like may be used for such the material.

Third Embodiment

Next, a method of fabricating an integrated circuit device having a three-dimensional stacked structure according to a third embodiment of the invention will be explained below with reference to FIGS. 8(a) to 10(e).

This method is also based on the above-described basic concept of the invention with reference to FIGS. 1(a) to 3(j), where the "connecting portion" cited in the explanation of the basic concept is realized by microbump electrodes as an example of the conductive contacts. Therefore, the steps shown in FIGS. 8(a) to 10(e) are substantially the same as those shown in FIGS. 1 to 3. However, as shown in FIGS. 11(a) to 13(b), this method is characterized in that the step of fixing the semiconductor chips constituting each of the first to third semiconductor circuit layers to the support substrate 11 or the first or second semiconductor circuit layer (i.e., the semiconductor chip fixing step) is carried out by collective transfer of the semiconductor chips using a "carrier substrate" as a support member for transfer. This is the same as the aforementioned first and second embodiments. The third embodiment is of the "transfer type" also.

FIGS. 8(a) to 10(e) are cross-sectional views showing the steps of the method of fabricating an integrated circuit device having a three-dimensional stacked structure according to the third embodiment of the invention. FIGS. 11(a) and 11(b) are cross-sectional views showing in detail the step of fixing the semiconductor chips constituting the first semiconductor circuit layer at the predetermined positions on the support substrate in the said fabrication method. FIGS. 12(a) and 13(b) are cross-sectional views showing in detail the step of fixing the semiconductor chips constituting the third semiconductor circuit layer at the predetermined positions on the second semiconductor circuit layer in the said fabrication method.

The conductive plugs, buried interconnections, and microbump electrodes shown in FIGS. 8(a) to 10(e) are enlarged and exaggerated for easier understanding. Thus, the actual sizes of them are far smaller than that of the semiconductor chips.

In the fabrication method of the third embodiment, the following steps are carried out sequentially.

Specifically, first, as shown in FIG. 8(a), a support substrate 31 having a desired rigidity is prepared and then, a plurality of sets of wiring lines 33 are formed corresponding to respective semiconductor chips (chip-shaped semiconductor circuits) 37 to be fixed on the mounting surface (lower surface) of the substrate 31. An insulating layer 32 is formed on the mounting surface of the substrate 31 to cover all the wiring lines 33. Through holes that reach the respective sets of wiring lines 33 are formed at the predetermined positions of the insulating layer 32 by a known etching method. Thereafter, a conductive layer (not shown) is formed in such a way as to cover the insulating layer 32 and to fill the through holes and then, the conductive layer thus formed is polished by the CMP method until the insulating layer 32 is exposed. As a result, the conductive layer embedded in the through holes is selectively left to form conductive plugs 34. The conductive plugs 34 and the wiring lines 33 constitute the buried interconnections of the support substrate 31. In this way, as shown in FIG. 8(a), the insulating layer 32, into which the sets of the buried interconnections comprising the wiring lines 33 and the conductive plugs 34 are embedded and the surface of which is planarized, is obtained.

As the supporting substrate 31, for example, glass, single-crystal Si wafer (integrated circuits are formed or not formed in its surface area), or the like may be preferably used. However, a member made of any other material than those may be used if it has a desired rigidity. As the insulating layer 32, an insulating layer made of silicon dioxide ($SiO_2$) or the like may be used. As the wiring lines 33 and the conductive plugs 34, various conductive materials such as polysilicon, tungsten, copper, aluminum, or the like may be used.

Next, to realize the mechanical and electrical connection to the semiconductor chips 37 to be explained later, microbump electrodes 35 are formed on the planarized surface of the insulating layer 32. As the method of forming the electrodes 35, any known method may be used. For example, an appropriate conductive layer is formed on the surface of the insulating layer 32 and then, the conductive layer is selectively removed by photolithography and etching, thereby leaving only the necessary parts of the conductive layer. As shown in FIG. 8(a), one end (an upper end in FIG. 8(a)) of each electrode 35 is contacted with a corresponding one of the conductive plugs 34 embedded in the insulating layer 32. Here, all the electrodes 35 have the same shape (for example, rectangular or circular) and the same size; however, it is needless to say that at least one of the shape and size of the electrode 35 may be different from each other as necessary.

The microbump electrodes 35 formed on the surface of the insulating layer 32 are segmented into the plurality of sets, as shown in FIG. 8(a). Each set of the electrodes 35 constitutes a connecting portion R1 for a semiconductor chip 37 (which will be explained later). These chips 37 are used to form the first semiconductor circuit layer L1. The connecting portion R1 corresponds to the connecting portion 71 shown in FIGS. 4(a) to 5(b).

On the other hand, the semiconductor chips 37 are prepared, each of which comprises exposed microbump electrodes 36 formed at predetermined positions on its surface (the upper face in FIG. 8(a)). The electrodes 36 are then contacted with the microbump electrodes 35 on the support substrate 31 in their opposed state in a one-to-one correspondence. The whole stacked structure including the substrate 31 and the chips 37 is heated to a predetermined temperature while appropriately applying a pressing force toward the substrate 31 to the chips 37. After a predetermined time passes, the said structure is cooled to room temperature. Thus, the electrodes 36 on each chip 37 are bonded to the opposing electrodes 35 on the substrate 31. As a result, the mechanical and electrical connection between the chips 37 and the buried interconnections on the substrate 31 are simultaneously accomplished, where the chips 37 are fixed at the predetermined positions on the substrate 31. The state at this time is shown in FIG. 8(a).

One set of the microbump electrodes 36 formed on each chip 37 constitutes a connecting portion R2 for the said chip 37. The connecting portion R2 corresponds to the connecting portion 12 on the chip 12 shown in FIGS. 1(a) to 3(j) and FIGS. 4(a) to 5(b).

The chips 37 may be fixed to the support substrate 31 by canceling the electrodes 35 (i.e., the connecting portion R1) on the supporting substrate 31 and directly contacting the electrodes 36 (i.e., the connecting portion R2) on the chips 37 with the surface of the insulating layer 32. In this case, heating and cooling is carried out in the same way as explained above, thereby bonding the electrodes 36 on the chips 37 to the corresponding plugs 34 embedded in the insulating layer 32 on the substrate 31. In this way, the mechanical and electrical connection between the chips 37 and the buried interconnections on the substrate 31 are accomplished simultaneously.

Here, the step of contacting the electrodes 36 on the chips 37 with the corresponding electrodes 35 on the support substrate 31 in their opposed state in a one-to-one correspondence is explained in detail with reference to FIGS. 23 to 26.

First, as shown in FIG. 23, thin film-shaped bonding metals 120 (preferably, the thickness is approximately 0.2 μm) are formed on the end face of each electrode 35 on the support substrate 31 and the end face of the opposing electrode 36 thereto on the chip 37, respectively. The formation of the bonding metals 120 on the electrodes 36 may be carried out by any method. For example, the method of selectively forming the thin film-shaped metals 120 directly on the opposing end faces of the electrodes 35 or 36 by a known plating method may be preferably used for this purpose.

As the conductive material for the electrodes 35 and 36, for example, a two-layer structure (In/Au) of indium (In) and gold (Au), a two-layer structure (Sn/Ag) of tin (Sn) and silver (Ag), a single-layer structure of copper (Cu), or a single-layer structure of tungsten (W) may be preferably used. In the case of the two-layer structure of (In/Au), it is preferred that the In layer is placed as the lower layer 36a and the Au layer is placed as the upper layer 36b, as shown in FIG. 29. In the case of the two-layer structure of (Sn/Ag), it is preferred that the Sn layer is placed as the lower layer 36a and the Ag layer is placed as the upper layer 36b. This is similarly applicable to the electrode 35. In the case of the single-layer structure of Cu or W, it is usual that the whole electrode 35 or 36 is formed by Cu or W.

As the bonding metal 120, for example, In, Au, an indium-gold alloy (In—Au), or a gold-tin alloy (Au—Sn) is preferably used.

Subsequently, the chips 37 are lifted in such a way that the bonding metals 120 formed on the electrodes 36 are opposed to and contacted with the bonding metals 120 formed on the electrodes 35 of the support substrate 31. The state at this time is shown in FIG. 24. Thereafter, while applying an upward pressing force to the chips 37, the whole stacked structure including the substrate 31 and the chips 37 is heated from room temperature to a temperature (for example, 200° C.) where the metals 120 melt. After a predetermined time passes, it is cooled to room temperature.

In this way, the bonding metals 120 are temporarily melted and then, re-solidified (where the electrodes 35 and 36 are not melted at this time). Therefore, the electrodes 36 on each chip 37 are bonded to the opposing electrodes 35 on the support substrate 31 with the metals 120. As a result, the mechanical and electrical connection between the chips 37 and the buried interconnections on the substrate 31 are accomplished simultaneously by the metals 120 thus re-solidified, as shown in FIG. 25.

The re-solidified bonding metals 120 spread to the entirety of the electrodes 35 and 36 and thus, the resultant metals 120 are thinner than before melting (for example, to approximately 0.1 μm in thickness), as clearly shown in FIG. 25. Alternately, the metals 120 diffuse into the inside of the electrodes 35 and 36 to disappear and thus, the resultant electrodes 35 and 36 are directly contacted with each other, as shown in FIG. 26.

The electrodes 35 and 36 may be directly bonded to each other without placing the bonding metals 120 between the electrodes 35 and 36. In this case, the electrodes 35 and 36 are bonded to each other by strongly pressing the electrodes 36 to the corresponding electrodes 35 at room temperature or under heat, thereby causing local deformation in the respective electrodes 35 and 36. This means that the electrodes 35 and 36 are bonded to each other due to "pressure welding". The bonded state is shown in FIG. 26. In addition, whether the pressure welding is carried out at room temperature or under heat is selected in accordance with the conductive material used for forming the electrodes 35 and 36.

Alternately, without placing the bonding metals 120 between the electrodes 35 and 36, the electrodes 35 and 36 may be unified together by melting them under heat. In other words, the electrodes 35 and 36 may be bonded to each other by "fusion welding". In this case also, the bonded state shown in FIG. 26 is formed.

As shown in FIG. 23, the side or diameter W of the electrodes 35 and 36 is usually 50 μm or less, and a typical value is approximately 5 μm. The height H of the electrodes 35 and 36 is usually 20 μm or less, and a typical value is approximately 2 μm. Usually, the side or diameter of the conductive material 52 that forms the buried interconnections is less than that of the electrodes 35 and 36. The side or diameter of the conductive plugs 34 is usually less than that of the electrodes 35 and 36. On the other hand, the size of the chips 37 is usually in the range of several millimeters to twenty and several millimeters. The thickness of the chips 37 is usually in the range of 200 µm to 1000 µm. It is usual that several tens to several hundred thousand electrodes 36 are formed on one of the chips 37.

Here, in order to facilitate the fabrication, all the microbump electrodes 36 on the semiconductor chips 37 are the same in shape (e.g., rectangular or circular) and size as the microbump electrodes 35 on the support substrate 31. However, if bonding to the electrodes 35 is possible, it is needless to say that the shape and/or size of the electrodes 36 may be different from those/that of the electrodes 35 according to the necessity.

Here, the bonding metals 120 are placed on both of the electrodes 35 and the electrodes 36. However, the bonding metals 120 may be placed on either the electrodes 35 or the electrodes 36.

The semiconductor chips 37 comprising the electrodes 36 (or, comprising the electrodes 36 and the bonding metals 120) may be sequentially fixed to the respective sets of the electrodes 35 on the support substrate 31 one by one with a known high-speed chip bonder. Alternately, a necessary number of the chips 37 comprising the electrodes 36 (or, comprising the electrodes 36 and the bonding metals 120) may be arranged on a support member for transfer (not shown) to have a predetermined layout in advance. Thereafter, all the chips 37 may be fixed to the substrate 31 in a lump using the said support member. The latter is adopted in the said third embodiment.

Specifically, in the step of fixing the electrodes 36 on the chips 37 to the corresponding electrodes 35 on the support substrate 31 oppositely in a one-to-one correspondence, similar to the aforementioned second embodiment, all the chips 37 are temporarily adhered onto the carrier substrate serving as the support member for transfer using water (concretely speaking, for example, water that contains or does not contain an additive for surface tension enhancement). Thereafter, all the chips 37 are collectively fixed to the substrate 31 in their opposed state. This step will be explained in detail below with reference to FIGS. 11(a) and 11(b).

First, as shown in FIG. 11(a), similar to the aforementioned first embodiment, a carrier substrate 93 is prepared. The substrate 93 has an enough size for placement of all the semiconductor chips 37 with a desired layout and an enough rigidity for withstanding the weight of the necessary number of the chips 37. As the carrier substrate 93, for example, a glass substrate, a semiconductor wafer, or the like, which has enough rigidity, may be used.

Rectangular thin film-shaped temporary adhesion regions 92, the total number of which is equal to the total number of the chips 37 (here, only the three regions 92 are shown), are formed on one surface of the carrier substrate 93, as shown in FIG. 11(a). These temporary adhesion regions 92, which are provided for temporarily holding all the chips 37 until they are transferred and fixed to the support substrate 31, has a hydrophilic property. The position of each temporary adhesion region 92 is set in such a way that the chips 37 are arranged with a layout equivalent to a mirror image of the desired layout on the mounting surface of the support substrate 31. The size and shape of each temporary adhesion region 92 are approximately in accordance with the size and shape (here, rectangular shape) of the chip 37 (correctly speaking, a temporary adhesion portion 37a formed on the reverse of the chip 37) to be placed thereon, respectively. Accordingly, if the temporary adhesion portion 37a (i.e., the opposite end to the connecting portion R2) of each chip 37 is temporarily adhered to the corresponding temporary adhesion region 37a, the layout of the chips 37 will be a mirror image of the desired layout of the chips 37 on the support substrate 31.

In the said third embodiment, similar to the second embodiment, "water" is used as the material for temporarily adhering the chips 37 and therefore, the temporary adhesion regions 92 are formed to have a hydrophilic property. Such the temporary adhesion regions 92 can be easily realized by using, for example, a $SiO_2$ film with a hydrophilic property. Specifically, a $SiO_2$ film (which has a thickness of, for example, 0.1 µm) is formed on the entire mounting surface of the carrier substrate 93 by a known method and thereafter, the $SiO_2$ film is selectively removed by a known etching method. In this way, the temporary adhesion regions 92 with a hydrophilic property can be easily obtained. Since the temporary adhesion regions 92 have a hydrophilic property, if a small amount of water is placed on the temporary adhesion regions 92, the water will conform to the whole surface of each region 92 (in other words, the whole surface of each region 92 will be wetted with the water), forming a water film 191 (i.e., a waterdrop) that covers the said surface entirely. The temporary adhesion regions 92 are island-shaped and apart from each other; therefore, the water will not flow to the outside from the regions 92.

As the material usable for the temporary adhesion regions 92a with a hydrophilic property, $Si_3N_4$ may be used in addition to $SiO_2$. A two-layer film ($Al/Al_2O_3$) of aluminum and alumina, and a two-layer film ($Ta/Ta_2O_5$) of tantalum and tantalum oxide may be also used for this purpose.

To further ensure the prevention of the flowing out of the water from the temporary adhesion regions 92 and the accumulation thereof, it is preferred that the mounting surface of the carrier substrate 93 is not hydrophilic. For example, it is preferred that the carrier substrate 93 itself is formed by single-crystal silicon (Si), fluoropolymer, silicone resin, Teflon resin, polyimide resin, resist, wax, BCB, or the like, which has a hydrophobic property, or that the mounting surface of the carrier substrate 93 is covered with polycrystalline silicon, amorphous silicon, fluoropolymer, silicone resin, Teflon resin, polyimide resin, resist, wax, BCB, or the like.

Next, a small amount of water is dropped on the respective temporary adhesion regions 92, or the carrier substrate 93 is dipped into water and taken out of it, thereby wetting the respective regions 92 with water. Since the temporary adhesion regions 92 are hydrophilic, the water spreads on the whole surface of each region 92, resulting in a thin film 101 of the water covering the whole surface of each region 92, as shown in FIG. 11(a). These water films 101 are naturally curved mildly convexly due to the surface tension. It is preferred that the amount of the water is adjusted, for example, in such a way that the water films 101 are formed on the respective temporary adhesion regions 92, as shown in FIG. 11(a).

On the other hand, the temporary adhesion portions 37a with a hydrophilic property are formed on the reverses (the faces on the opposite side to the connecting portions R2) of the respective semiconductor chips 37 in advance. Such the temporary adhesion portions 37a can be easily realized by, for example, covering the whole reverse of each chip 37 with a $SiO_2$ film having a hydrophilic property. Then, a small amount of water is dropped on each temporary adhesion portion 37a, or each chip 37 is entirely dipped into water or only the temporary adhesion portion 37a of each chip 37 is dipped into water and taken out of it, thereby wetting each of the portions 37a with water. Since the temporary adhesion portions 37a are hydrophilic, the water spreads on the entire surface of each portion 37a, forming a thin film 101 of the water that covers entirely the surface of each portion 37a, as shown in FIG. 11(a). These water films 101 are naturally curved mildly convexly due to the surface tension. It is preferred that the amount of the water is adjusted, for example, in such a way that the water films 101 are formed on the respective temporary adhesion portions 37a, as shown in FIG. 11(a). At this time, the water is not attached to the respective chips 37 except for their reverses. This is because hydrophobic single-crystal silicon is exposed except for the reverses of the chips 37. This is because hydrophobic single-crystal silicon is exposed except for the temporary adhesion portions 37a (reverses) of the respective chips 37. If the connecting portion R2 of each chip 37 is covered with a $SiO_2$ film, water is attached to the connecting portion R2 also. However, no obstacle arises in the step of disposing the chips 37 on the carrier substrate 93 even if water exists on the connecting portion R2.

Next, the respective chips 37 where the water films 101 have been formed on the lower surfaces of the temporary adhesion portions 37a are respectively placed on the corresponding temporary adhesion regions 92 on which the water films 101 have been formed. This step can be carried out using a known chip bonder. Then, the water film 101 on each temporary adhesion portion 37a is coupled and unified with the water film 101 on the corresponding temporary adhesion region 92. At this time, it is not always necessary to position correctly each chip 37 on the corresponding temporary adhesion region 92. This is because even if the position of the chip 37 is slightly deviated from the position of the corresponding temporary adhesion region 92 horizontally (i.e., in the direction parallel to the carrier substrate 93) (see FIG. 6(d), the position of the chip 37 automatically agrees with that of the corresponding temporary adhesion region 92 due to the action of the surface tension (see FIG. 7(e)).

Subsequently, a pressing plate (not shown) with a sufficient rigidity is contacted with the connecting portions R2 of all the chips 37 and then, all the chips 13 are pressed toward the carrier substrate 93. Then, the water existing between the temporary adhesion portions 37a of the respective chips 37 and the corresponding temporary adhesion regions 92 is pushed out and as a result, the temporary adhesion portions 37a are brought into intimate contact with the corresponding temporary adhesion regions 92. In this state, the respective chips 37 are temporarily adhered in the said intimate contacting state by the absorption force induced by the very small quantity of the water remaining in the gaps between the temporary adhesion portions 37a and the corresponding temporary adhesion regions 92. The state at this time is shown in FIG. 11(b).

The state of FIG. 11(b) is the same as that of FIG. 4(a) in the first embodiment. Therefore, following this, the carrier substrate 93, on which all the necessary chips 37 have been temporarily adhered, is raised in a state parallel to the support substrate 31, where the carrier substrate 93 is held horizontally in such a way that the mounting surface is faced downward. Alternately, on the contrary, the support substrate 31 is lowered in a state parallel to the carrier substrate 93 on which all the necessary chips 37 have been temporarily adhered. Thus, the connecting portions R2 existing on the surfaces of the respective chips 37 are contacted with the corresponding connecting portions R1 on the support substrate 31 in a lump. Subsequently, the connecting portions R2 of the chips 37 are respectively fixed to the corresponding connecting portions R1 on the support substrate 31 by an appropriate method. (For example, the microbump electrodes 35 and 36 are bonded with each other using the bonding metals 120 intervening between them, the microbump electrodes 35 and 36 are bonded with each other by pressure welding without intervening the bonding metals 120, or the microbump electrodes 35 and 36 are bonded with each other by fusion welding without the intervening bonding metals 120.) The state at this time is shown in FIG. 4(b), which is the same as that of FIG. 1(b).

After the fixing of the connecting portions R2 and R1 is completed, the carrier substrate 93 needs to be detached from the chips 37. In the third embodiment, the chips 37 are temporarily adhered to the carrier substrate 93 utilizing the absorption force induced by the very small quantity of the water remaining in the gaps between the temporary adhesion portions 37a and the corresponding temporary adhesion regions 92. The said water evaporates naturally due to the heat applied in the step of fixing the connecting portions R2 of the chips 37 and the connecting portions R1. Accordingly, by applying a force in a direction separating the carrier substrate 93 from the chips 37 after the fixing of the connecting portions R2 and R1 is completed, the carrier substrate 93 and the chips 37 can be detached from each other easily. At this point, there is an advantage that the detaching operation of the carrier substrate 93 and the chips 37 is extremely easy compared with the first embodiment.

In the fixing step of the electrodes 35 and 36, the electrodes 35 and 36 may be bonded to each other by "pressure welding" at room temperature. In this case, it is preferred that prior to the fixing step, the electrodes 35 and 36 are heated to a low temperature (e.g., near 90° C. to 100° C.) at which the electrodes 35 and 36 do not melt, thereby evaporating the water existing between the temporary adhesion portions 37a and the temporary adhesion regions 92.

In FIGS. 11(a) and 11(b), the chips 37 are placed on the carrier substrate 93 that has been faced upward and thereafter, the chips 37 are collectively transferred and fixed to the mounting surface of the substrate 93 faced downward. However, the said third embodiment is not limited to this. The chips 37 may be temporarily adhered to the lower surface of the carrier substrate 93 faced downward and thereafter, the chips 37 may be collectively transferred and fixed to the mounting surface of the substrate 31 faced upward. In summary, it is sufficient that the chips 37 can be collectively transferred to the mounting surface of the support substrate 31.

When the chips 37 are fixed to the support substrate 31 using the electrodes 35 and 36 in the above-described way, the semiconductor integrated circuit (the semiconductor solid-state circuits) C formed in the surface area (the surface area at the side of the electrode 35) of each chip 37 in such a way as not to overlap with the electrodes 36 is electrically connected to the corresponding buried interconnections of the substrate 31 by way of the corresponding electrodes 35 and 36. This is because the electrodes 36 on each chip 37 are formed to function as the external connection terminals for connecting the integrated circuit C in the said chip 37 to an external circuit.

In each of the chips 37 fixed in the above-described way, buried interconnections are formed in its inside in advance, where the buried interconnections are electrically connected to the electrodes 36 formed on the surface (the upper face in FIG. 8(a)) of the said chip 37. These buried interconnections (each of which is formed by a conductive material 52 surrounded by an insulating layer 51) are used to make electrical connection (i.e., inter-chip connection) between the integrated circuit C in the said chip 37 and the integrated circuit in a semiconductor chip 43 to be superposed on the said chip 37 in a later step. The said buried interconnections have been formed in the following way.

Specifically, first, a trench with a predetermined depth is formed on the surface of the chip 37, on which the electrodes 36 are to be formed, by a known method. The depth of the trench needs to be larger than the resultant thickness (height) of the chip 37 that is to be left at the completion of the next semiconductor-chip polishing step. Next, the inner side faces and the inner bottom face of the trench are covered with the insulating layer (e.g., $SiO_2$) 51 by a known method. Thereafter, by a known method, the trench covered with the insulating layer 51 is filled with the conductive material 52 (e.g., polysilicon, tungsten, or copper) and the surface of the chip 37 is planarized. The electrode 36, which is located on the open end of the buried interconnection (i.e., the conductive material 52) thus formed, is connected electrically and mechanically to the opened face of the buried interconnection (i.e., the conductive material 52). In this way, the buried interconnection (i.e., the conductive material 52) can be exposed from the reverse (the lower surface in FIG. 8(a)) of the chip 37 when the next semiconductor-chip polishing step is completed (see FIG. 9(c)).

The methods of forming the buried interconnection (i.e., the conductive material 52) and the electrode 36 of the chip 37 are not limited to the methods explained here. Any other method may be used if the buried interconnection (i.e., the conductive material) 52 and the electrode 36 each having the structure shown in FIG. 8(a) can be formed.

If the chip 37 is a so-called "dummy chip", i.e., a semiconductor chip having the same (or different) external form as a KGD and no inner circuit, or a semiconductor chip having the same (or different) external form as a KGD and inner circuits unused, the buried interconnection (the conductive material) 52 is used for electrical connection between the wiring lines 33 on the support substrate 31 and the integrated circuit in a chip 43 to be superposed on the chip 37.

When the fixing of the chips 37 to the support substrate 31 is finished, an adhesive filling step is carried out subsequently. In this step, as shown in FIG. 8(b), the gaps between the substrate 31 and the chips 37 and the gaps among the chips 37 are filled with a liquid or fluid adhesive 38 having an electrical insulative property by an appropriate method. Then, the adhesive 38 is cured by applying heat, irradiating ultraviolet rays, or the like. Since the height H of the electrodes 35 and 36 are usually 20 μm or less (typically, approximately 2 μm), the gaps between the substrate 31 and the chips 37 are usually 40 μm or less (typically, approximately 4 μm). The size of the gaps among the chips 37 is, for example, several micrometers to several hundreds micrometers, which varies according to the layout of the wiring lines 33 on the substrate 31 and/or the layout of other semiconductor chips, or the like.

It is preferred that the adhesive 38 used in the adhesive filling step is an adhesive made of synthetic resin having an electrically insulative property and a curing property where the resin is cured due to heat, ultraviolet rays, or the like. This is because the substrate 31 and the chips 37 need to be electrically insulated from each other and the adjoining chips 37 need to be electrically insulated from each other by the adhesive 38, and because the cured adhesive 38 forms part of the package of the said integrated circuit device. At this time, the thickness of the cured layer of the adhesive 38 formed on the insulating layer 32 of the substrate 31 needs not amount to the overall height of the chips 37. The thickness of the cured layer of the adhesive 38 is set in such a way that the said gaps (which include the bonding metals 120 and the microbump electrodes 35 and 36) are completely filled with the adhesive 38 when the chips 37 are thinned by polishing in the next semiconductor-chip polishing step, and that the cured layer of the adhesive 38 is slightly thicker than the post-polishing height of the chips 37. At the same time, the thickness of the cured layer of the adhesive 38 is set such that the gaps among the chips 37 are also filled with the adhesive 38.

As the adhesive 38 applicable to the adhesive filling step, for example, epoxy resin, bismaleid resin, cyana resin, polyimide resin, BCB, or the like may be used. In these adhesives, epoxy resin is particularly preferred for this purpose. This is because epoxy resin is inexpensive, easy to be handled, and high in chemical stability.

Here, as the adhesive filling method, the method where the support substrate 31 is turned upside down so that the insulating layer 32 is faced upward and then, the liquid adhesive 38 is sprayed (i.e., a spraying method) is used. Thus, the adhesive 38 is placed not only in the said gaps but also on the reverses of the chips 37, as shown in FIG. 8(b). Since the adhesive 38 placed on the reverses of the chips 37 is automatically removed in the subsequent semiconductor-chip polishing process, no obstacle will occur.

The "spraying method" is a method that the substrate 31 is turned upside down so that the insulating layer 32 is faced upward and then, the liquid adhesive 38 is sprayed from the upper side with a known sprayer in the atmosphere or in an appropriate container. However, the invention is not limited to this method. The liquid adhesive 38 may be sprayed upward from the lower side without turning the substrate 31 upside down. Moreover, the substrate 31 may be put into a sideways position and the liquid adhesive 38 may be sprayed horizontally. The "spraying method" is one of the simplest ways and has an advantage that the adhesive filling step can be easily performed at low cost.

As a simple way to perform the adhesive filling step, a "coating method" where a liquid or fluid adhesive having an electrically insulation property is coated on desired positions may be used. This "coating method" is a method where a liquid or fluid adhesive having an electrically insulation property is coated on desired positions. For example, the support substrate 31 on which the chips 37 have been fixed is placed upward on a rotating plate structured to be rotatable in a horizontal plane and then, a liquid or fluid adhesive is placed on the substrate 31. Subsequently, the rotating plate is rotated, thereby expanding the adhesive to the whole surface of the substrate 31 due to centrifugal force. This is termed the "spin coating method". In this case, there is an advantage that the film of the adhesive coated on the whole surface of the substrate 31 has an approximately uniform thickness automatically.

Further, as another method of performing the adhesive filling step, a "vacuum injection method" that a liquid or fluid adhesive having an electrical insulation property is injected into the desired positions in a vacuum chamber may be used. In this "vacuum injection method", first, the liquid or fluid adhesive is stored in the container provided in the vacuum chamber. Next, the support substrate 31 on which the chips 37 have been fixed (i.e., the structure shown in FIG. 8(a)) is placed into the chamber and then, the inside of the chamber is evacuated to remove the air accumulated in the gaps in the said structure. Then, the said structure is dipped into the liquid or fluid adhesive stored in the container while the vacuum state is kept unchanged, thereby filling the gaps of the said structure with the adhesive 37. Thereafter, the atmospheric air is introduced into the vacuum chamber to break the vacuum atmosphere. Due to the atmospheric pressure thus introduced into the chamber, the adhesive is pressed into the gaps of the said structure. The "vacuum injection method" has an advantage that the whole gaps of the said structure can be filled with the adhesive efficiently and surely.

Next, the reverses (here, the lower surfaces) of all the semiconductor chips 37 fixed to the support substrate 31 in the above-described way are polished in a lump by the mechanical polishing method and the CMP method (the semiconductor-chip polishing step). This step is carried out in such a way that the reverses of the respective chips 37 are located in the same plane as that of the cured layer of the adhesive 38 existing among the chips 37, as shown in FIG. 9(c). In practice, preferably, the endpoint of the CMP process, which is carried out after the mechanical polishing process, is set at the time when the cured layer of the adhesive 38 among the chips 38 is slightly polished, thereby planarizing the surface of the cured layer of the adhesive 38 simultaneously with the polishing of the lower surfaces of the respective chips 37. Due to this CMP process, the conductive materials 52 are exposed from the reverses of the respective chips 37. In this way, the conductive materials 52 become the buried interconnections. In this state, the conductive materials (buried interconnections) 52 penetrate through the chips 37 vertically (in a direction perpendicular to the support substrate 31).

The resultant thickness of the chip 37 after the polishing in the CMP process is not limited; it may be set at any value according to the necessity. Since the initial thickness of the chip 37 is usually 200 μm to 1000 μm, the resultant thickness of the chip 37 after the CMP process is usually several micrometers to several hundred micrometers.

Even if the lower surface of each chip 37 is polished in the said CMP process, no obstacle about the operation of the chip 37 will occur. This is because the integrated circuit C incorporated in the chip 37 is formed only in the surface area of the said chip 37 at an extremely small depth and therefore, the remaining part of the chip 37 is unconcerned about the circuit operation. Moreover, needless to say, the positions of the conductive materials (the buried interconnections) 52 in the chip 37 are determined in such a way as not to overlap with the integrated circuit C in the said chip 37. This is to prevent the formation of the buried interconnections 52 from affecting the operation of the circuit C.

Through the above-described steps, as shown in FIG. 9(c), the first semiconductor circuit layer L1, which is formed by the chips 37 and the cured adhesive 38 located among the chips 37 and on the peripheries thereof, is formed on the surface of the insulating layer 32 of the support substrate 31. Each chip 37 is fixed to the insulating layer 32 with the connecting portions R1 on the substrate 31 and the connecting portions R2 on the said chip 37 and at the same time, is adhered to the insulating layer 32 with the adhesive 38. Therefore, it may be said that the first semiconductor circuit layer L1 is fixed to the mounting surface with the connecting portions R1 and R2 and the adhesive 38. Since the mechanical connection of each chip 37 to the insulating layer 32 is performed by not only the connecting portions R1 and R2 but also the cured adhesive 38, sufficient fixing strength is obtained.

Next, on the first semiconductor circuit layer L1 formed described above, semiconductor chips 43 are superposed in approximately the same way as above, thereby forming the second semiconductor circuit layer L2.

Specifically, as shown in FIG. 9(d), an insulating layer 39 is formed to cover the surface of the cured layer of the adhesive 38 and the whole reverses of the chips 37 exposed therefrom. This insulating layer 39 is provided to electrically insulate the chips 37 of the first semiconductor circuit layer L1 from the chips 43 of the second semiconductor circuit layer L2. Next, through holes reaching the respective conductive materials (buried interconnections) 52 of the chips 37 are formed at the predetermined positions of the insulating layer 39 by an appropriate etching method. These through holes are usually formed at the positions overlapped entirely or partially with the corresponding buried interconnections 52 of the chips 37. This is because the chips 37 of the first semiconductor circuit layer L1 can be directly connected to the chips 43 of the second semiconductor circuit layer L2 and because the process is the simplest. However, the invention is not limited to this. For example, by additionally forming a wiring layer below the insulating layer 39, the electrodes 41 may be formed at the positions not to be overlapped with the conductive materials (buried interconnections) 52 of the chips 37. It is sufficient for the invention that the chips 37 of the first semiconductor circuit layer L1 and the chips 43 of the second semiconductor circuit layer L2 stacked thereon are electrically interconnected. The invention is not limited to the concrete interconnection methods disclosed in this specification.

Subsequently, an appropriate conductive layer (not shown) is formed to cover the insulating layer 39, thereby filling the through holes with the said conductive layer. Then, by polishing the conductive layer by the CMP method until the surface of the insulating layer 39 is exposed, the exposed parts of the conductive layer from the insulating layer 39 are selectively removed. In this way, the conductive layer is left in the through holes, resulting in conductive plugs 40.

Through the above-described steps, as shown in FIG. 9(d), the insulating layer 39 is obtained, where a plurality of sets of the conductive plugs 40 are embedded and the surface of the insulating layer 39 is planarized.

Next, a plurality of sets of microbump electrodes 41 are formed on the planarized surface of the insulating layer 39. Since the method of forming the electrodes 41 is the same as that for the microbump electrodes 35 formed on the surface of the insulating layer 32 of the support substrate 31, the explanation for the said method is omitted. Each electrode 41 is located at a position where the electrode 41 is in contact with a corresponding one of the conductive plugs 40 embedded in the insulating layer 39, as shown in FIG. 9(d).

Next, in the same way as the chips 37, the semiconductor chips 43 are fixed to the first semiconductor circuit layer L1 with the electrodes 41, as shown in FIG. 9(d). Similar to the chips 37 that constitute the first semiconductor circuit layer L1, each chip 43 comprises exposed microbump electrodes 42 on its surface, and buried interconnections each of which is formed by a conductive material 54 surrounded by an insulating layer 53 in its inside. Like the chips 37, the electrodes 42 of the chips 43 are respectively opposed to and contacted with the electrodes 41 using bonding metals or without bonding metals. Next, while an appropriate pressing force toward the substrate 31 is applied to the respective chips 43, the whole stacked structure including the support substrate 31 and the first semiconductor circuit layer L1 is heated and then, cooled to room temperature after a predetermined time has passed. In this way, the electrodes 42 on each chip 43 are bonded to the opposing electrodes 41. As a result, the mechanical and electrical connection between the chips 43 and 37 is simultaneously accomplished. The state at this time is shown in FIG. 9(d). Needless to say, the bonding method of the electrodes 41 and 42 is not limited to this; any other one of the above-described methods described in the explanation about the bonding of the electrodes 35 and 36 may be used for this purpose.

Similar to the chips 37, all the chips 43 are placed at the predetermined positions on a carrier substrate (not shown) in advance and then, all the chips 43 are fixed in a lump using the carrier substrate. The detail of this method will be explained later in the explanation about the third semiconductor circuit layer L3.

When the fixing of the chips 43 is completed in the above-described way, then, the adhesive filling step is carried out using the same filling method as explained above about the adhesive 38. Specifically, as shown in FIG. 10(e), the gaps among the chips 43 fixed to the insulating layer 39 (i.e., the first semiconductor circuit layer L1) with the electrodes 41 and 42 are filled with a liquid or fluid adhesive 44 with electrical insulation property by the above-described "spraying method" (the above-described "coating method" or "vacuum injection method" may be used instead). Thereafter, the adhesive 44 is cured by applying heat, irradiating ultraviolet rays, or the like. The adhesive 44 is the same as the adhesive 38 embedded in the gaps among the chips 37. At this time, the thickness of the layer of the adhesive 44 formed on the insulating layer 39 needs not amount to the overall height of the chips 43. It is sufficient that the gaps among the chips 43 are completely filled with the adhesive 44 when the chips 43 are thinned by polishing in the next semiconductor-chip polishing step.

Next, the reverses (here, the lower surfaces) of all the chips 43 fixed in the above-described way are polished in a lump by the mechanical polishing method and the CMP method (the semiconductor-chip polishing step). The CMP process, which is carried out after the mechanical polishing process, is conducted under the same condition as that of the chips 37 in such a way that the reverses of the respective chips 43 are located in the same plane as the cured layer of the adhesive 44 existing among the chips 43, as shown in FIG. 10(e). Due to this CMP process, the conductive materials 54 for the buried interconnections are exposed from the reverses of the respective chips 43, resulting in the conductive plugs. In this state, the buried interconnections (conductive materials) 54 penetrate through the chips 43 vertically.

Through the above-described steps, as shown in FIG. 10(e), the second semiconductor circuit layer L2 including the adhesive 44 and the chips 43 surrounded by the same is formed on the surface of the insulating layer 39.

Subsequently, in approximately the same way as above, semiconductor chips 49 are superposed on the second semiconductor circuit layer L2 thus formed, thereby forming a third semiconductor circuit layer L3.

With the third embodiment, in the aforementioned step of fixing the electrodes 48 on the chips 49 to the corresponding electrodes 47 on the second semiconductor circuit layer L2 oppositely in a one-to-one correspondence also, all the chips 49 are temporarily adhered onto the carrier substrate using water and thereafter, all the chips 49 are collectively contacted with the second semiconductor circuit layer L2 in their opposed state, similar to the aforementioned second embodiment. This step will be explained below in detail with reference to FIGS. 12(a) and 13(b).

First, as shown in FIG. 12(a), similar to the aforementioned first embodiment, a carrier substrate 96 is prepared. The substrate 96 has an enough size for placement of all the semiconductor chips 49 with a layout equivalent to a mirror image of a desired layout and an enough rigidity for withstanding the weight of the necessary number of the chips 49. As the carrier substrate 96, for example, a glass substrate, a semiconductor wafer, or the like, which has an enough rigidity, may be used.

Rectangular thin film-shaped temporary adhesion regions 95, the total number of which is equal to the total number of the chips 49 (here, only the three regions 95 are shown), are formed on one surface of the carrier substrate 96, as shown in FIG. 12(a). These temporary adhesion regions 95, which are provided for temporarily holding all the chips 49 until they are transferred and fixed to the second semiconductor circuit layer L2, has a hydrophilic property. The position of each temporary adhesion region 95 is set in such a way that the chips 49 are arranged with a layout equivalent to a mirror image of the desired layout on the mounting surface (the surface of the insulating layer 45) of the second semiconductor circuit layer L2. The size and shape of each temporary adhesion region 95 are approximately in accordance with the size and shape (here, rectangular shape) of the chip 49 (correctly speaking, a temporary adhesion portion 49a formed on the reverse of the chip 49) to be placed thereon, respectively. Accordingly, if the temporary adhesion portion 49a of each chip 49 is temporarily adhered to the corresponding temporary adhesion region 95, the layout of the chips 49 will be a mirror image of the desired layout of the chips 49 on the second semiconductor circuit layer L2.

In the said third embodiment, "water" is used as the material for temporarily adhering the chips 49 and therefore, the temporary adhesion regions 95 are formed by a $SiO_2$ film with a hydrophilic property, similar to the aforementioned temporary adhesion regions 92. Since the temporary adhesion regions 95 have a hydrophilic property, if a small amount of water is placed on the temporary adhesion regions 95, the water will conform to the whole surfaces of the regions 95 (in other words, the whole surface of each region 95 will be wetted with the water), forming a water film (i.e., a water-drop) 81 that covers the said surface entirely. The temporary adhesion regions 95 are island-shaped and apart from each other; therefore, the water will not flow to the outside from the regions 95.

To further ensure the prevention of the flowing out of the water from the temporary adhesion regions 95 and the accumulation thereof, it is preferred that the mounting surface of the carrier substrate 96 is not hydrophilic. For example, it is preferred that the carrier substrate 96 itself is formed by single-crystal silicon (Si), fluoropolymer, silicone resin, Teflon resin, polyimide resin, resist, wax, BCB, or the like, which has a hydrophobic property, or that the mounting surface of the carrier substrate 96 on which the temporary adhesion regions 95 are formed is covered with polysilicon, amorphous silicon, fluoropolymer, silicone resin, Teflon resin, polyimide resin, resist, wax, BCB, or the like.

Next, a small amount of water is dropped on the respective temporary adhesion regions 95, or the carrier substrate 96 is dipped into water and taken out of it, thereby wetting the respective regions 95 with water. Since the temporary adhesion regions 95 are hydrophilic, the water spreads on the whole surface of each region 95, resulting in a thin film 81 of the water covering the whole surface of each region 95, as shown in FIG. 6(b). These water films 81 are naturally curved mildly convexly due to the surface tension. It is preferred that the amount of the water is adjusted, for example, in such a way that the water films 81 are formed on the respective temporary adhesion regions 95, as shown in FIG. 6(b).

On the other hand, the temporary adhesion portions 49a with a hydrophilic property are formed on the reverses (the faces on the opposite side to the connecting portions R2) of the respective semiconductor chips 49. Such the temporary adhesion portions 49a can be easily realized by, for example, covering the whole reverse of each chip 49 with a $SiO_2$ film having a hydrophilic property. Then, a small amount of water is dropped on each temporary adhesion portion 49a, or each chip 49 is entirely dipped into water or only the temporary adhesion portion 49a of each chip 49 is dipped into water and taken out of it, thereby wetting each of the portions 49a with water. Since the temporary adhesion portions 49a are hydrophilic, the water spreads on the entire surface of each portion 49a, forming a thin film 81 of the water that covers entirely the surface of the portion 49a, as shown in FIG. 6(c). These water films 81 are naturally curved mildly convexly due to the surface tension. It is preferred that the amount of the water is adjusted, for example, in such a way that the water films 81 as shown in FIG. 6(c) are formed on the respective temporary adhesion portions 49a. At this time, the water is not attached to the respective chips 49 except for their temporary adhesion portions 49a (reverses). This is because hydrophobic single-crystal silicon is exposed except for the temporary adhesion portions 49a (reverses). If the connecting portion R2 of each chip 49 is covered with a $SiO_2$ film, water is attached to the connecting portion R2 also. However, no obstacle arises in the step of disposing the respective chips 49 on the carrier substrate 96 even if water exists on the connecting portion R2.

Next, the respective chips 49 where the water films 81 have been formed on the lower surfaces of the temporary adhesion portions 49a are placed on the corresponding temporary adhesion regions 95 on which the water films 81 have been formed. This step can be carried out using a known chip bonder. Then, the water film 81 on each temporary adhesion portions 49a is coupled and unified with the water film 81 on the corresponding temporary adhesion region 95. At this time, it is not always necessary to position correctly each chip 49 on the corresponding temporary adhesion region 95. This is because even if the position of the chip 48 is slightly deviated from the position of the corresponding temporary adhesion region 95 horizontally (i.e., in the direction parallel to the carrier substrate 96), as shown in FIG. 6(d), the position of the chip 49 automatically agrees with that of the corresponding temporary adhesion region 95 due to the action of the surface tension, as shown in FIG. 7(e).

Subsequently, as shown in FIG. 7(f), a flat surface of a pressing plate (not shown) with a sufficient rigidity is contacted with the connecting portions R2 (i.e., the electrodes 48) of all the chips 49 and then, all the chips 49 are pressed toward the carrier substrate 96. Then, the water existing between the temporary adhesion portions 49a of the respective chips 49 and the corresponding temporary adhesion regions 95 is pushed out and as a result, the temporary adhesion portions 49a are brought into intimate contact with the corresponding temporary adhesion regions 95. In this state, the respective chips 49 are temporarily adhered by the absorption force induced by the very small quantity of the water remaining in the gaps between the temporary adhesion portions 49a and the corresponding temporary adhesion regions 95 in the said intimate contacting state. The state at this time is shown in FIG. 12(a).

The state of FIG. 12(a) is substantially the same as that of the carrier substrate 73 shown in FIG. 4(a) in the first embodiment. Therefore, following this, the carrier substrate 96, on which all the necessary chips 49 have been temporarily adhered, is raised in a state parallel to the support substrate 31, where the carrier substrate 73 is held horizontally in such a way that the mounting surface is faced downward. Alternately, on the contrary, the support substrate 31 is lowered in a state parallel to the carrier substrate 96 on which all the necessary chips 49 have been temporarily adhered. Thus, the connecting portions R2 (i.e., the electrodes 48) existing on the surfaces of the respective chips 49 are contacted with the corresponding connecting portions R1 (i.e., the electrodes 47) on the second semiconductor circuit layer L2 in a lump.

After the semiconductor chips 49 are opposed to and contacted with the second semiconductor circuit layer L2 using the electrodes 47 and 48 in the above-described manner, while an appropriate pressing force toward the support substrate 31 is applied to the respective chips 49, the stacked structure including the support substrate 31 and the first and second semiconductor circuit layers L1 and L2 is heated and then, cooled to room temperature after a predetermined time has passed. In this way, the electrodes 48 on each chip 49 are bonded to the opposing electrodes 47. As a result, the mechanical and electrical connection between the chips 49 and 43 is simultaneously accomplished. The state at this time is shown in FIG. 10(f). Needless to say, the bonding method of the electrodes 47 and 48 is not limited to this, and any other one of the above-described methods described in the explanation about the connection of the electrodes 35 and 36 may be used for this purpose.

After the fixing of the connecting portions R2 and R1 using the electrodes 47 and 48 is completed, the carrier substrate 96 needs to be detached from the chips 49. In the said third embodiment, the chips 49 are temporarily adhered to the carrier substrate 96 utilizing the absorption force induced by the very small quantity of the water remaining in the gaps between the temporary adhesion portions 49a and the corresponding temporary adhesion regions 95. The said water evaporates naturally due to the heat applied in or before the step of fixing the connecting portions R2 of the chips 49 and the connecting portions R1. Accordingly, by applying a force in a direction separating the carrier substrate 96 from the chips 49 after completing the fixing of the connecting portions R2 and R1, the carrier substrate 96 and the chips 49 can be detached from each other easily. At this point, there is an advantage that the detaching operation of the carrier substrate 96 and the chips 49 is extremely easy compared with the first embodiment. The state at the time when the carrier substrate 96 is detached from the chips 49 is shown in FIG. 13(b).

In the step of FIGS. 12(a) and 13(b), the chips 49 are placed on the carrier substrate 96 faced upward and thereafter, the chips 49 are collectively transferred and fixed to the mounting surface of the second semiconductor circuit layer L2 faced downward. However, the said embodiment is not limited to this. The chips 49 may be temporarily adhered to the lower surface of the carrier substrate 96 faced downward and thereafter, the chips 49 may be collectively transferred and fixed to the mounting surface of the second semiconductor circuit layer L2 faced upward. In summary, it is sufficient that the chips 49 can be collectively transferred to the said mounting surface.

When the fixing operation of the chips 49 is finished in the above-described manner, an adhesive filling step is carried out subsequently using the same filling method as the aforementioned one used for the adhesives 38 and 44. Specifically, as shown in FIG. 10(f), the gaps on the peripheries of the chips 49 that have been fixed to the insulating layer 45 (i.e., the second semiconductor circuit layer L2) using the electrodes 47 and 48 are filled with a liquid adhesive 50 with an electrical insulative property by the above-described "spraying method" (or the "coating method"). Then, the adhesive 50 is cured by applying heat, irradiating ultraviolet rays, or the like. The adhesive 50 is the same as the adhesive 38 embedded in the gaps among the chips 37. At this time, the thickness of the layer of the adhesive 50 formed on the insulating layer 45 needs not amount to the overall height of the chips 49. It is sufficient that the said gaps are completely filled with the adhesive 50 when the chips 49 are thinned by polishing in the next semiconductor-chip polishing step.

Next, the reverses (here, the lower surfaces) of all the chips 49 fixed in the above-described way are polished in a lump by the mechanical polishing method and the CMP method (the semiconductor-chip polishing step). The said CMP process, which is carried out after the mechanical polishing process, is conducted under the same condition as that of the chips 37 in such a way that the reverses of the respective chips 49 are located in the same plane as the cured layer of the adhesive 50 existing among the chips 49, as shown in FIG. 10(f). Due to this CMP process, the buried interconnections (conductive materials) 56 are exposed from the reverses of the respective chips 49. In this state, the buried interconnections (conductive materials) 56 penetrate through the chips 49 vertically.

Through the above-described steps, as shown in FIG. 10(f), the third semiconductor circuit layer L3 including the adhesive 50 and the chips 49 surrounded by the same is formed on the surface of the insulating layer 45.

Thereafter, an insulting layer 61 is formed to cover the surface of the cured adhesive 50 and the whole reverses of the chips 49 exposed therefrom using a known method. Then, through holes are formed at the predetermined positions on the insulating layer 61 by an etching method, and a conductive material is deposited thereon to fill the through holes. The conductive material thus deposited is selectively removed by an etching method, thereby forming microbump electrodes 60. The microbump electrodes 60 are contacted with the corresponding conductive materials 56 in the chips 49 through the insulating layer 61. These electrodes 60, which are protruded from the insulating layer 61, are used for electrical connection to an external circuit or device. This means that the electrodes 60 are the terminals for external circuit connection, and fulfill the same function as that of the aforementioned electrodes 26 or solder balls 27.

Through the above-described steps, as shown in FIG. 10(f), a stacked structure formed and fixed by sequentially stacking the first to third semiconductor circuit layers L1 to L3 on the mounting surface of the support substrate 31 is obtained. This stacked structure includes chip stacks, each of which is formed by three stacked chips 37, 43, and 49 (chip-shaped semiconductor circuits) and three stacked insulating layers 32, 39, and 45. The top and bottom of the stacked structure are respectively covered with the support substrate 31 and the insulating layer 61, and the sidewalls thereof are formed by the cured adhesives 38, 44, and 50. The chips 37, 43, and 49 in each of the chip stacks are arranged apart from each other in a direction parallel to the support substrate 31, and the gaps on the peripheries of the said chip stack are filled with the cured adhesives 38, 44, and 50. The chips 37, 43, and 49 in each of the chip stacks are arranged apart from each other in a direction perpendicular to the support substrate 31, and the gaps between them are filled with the cured adhesives 38, 44, and 50. In each of the chip stacks, the wiring lines 33 on the support substrate 31 and the stacked chips 37, 43, and 49 are electrically interconnected each other using the conductive plugs 34, 40, and/or 46 embedded respectively in the insulating layers 32, 39, and 45, the buried interconnections (conductive materials) 52, 54, and/or 56 formed respectively in the chips 37, 43, and 49 to penetrate through the same, and the microbump electrodes 35, 36, 41, 42, 47, and/or 48.

Subsequently, the stacked structure comprising the first to third semiconductor circuit layers L1 to L3 is subjected to a dicing process by a known method, thereby dividing the stacked structure into desired integrated circuit devices. This dicing process is performed in such a way that the dicing blade passes through between the adjoining chip stacks. In this way, integrated circuit devices 30A, 30B and 30C as shown in FIG. 10(f) are obtained. Each of the integrated circuit devices 30A, 30B and 30C comprises a three-dimensional stacked structure, wherein a set of three semiconductor chips 37, 43, and 49 having different sizes and different functions are stacked on the divided support substrate 31'.

FIG. 28(b) is an explanatory view showing the layout of the microbump electrodes 60 of the integrated circuit device 30B. The microbump electrodes 60 for external circuit connection are regularly arranged on the opposite surface of the stacked structure of the semiconductor circuit layers L1 to L3 to the support substrate 31 in this way. This is applicable to the integrated circuit devices 30A and 30C.

The dicing process is not limited to such the method as above. Like the integrated circuit device 10D shown in FIG. 3(j), the dicing process may be carried out in such a way as to include the two adjoining chip stacks, or to include the three or more chip stacks as necessary. Alternately, the entirety of the stacked structure before dicing may be used as a wafer-level integrated circuit device without the dicing process.

With the method of fabricating an integrated circuit device having a three-dimensional stacked structure according to the third embodiment of the present invention, as explained above, first, the carrier substrate 93 (the support member for transfer) shown in FIGS. 11(a) and 11(b) is prepared. The carrier substrate 93 comprises on its surface the temporary adhesion regions 92 for arranging the semiconductor chips 37 with a layout equivalent to a mirror image of the desired layout. Next, the temporary adhesion portions 37a formed at the opposite ends of the chips 37 to the connecting portions R2 are temporarily adhered to the corresponding temporary adhesion regions 92 using water, respectively, thereby placing the chips 37 on the carrier substrate 93. Further, by causing the carrier substrate 93 on which the chips 37 have been placed to approach the support substrate 31, the connecting portions R2 of the chips 37 on the carrier substrate 93 are respectively brought into contact with the corresponding connecting portions R1 on the support substrate 31. Subsequently, by connecting the connecting portions R2 (which are formed by the microbump electrodes 36) of the chips 37 to the connecting portions R1 (which are formed by the microbump electrodes 35) on the support substrate 11, which have been brought into contact with each other, the chips 37 are fixed on the support substrate 11 with the desired layout.

Moreover, the step of forming the temporary adhesion regions 92 on the carrier substrate 93, the step of temporarily adhering the chips 37 to the temporary adhesion regions 92, and the positioning in the step of connecting respectively the connecting portions R2 of the chips 37 to the connecting portions R1 on the support substrate 11 can be respectively carried out with desired accuracy, if known techniques that have been used in the fabrication processes of an integrated circuit device not having a three-dimensional stacked structure are utilized.

These points are applicable to the fixing of the semiconductor chips 43 and 49 that constitute respectively the second and third semiconductor circuit layers L2 and L3.

Accordingly, the many (e.g., several hundreds of) semiconductor chips 37, 43, or 49 can be respectively fixed easily and efficiently with desired accuracy on the support substrate 31, or the first or second semiconductor circuit layer L1 or L2 in such a way as to form the desired layouts.

As a result, in the third embodiment where the bump electrodes 35, 36, 41, 42, 47, and 48 are used as the connecting portions R2 and R1 for electrical interconnection of the semiconductor chips 37, 43, and 49, the interconnection of the connecting portions R2 and R1 is performed in the above-described manner. Therefore, the many bump electrodes 36, 42, and 48 that have been respectively formed on the connecting surfaces of the chips 37, 43, and 49 can be fixed correctly to the corresponding bump electrodes 35, 41, and 47 oppositely in a one-to-one correspondence.

Moreover, in the third embodiment, a hydrophilic property is given to the temporary adhesion regions 37a on the carrier substrate 93 and the temporary adhesion portions 37a of the semiconductor chips 37 in advance and then, the chips 37 are positioned at the temporary adhesion regions 72a in self-alignment utilizing the surface tension of the water films 101 attached to the temporary adhesion portions 92 and the temporary adhesion regions 37a. Therefore, the advantages that the necessary positioning accuracy of the chips 37 in the fixing step of the chips 37 to the temporary adhesion regions 92 can be lowered, and the preparation of such a material as the sticky material used in the first embodiment is unnecessary occurs, in addition to the above-described advantages.

In the third embodiment, the water films 101 are formed on both the temporary adhesion regions 92 of the carrier substrate 93 and the temporary adhesion portions 37a of the semiconductor chips 37. However, the invention is not limited to this. Needless to say, the water films 101 may be formed on either the temporary adhesion regions 92 or the temporary adhesion portions 37a.

As the "water" used in the third embodiment, similar to the second embodiment, "ultrapure water" that has been generally used in the fabrication processes of semiconductor devices is preferred. However, it is more preferred to use "ultrapure water" containing an appropriate additive for enhancing the self-aligning function to the semiconductor chips by increasing the surface tension. As the additive for increasing the surface tension, the additives described in the second embodiment are used. Moreover, similar to the second embodiment, other inorganic or organic liquid may be used instead of "water", where a material having a "lyophilic property" for such the liquid as described here is necessarily used to form the temporary adhesion regions and the temporary adhesion portions.

If the semiconductor chip providing specific circuit functions in one of the first to third semiconductor circuit layers L1 to L3 is unnecessary, it is preferred that the position of the said chip is filled with a so-called dummy chip. Here, the dummy chip means a semiconductor chip having the same external form as a KGD and no inner circuit, or a semiconductor chip having the same external form as a KGD and inner circuits all of which are unused. In this case, only buried interconnections for electrical connection to another adjoining semiconductor chip or chips are formed in the dummy chip as necessary. This is because if a vacant position where no semiconductor chip exists is generated, some obstacle may occur in the execution of the step of stacking the semiconductor chip, or some problem about the mechanical strength may arise in the integrated circuit device thus fabricated. However, if such the problem can be avoided, the vacant position may be filled with any filling material other than the dummy chip. This is applicable to the other embodiments.

In addition, in the third embodiment, the wiring lines 33 embedded in the insulating layer 32 are formed on the surface of the support substrate 31; however, the wiring lines 33 are not always necessary. If the wiring lines or circuits on the substrate 31 are unnecessary (in other words, the substrate 31 is used only as the base of the stacked structure), the microbump electrodes 35 may be directly formed on the mounting surface of the substrate 31, and opposed and bonded to the microbump electrodes 36 on the semiconductor chips 37. Alternately, the electrodes 36 on the chips 37 may be directly bonded to the mounting surface of the substrate 31, where the electrodes 35 are cancelled. The chips 37 may be bonded to the mounting surface of the substrate 31 with the electrodes 35 on the substrate 31, where the electrodes 36 are cancelled.

Detailed Structure of Semiconductor Chip Used in Third Embodiment

By the way, the structure of the semiconductor chip 37 is simplified in FIGS. 8(a) to 10(e) and FIGS. 11(a) to 13(b) for the sake of easy understanding of the stacking steps and therefore, the relationship with the actual structure of the chips 37 may be difficult to understand. So, this point is explained below with reference to FIGS. 27(a) and 27(b). FIGS. 27(a) and 27(b) are schematic cross-sectional views showing the detailed structure of the chip 37 used in the integrated circuit device according to the above-described third embodiment.

The semiconductor chip 37 has an actual structure shown in FIG. 27(a) or FIG. 27(b), for example. Specifically, in the structure example of FIG. 27(a), Metal-Oxide-Semiconductor Field-Effect Transistors (MOSFET) 160 are formed in the surface area of the chip 37. For simplification, only two transistors 160 are shown. Each of the transistors 160 comprises a pair of source/drain regions 161 formed in the chip 37, a gate insulating layer 162 formed on the surface of the chip 37, and a gate electrode 163 formed on the gate insulating layer 162.

An insulating layer 151 is formed on the surface of the chip 37, which covers the transistor 160 and the exposed part of the said surface. A wiring layer 152 is formed on the insulating layer 151. In FIG. 27(a), the state where the wiring layer 152 is electrically connected to a conductive material (a buried interconnection) 52 in the chip 37 and one of the source/drain regions 161 of one of the transistors 160 is shown. An insulating layer 153 is formed on the insulating layer 151 to cover the whole wiring layer 152. The microbump electrodes 36, which are formed on the flat surface of the insulating layer 153, are electrically connected to the wiring layer 152 by way of the conductive plugs 154.

In the structure example of FIG. 27(a), the microbump electrode 36 at the left side is located just over the corresponding conductive material (the buried interconnection) 52 in the chip 37. However, the electrode 36 at the right side in FIG. 27(a) is not located just over the corresponding conductive material (the buried interconnection) 52, which is slightly shifted to the right side horizontally. In FIGS. 8(a) to 10(e), all the electrodes 36 are located just over the corresponding conductive materials (the buried interconnections) 52; however, the invention is not limited to this. As shown in FIG. 27(a), it is sufficient that each electrode 36 is electrically connected to a corresponding one of the conductive materials (the buried interconnections) 52. It is unnecessary that each electrode 36 is located just over the corresponding conductive material (the buried interconnection) 52. The position of each electrode 36 may be shifted horizontally (i.e., in a direction parallel to the surface of the chip 37) according to the necessity.

In the structure of FIG. 27(a), the transistors 160 and the wiring layer 152 (a single-layer wiring structure) constitute the semiconductor integrated circuit (the semiconductor solid-state circuits) C.

In the structure example of FIG. 27(b), similar to the case of FIG. 27(a), MOSFETs 160 are formed in the surface area of the semiconductor chip 37. An insulating layer 151 is formed on the surface of the chip 37, which covers the transistor 160 and the exposed part of the said surface. A wiring layer 152 is formed on the insulating layer 151. In FIG. 27(b), the state where the wiring layer 152 is electrically connected one of the source/drain regions 161 of one of the transistors 160 is shown. Unlike the case of FIG. 27(a), the wiring layer 152 is not directly connected to the conductive material (the buried interconnection) 52 in the chip 37. An insulating layer 153 is formed on the insulating layer 151 to cover the whole wiring layer 152.

In this structure example, unlike the case of FIG. 27(a), the conductive material (the buried interconnection) 52 in the chip 37 penetrates through the insulating layers 153 and 151 located over the chip 37 and is exposed from the surface of the insulating layer 153. An insulating layer 171 is formed on the insulating layer 153. A wiring layer 172 is formed on the insulating layer 171. The wiring layer 172 is electrically connected to the wiring layer 152 and the conductive material (the buried interconnection) 52. An insulating layer 173 is formed on the insulating layer 171 to cover the whole wiring layer 172. The microbump electrodes 36, which are formed on the surface of the insulating layer 173, are electrically connected to the wiring layer 172 by way of the conductive plugs 174.

In the structure example of FIG. 27(b) also, the microbump electrode 36 at the left side is located just over the corresponding conductive material (the buried interconnection) 52 in the chip 37. However, the electrode 36 at the right side in FIG. 27(b) is not located just over the corresponding conductive material (the buried interconnection) 52, which is slightly shifted to the right side horizontally. In FIGS. 8(a) to 10(e), all the electrodes 36 are located just over the corresponding conductive materials (the buried interconnections) 52; however, the invention is not limited to this. As shown in FIG. 27(b), it is unnecessary that each of the electrodes 36 is located just over the corresponding conductive material (the buried interconnection) 52. The position of each electrode 36 may be shifted horizontally (i.e., in a direction parallel to the surface of the chip 37) according to the necessity.

In the structure example of FIG. 27(b), the transistors 160 and the two wiring layers 152 and 172 (a two-layer wiring structure) constitute the semiconductor integrated circuit (the semiconductor solid-state circuits) C formed in the chip 37.

Needless to say, the structure examples of FIG. 27(a) and FIG. 27(b) may be applied to the other embodiments and their variations explained below.

Fourth Embodiment

In the methods of fabricating an integrated circuit device according to the above-described first to third embodiments (see FIGS. 1(a) to 13(b)), all the semiconductor chips required for forming the semiconductor circuit layer are temporarily placed on the "carrier substrate" serving as the support member for transfer and thereafter, these chips are collectively opposed to and contacted with the support substrate or the corresponding semiconductor circuit layer at the predetermined positions and fixed thereto. Unlike this, in the method of fabricating an integrated circuit device according to the fourth embodiment, all the semiconductor chips required for forming the semiconductor circuit layer are directly opposed to and contacted with the support substrate or the corresponding semiconductor circuit layer at the predetermined positions and fixed thereto without using the "carrier substrate". This method without transferring the semiconductor chips is termed the "non-transfer type". Since the method of the fourth embodiment is the same as that of the first embodiment (see FIGS. 4(a) to 5(b)) except for this point, the explanation about the same steps are omitted here and only the different steps will be explained in detail below.

FIGS. 14(a) and 14(b) are cross-sectional views showing the concept of the semiconductor-chip fixing step of the "non-transfer type" in the method of fabricating an integrated circuit device having a three-dimensional stacked structure according to the fourth embodiment of the invention. In the fabrication method of an integrated circuit device using the "non-transfer type", the connecting portions 12 of the semiconductor chips 13 are directly opposed to and contacted with the respective connecting portions 71 formed at the desired positions on the mounting surface 11a of the support substrate 11 without using the "carrier substrate" individually or collectively. Thereafter, the connecting portions 12 and 71 are fixed to each other in the same way as that described in the first to third embodiments.

FIGS. 15(a) to 17(b) are cross-sectional views showing in detail the step of disposing the semiconductor chips constituting the first semiconductor layer L1 on the support substrate, which is used in the method of fabricating an integrated circuit device according to the fourth embodiment of the invention.

In the method of fabricating an integrated circuit device according to the fourth embodiment, as shown in FIG. 15(a), rectangular thin film-shaped connecting portions 71a, the total number of which is equal to the total number of the chips 13 (here, only the three portions 71a are shown), are formed on the mounting surface 11a of the support substrate 11. These connecting portions 71a are formed in such a way that the chips 13 are arranged with a desired layout on the support substrate 11.

In the said fourth embodiment, similar to the aforementioned second embodiment, "water" is used as the material for disposing the chips 13 on the connecting portions 71a and therefore, the connecting portions 71a are formed to have a hydrophilic property. Such the connecting portions 71a can be easily realized by using, for example, a $SiO_2$ film with a hydrophilic property. Specifically, a $SiO_2$ film (which has a thickness of, for example, 0.1 μm) is thinly formed on the entire mounting surface 11a by a known method and thereafter, the $SiO_2$ film is selectively removed by a known etching method. In this way, the connecting portions 71a with a hydrophilic property can be easily obtained. Since the connecting portions 71a have a hydrophilic property, if a small amount of water is placed on the connecting portions 71a, the water will conform to the whole surfaces of the portions 71a (in other words, the whole surface of each portion 71a will be wetted with the water), forming a water film 81 (a waterdrop) that covers the said surface entirely. The connecting portions 71a are island-shaped and apart from each other; therefore, the water will not flow to the outside from the portions 71a.

To further ensure the prevention of the flowing out of the water from the connecting portions 71a and the accumulation thereof, it is preferred that the mounting surface 11a of the support substrate 11 is not hydrophilic. For example, it is preferred that the support substrate 11 itself is formed by single-crystal silicon (Si), fluoropolymer, silicone resin, Teflon resin, polyimide resin, resist, wax, BCB, or the like, which has a hydrophobic property, or that the mounting surface 11a of the support substrate 11 is covered with polysilicon, amorphous silicon, fluoropolymer, silicone resin, Teflon resin, polyimide resin, resist, wax, BCB, or the like.

Next, a small amount of water is dropped on the respective connecting portions 71a, or the support substrate 11 is dipped into water and taken out of it, thereby wetting the respective portions 71a with water. Since the respective connecting portions 71a are hydrophilic, the water spreads on the whole surface of each portion 71a, resulting in a thin film 81 of the water covering the whole surface of each portion 71a, as shown in FIG. 15(b). These water films 81 are naturally curved mildly convexly due to the surface tension. It is preferred that the amount of the water is adjusted, for example, in such a way that the water films 81 are formed on the respective connecting portions 71a, as shown in FIG. 15(b)

On the other hand, the connecting portions 12 with a hydrophilic property are formed on the surfaces of the respective semiconductor chips 13 in advance. Such the connecting portions 12 can be easily realized by, for example, covering the whole surface of each chip 13 with a $SiO_2$ film having a hydrophilic property while the electrodes for electrical connection are exposed from the $SiO_2$ film. Then, a small amount of water is dropped on each connecting portion 12, or each chip 13 is entirely dipped into water or only the connecting portion 12 of each chip 13 is dipped into water and taken out of it, thereby wetting each of the portions 12 with water. Since the connecting portions 12 are hydrophilic, the water spreads on the entire surface of each portion 12, forming a thin film 81 of the water that covers entirely the surface of the portion 12, as shown in FIG. 15(c). These water films 81 are naturally curved mildly convexly due to the surface tension. It is preferred that the amount of the water is adjusted, for example, in such a way that the water films 81 are formed on the respective connecting portions 12, as shown in FIG. 15(c). At this time, the water is not attached to the respective chips 13 except for their connecting portions 12 (their surfaces). This is because hydrophobic single-crystal silicon is exposed except for the surfaces of the chips 13.

Next, the semiconductor chips 13 where the water films 81 have been formed on the connecting portions 12 are respectively placed on the corresponding connecting portions 71a on which the water films 81 have been formed. This step can be carried out using a known chip bonder. Then, the water film 81 on each connecting portion 12 is coupled and unified with the water film 81 on the corresponding connecting portions 71a. At this time, it is not always necessary to position correctly each chip 13 on the corresponding connecting portions 71a. This is because even if the position of the chip 17 is slightly deviated from the position of the corresponding connecting portion 71a horizontally (i.e., in the direction parallel to the support substrate 11), as shown in FIG. 15(d), the position of the chip 13 automatically agrees with that of the corresponding connecting portion 71a due to the action of the surface tension of the water film 81, as shown in FIG. 16(e).

Subsequently, a flat surface of a pressing plate 180 with a sufficient rigidity is contacted with the opposite ends (reverses) of all the chips 13 to their connecting portions 12 and then, all the chips 13 are pressed toward the support substrate 11. Then, the water existing between the connecting portions 12 of the respective chips 13 and the corresponding connecting portions 71a is pushed out and as a result, the connecting portions 12 are brought into intimate contact with the corresponding connecting portions 71a. The state at this time is shown in FIG. 16(f).

Following this, the connecting portions 12 of the respective chips 13 are fixed to the corresponding connecting portions 71a on the support substrate 11 in an appropriate method while keeping the pressing state by the plate 180. After the fixing step is completed, the plate 180 is detached from the chips 13, resulting in the state shown in FIG. 16(g). This state is substantially the same as that of FIG. 1(b). In the fixing step of the connecting portions 12 and 71a, for example, the microbump electrodes formed on the connecting portions 12 and those on the connecting portions 71a are bonded to each other using the bonding metals intervening between them. In this case, the bonding metals are heated and melted for bonding the microbump electrodes. Alternately, the microbump electrodes formed on the connecting portions 12 and those on the connecting portions 71a may be directly bonded to each other using pressure welding without the intervening bonding metals at room temperature or under heat. Alternately, the microbump electrodes formed on the connecting portions 12 and those on the connecting portions 71a may be bonded to each other under heat using fusion welding without the intervening bonding metals. In other words, the microbump electrodes formed on the connecting portions 12 and those on the connecting portions 71a may be temporarily melted by heating to be melted and re-solidified, thereby unifying the electrodes.

In the fourth embodiment, as explained above, the fixing step of the connecting portions 12 of the respective chips 13 and the connecting portions 71a is carried out while the chips 13 are kept in intimate contact with the support substrate 11 utilizing the absorption force induced by the very small quantity of the water remaining in between the connecting portions 12 and 71a. For this reason, the remaining water evaporates naturally due to the heat applied during or before the said fixing step. Accordingly, the said fixing step is not affected by the water.

The chips 13 are opposed to and contacted with the upper surface of the support substrate 11 that is faced upward in FIGS. 15(a) to 16(g); however, the said embodiment is not limited to this. The chips 13 may be opposed to and contacted with the lower surface of the support substrate 11 that is faced downward.

After the fixing of the chips 13 to the mounting surface 11a of the support substrate 11 is completed in this way, the gaps on the peripheries of the chips 13 are filled with the liquid or fluid adhesive 14 and then, the adhesive 14 is cured by applying heat, irradiating ultraviolet rays, or the like, as shown in FIG. 1(c). Thereafter, the respective chips are polished in the same manner as the aforementioned one about the basic concept of the invention, forming the first semiconductor circuit layer L1 (see FIG. 1(d)).

The steps of respectively fixing the semiconductor chips 16, 19, and 22 to the first to third semiconductor circuit layers L1 to L3 can be carried out in the same way as those shown in FIGS. 15(a) to 16(g). Here, the step of fixing the semiconductor chips 19 constituting the third semiconductor circuit layer L3 to the second semiconductor circuit layer L2 at the corresponding positions thereof will be explained below with reference to FIGS. 17(a) and 17(b).

As shown in FIG. 17(a), the connecting portions 85a with a hydrophilic property are formed on the reverses (the faces on the opposite side to the connecting portions 12) of the respective semiconductor chips 13 that constitute the first semiconductor circuit layer L1, similar to the connecting portions 71 on the support substrate 11. Such the connecting portions 85a can be easily realized by covering the whole reverse of each chip 13 with a thin $SiO_2$ film. The semiconductor chips 16 that constitute the second semiconductor circuit layer L2 are electrically and mechanically connected to the corresponding chips 13 using these connecting portions 85a and the connecting portions 15 formed on the surfaces of the chips 16.

Connecting portions 86a with a hydrophilic property are formed on the reverses (the faces on the opposite side to the connecting portions 15) of the respective semiconductor chips 16 that constitute the second semiconductor circuit layer L2, similar to the connecting portions 71 on the support substrate 11. Such the connecting portions 86a can be easily realized by covering the whole reverse of each chip 16 with a thin $SiO_2$ film. Therefore, if a small amount of water is placed on the connecting portions 86a, the water will conform to the whole surfaces of the portions 86a, forming water films 81 on the said surfaces. The connecting portions 86a are island-shaped and apart from each other; therefore, the water will not flow to the outside from the portions 86*a*.

When a small amount of water is dropped on the respective connecting portions 86*a*, or the carrier substrate 11 is dipped into water and taken out of it, thereby wetting the respective portions 86*a* with water. Since the connecting portions 86*a* are hydrophilic, the water spreads on the whole surface of each portion 86*a*, resulting in a thin film 81 of the water covering the whole surface of each portion 86*a*, as shown in FIG. 17(*a*). These water films 81 are naturally curved mildly convexly due to the surface tension. It is preferred that the amount of the water is adjusted, for example, in such a way that the water films 81 are formed on the respective connecting portions 86*a*, as shown in FIG. 17(*a*).

On the other hand, the connecting portions 18 of the respective semiconductor chips 19 have a hydrophilic property. Giving a hydrophilic property to the connecting portions 18 can be easily realized by covering the whole surfaces of the portions 18 with a hydrophilic $SiO_2$ film. Therefore, a small amount of water is dropped on each connecting portion 18, or each chip 19 is entirely dipped into water or only the portion 18 of each chip 19 is dipped into water and taken out of it, thereby wetting each of the portions 18 with water. Since the connecting portions 18 are hydrophilic, the water spreads on the entire surface of each portion 18, forming a thin film 81 of the water that covers entirely the said surface, as shown in FIG. 17(*a*). These water films 81 are naturally curved mildly convexly due to the surface tension. It is preferred that the amount of the water is adjusted, for example, in such a way that the water films 81 as shown in FIG. 17(*a*) are formed on the respective connecting portions 18.

Next, the semiconductor chips 19 where the water films 81 have been formed on the connecting portions 18 are placed on the corresponding connecting portions 86*a* on which the water films 81 have been formed. This step can be carried out using a known chip bonder. Then, the water film 81 on each connecting portion 18 is coupled and unified with the water film 81 on the corresponding connecting portion 86*a*. At this time, it is not always necessary to position correctly each chip 19 on the corresponding connecting portions 86*a*. This is because even if the position of the chip 19 is slightly deviated from the position of the corresponding connecting portion 86*a* horizontally (i.e., in the direction parallel to the support substrate 11), as shown in FIG. 11(*d*), the position of the chip 19 automatically agrees with that of the corresponding connecting portion 86*a* due to the action of the surface tension, as shown in FIG. 17(*b*).

Subsequently, although not shown, a flat surface of a pressing plate (not shown) with a sufficient rigidity is contacted with the opposite ends (reverses) of all the chips 19 to the connecting portions 18 and then, all the chips 19 are pressed toward the support substrate 11. Then, the water existing between the connecting portions 18 of the respective chips 19 and the corresponding connecting portions 86*a* is pushed out and as a result, the connecting portions 18 are brought into intimate contact with the corresponding connecting portions 86*a*.

Following this, the connecting portions 18 of the respective chips 19 are fixed to the corresponding connecting portions 86*a* of the corresponding chips 16 in an appropriate method while keeping the pressing state by the pressing plate. After the fixing step is completed, the pressing plate is detached from the chips 19. This fixing step of the connecting portions 18 and 86*a* can be carried out in the same manner as that of the connecting portions 12 and 71*a*.

In the fourth embodiment, the fixing step of the connecting portions 18 of the respective chips 19 and the connecting portions 86*a* is carried out while the chips 19 are kept in intimate contact with the chips 16 utilizing the absorption force induced by the very small quantity of the water remaining in between the connecting portions 18 and 86*a*. For this reason, the remaining water evaporates naturally due to the heat applied during or before the said fixing step. Accordingly, the said fixing step is not affected by the water.

The chips 19 are opposed to and contacted with the upper surface of the second semiconductor circuit layer L2 that is faced upward in FIGS. 17(*a*) and 17(*b*); however, the said embodiment is not limited to this. The chips 19 may be opposed to and contacted with the lower surface of the second semiconductor circuit layer L2 that is faced downward.

After the fixing of the chips 19 to the mounting surface of the second semiconductor circuit layer L2 is completed in this way, the gaps on the peripheries of the chips 19 are filled with the liquid or fluid adhesive 20 and then, the adhesive 20 is cured by applying heat, irradiating ultraviolet rays, or the like. Thereafter, the third semiconductor circuit layer L3 is formed in the same manner as the aforementioned one about the basic concept of the invention (see FIG. 3(*h*)).

With the method of fabricating an integrated circuit device having a three-dimensional stacked structure according to the fourth embodiment of the invention, as explained above, first, the water films 81 are respectively formed on the connecting portions 71*a* of the support substrate 11 and the connecting portions 12 of the semiconductor chips 13. Next, the connecting portions 12 of the chips 13 and the corresponding connecting portions 71*a* of the substrate 11 are opposed to each other by way of the water films 81. Then, the connecting portions 12 and the corresponding connecting portions 71*a*, which have been opposed by way of the water films 81, are contacted with each other by pressing the chips 13 toward the substrate 11. Thereafter, the connecting portions 12 and the corresponding connecting portions 71*a*, which have been contacted, are fixed to each other in an appropriate method, thereby disposing the chips 13 on the support substrate 11.

The step of forming the water films 81 on the connecting portions 71*a* of the support substrate 11 and the connecting portions 12 of the semiconductor chips 13 can be easily performed using a known technique, for example, by forming respectively the portions 12 and 71*a* by a hydrophilic material, or by covering the portions 12 and 71*a* with a hydrophilic material.

Moreover, if the known techniques that have been used in the fabrication processes of an integrated circuit device not having a three-dimensional stacked structure are utilized, the step of opposing the connecting portions 12 of the chips 13 to the corresponding connecting portions 71*a* of the support substrate 11 by way of the water films 81, and the positioning between the portions 12 and 71*a* in the step of contacting the portions 12 with the portions 71*a* opposed thereto by way of the water films 81 by pressing the chips 13 toward the substrate 11 can be carried out with desired accuracy.

These points are applicable to the semiconductor chips 16, 19, and 20 that constitute respectively the first, second, and third semiconductor circuit layers L1, L2, and L3.

Accordingly, the many (e.g., several hundreds of) semiconductor chips 13, 16, 19, and 20 can be respectively fixed easily and efficiently with desired accuracy on the support substrate 11, and the first, second, and third semiconductor circuit layers L1, L2, and L3 in such a way as to form the desired layouts.

Moreover, when bump electrodes are used for electrical interconnection of the chips 13, 16, 19, and 20, the many bump electrodes that have been respectively formed on the connecting surfaces of the chips 13, 16, 19, and 20 with predetermined layouts can be fixed correctly to the corresponding bump electrodes or the corresponding connection regions of the wiring lines oppositely in a one-to-one correspondence.

Further, in the fabrication method of the fourth embodiment, regarding, for example, the first semiconductor circuit layer L1, a hydrophilic property is given to the connecting portions 71a of the support substrate 11 and the connecting portions 12 of the chips 13 in advance and then, the chips 13 are positioned at the connecting portions 71a in self-alignment utilizing the surface tension of the water films 81 attached respectively to the portions 71a and 12. Therefore, there are advantages that the necessary positioning accuracy of the chips 13 in the fixing step of the chips 13 to the temporary adhesion portions 71a can be lowered, the preparation of such a material as the sticky material used in the first embodiment is unnecessary, and the remaining water is easily removed, in addition to the above-described advantages.

In the aforementioned fourth embodiment, the water films 81 are formed on both the connections portions 71a of the support substrate 11 and the connections portions 12 of the semiconductor chips 13. However, the invention is not limited to this. Needless to say, the water films 81 may be formed on either the portions 71a or the portions 12.

As the "water" used in the fourth embodiment, similar to the second embodiment, "ultrapure water" that has been generally used in the fabrication processes of semiconductor devices is preferred. However, it is more preferred to use "ultrapure water" containing an appropriate additive for enhancing the self-aligning function to the semiconductor chips by increasing the surface tension. As the additive for increasing the surface tension, the additives described in the second embodiment may be used. Moreover, similar to the second embodiment, other inorganic or organic liquid may be used instead of "water", where a material having a "lyophilic property" for such the liquid as described here is necessarily used to form the temporary adhesion regions and the temporary adhesion portions.

Fifth Embodiment

FIGS. 18(a) to 20(b) are cross-sectional views showing a method of fabricating an integrated circuit device having a three-dimensional stacked structure according to a fifth embodiment of the invention. FIGS. 18(a) and 18(b) show the step of arranging the semiconductor chips on the support substrate and FIGS. 19(a) and 20(b) show the step of arranging the semiconductor chips on the second semiconductor circuit layer. The fabrication method of the fifth embodiment is of the "non-transfer type" similar to the fourth embodiment.

Since the fabrication method of the fifth embodiment is the same as that of the third embodiment (see FIGS. 8(a) to 10(e)) except for the steps of arranging the semiconductor chips, the explanation about the same steps are omitted here and only the different steps will be explained in detail below.

In the said fifth embodiment, "water" is used as the material for disposing the semiconductor chips 37 and therefore, rectangular thin film-shaped hydrophilic regions 91a are formed at the respective connecting portions R1, as shown in FIG. 18(a), where the connecting portions R1 are formed at the desired positions of the insulating layer 32 on the support substrate 31. The total number of the hydrophilic regions 91a is equal to the total number of the chips 37 (here, only the three regions 91a are shown) to be disposed on the one support substrate 31. The size and shape of each hydrophilic region 91a are approximately in accordance with the size and shape (here, rectangular shape) of the chip 37 (correctly speaking, the connecting portion R2 formed on the surface of the chip 37) to be placed thereon, respectively. Accordingly, if the hydrophilic region 92a of each chip 37 is opposed to the corresponding hydrophilic region 91a, the chips 37 will be arranged on the support substrate 31 with the desired layout.

The hydrophilic region 91a on the insulating layer 32 can be easily formed by, for example, depositing a thin $SiO_2$ film (which has a thickness of, for example, 0.1 μm) on the entire surface of the insulating layer 32 by a known method and thereafter, selectively removing the $SiO_2$ film by etching.

The necessary number of the microbump electrodes 35 are formed in each hydrophilic region 91a, in other words, in such a way as to be overlapped with each hydrophilic region 91a. The height of the electrodes 35 is greater than that of the hydrophilic regions 91a and therefore, the tops of the electrodes 35 are protruded from the hydrophilic regions 91a. This is to make it possible to electrical and mechanical connection between the electrodes 35 and the electrodes 36 formed in the connecting portions R2 of the semiconductor chips 37.

To form the electrodes 35, for example, the following method may be used, where the lift-off method is utilized. Specifically, a $SiO_2$ film for the hydrophilic regions 91a is formed on the entire surface of the insulating layer 32, a patterned resist film is formed on the $SiO_2$ film and thereafter, the $SiO_2$ film is selectively etched using the patterned resist film as a mask, forming the hydrophilic regions 91a. At this time, penetrating holes (which have the same pattern as the electrodes 35) that reach the surface of the insulating layer 32 are formed in each hydrophilic region 91a at the positions where the electrodes 35 are to be formed. Subsequently, a patterned resist film is formed on the whole surface of the insulating layer 32 in such a way as to cover the hydrophilic regions 91a thus formed. This resist film has a necessary number of windows (penetrating holes) formed to be superposed approximately entirely on the penetrating holes of each hydrophilic region 91a. When a conductive layer (usually a metal film) for the electrodes 35 is formed on the resist film, the conductive layer is in contact with the surface of the insulating layer 32 (the conductive plugs 34) through the respective windows of the resist film and the corresponding holes of the hydrophilic regions 91a. The resist film is removed in this state and as a result, the part of the conductive layer located on the resist film is removed and at the same time, the parts thereof existing in the windows of the resist film and the holes of the hydrophilic regions 91a are only left. The parts of the conductive layer remaining in this way constitute the electrodes 35. Since the parts of the conductive layer remaining in the windows and the holes are thicker than the hydrophilic regions 91a (the $SiO_2$ film), the said part are protruded from the hydrophilic regions 91a. Accordingly, the electrodes 35 having the structure shown in FIGS. 18(a) and 18(b) are obtained.

Alternately, a conductive layer (usually a metal film) is formed on the whole surface of the insulating layer 32 and then, the conductive layer is selectively removed by photolithography and etching, thereby forming the electrodes 35. Thereafter, a patterned resist film is formed on the whole surface of the insulating layer 32 in such a way as to cover the electrodes 35 thus formed. The resist film comprises windows (penetrating holes) formed only at the positions on which the hydrophilic regions 91a are to be formed (the parts superposed on the respective electrodes 35 are excluded). When a $SiO_2$ film for the hydrophilic regions 91a is deposited on the resist film, the $SiO_2$ film is in contact with the surface of the insulating layer 32 through the windows of the resist film. The resist film is then removed in this state and as a result, the part of the SiO₂ film located on the resist film is removed and at the same time, the parts thereof existing in the windows of the resist film are only left. The parts of the SiO₂ film remaining in this way constitute the hydrophilic regions 91a. The parts of the SiO₂ film remaining in the windows are set to be thinner than the conductive layer (i.e., the height of the electrodes 35) such that the electrodes 35 are protruded from the hydrophilic regions 91a. Accordingly, the structure shown in FIGS. 18(a) and 18(b) is obtained.

On the other hand, the rectangular thin film-shaped hydrophilic regions 92a are formed in the connecting portions R2 on the surfaces of the respective semiconductor chips 37. The hydrophilic region 92a covers the whole surface (the connecting portion R2) of the chip 37. The size and shape of the hydrophilic region 92a are approximately in accordance with the size and shape (here, rectangular shape) of the surface (the connecting portion R2) of the chip 37 on which the hydrophilic region 92a is placed. A necessary number of the microbump electrodes 36 are formed in each of the hydrophilic regions 92a. The height of the electrodes 36 is greater than that of the hydrophilic regions 92a and therefore, the tops of the electrodes 36 are protruded from the hydrophilic regions 92a. This is to make it possible to electrical and mechanical connection between the electrodes 36 and the electrodes 35 formed on the insulating layer 32.

The hydrophilic regions 92a and the electrodes 36 of the chips 37 can be formed in the same manner as the formation method of the hydrophilic regions 92a formed on the insulating layer 32 and the electrodes 35. When the surface of each chip 37 is covered with the insulating SiO₂ film, and the electrodes 36 are formed to protrude from the said SiO₂ film as the terminals for external circuit connection, the said SiO₂ film may be used as the hydrophilic region 92a.

When the connecting portions R2 of the semiconductor chips 37, which comprise the hydrophilic regions 92a, are attached to (contacted with) the connecting portions R1 formed on the insulating layer 32, which comprise the hydrophilic regions 92a, the following step is carried out.

Specifically, first, a small amount of water is dropped on the respective hydrophilic regions 91a formed on the insulating layer 32, or the support substrate 31 is dipped into water and taken out of it. Then, since the hydrophilic regions 91a are hydrophilic, the water conforms to the whole surfaces of the regions 91a to cover the same, resulting in thin films 101 of the water as shown in FIG. 18(a). These water films 101 are naturally curved mildly convexly due to the surface tension. It is preferred that the amount of the water to be dropped on the respective hydrophilic regions 91a is adjusted, for example, in such a way that the water films 101 covering entirely the electrodes 35 are formed on the respective hydrophilic regions 91a. The hydrophilic regions 91a are island-shaped and apart from each other; therefore, the water will not flow to the outside from the regions 91a.

To further ensure the prevention of the flowing out of the water from the hydrophilic regions 91a, it is preferred that the surface of the insulating layer 32 is not hydrophilic. This can be realized by, for example, forming the insulating layer 32 itself by a hydrophobic material, such as fluoropolymer, silicone resin, Teflon resin, polyimide resin, resist, wax, BCB, or the like, or covering the surface of the insulating layer 32 with a hydrophobic material, such as fluoropolymer, silicone resin, Teflon resin, polyimide resin, resist, wax, BCB, or the like.

Next, the thin water films 101 are formed on the hydrophilic regions 92a formed in the connecting portions R2 of the chips 37. This can be easily realized by dipping entirely the chips 37 or partially the vicinities of the surfaces of the chips 37 into water and taking them out of the water. Due to the dipping into the water, water is attached to the surfaces of the hydrophilic regions 92a of the respective chips 37 faced downward, resulting in the thin water films 101 each covering the whole surface of the hydrophilic region 92a, as shown in FIG. 18(a). These water films 101 are naturally curved mildly convexly due to the surface tension. It is preferred that the amount of the water to be attached to the respective hydrophilic regions 92a is adjusted, for example, in such a way that the water films 101 covering the entire electrodes 36 are formed on the respective hydrophilic regions 92a. At this time, the water does not attached to the chips 37 except for the connecting portions R2. This is because hydrophobic single-crystal silicon is exposed except for the connecting portions R2 of the chips 37.

Next, as shown in FIG. 18(b), the connecting portions R2 of the semiconductor chips 37 where the water films 101 have been formed on the lower surfaces of the hydrophilic regions 92a are placed on the corresponding connecting portions R1 where the water films 101 have been formed on the surfaces of the hydrophilic regions 91a. This step can be carried out using a known chip bonder. Then, the water film 101 on each connecting portions R2 is coupled and unified with the water film 101 on the corresponding connecting portions R1. At this time, it is not always necessary to position correctly each chip 37 on the corresponding connecting portion R1. This is because even if the position of the chip 37 is slightly deviated from the position of the corresponding connecting portion R1 horizontally (i.e., in the direction parallel to the support substrate 31) (see FIG. 15(d)), the position of the chip 37 automatically agrees with that of the corresponding connecting portion R1 due to the action of the surface tension.

Subsequently, a pressing plate (not shown) with a rigidity is contacted with the opposite ends (reverses) of all the chips 37 to their connecting portions R2 and then, all the chips 13 are pressed toward the support substrate 31. Then, the electrodes 36 of each connecting portion R2 are contacted with the corresponding electrodes 35 while almost all the water existing between the connecting portions R2 of the respective chips 37 and the corresponding connecting portions R1 is pushed out. As a result, the connecting portions R2 are brought into approximately intimate contact with the corresponding connecting portions R1. Thus, the respective chips 37 are opposed and contacted in this state by the absorption force induced by the water remaining in the gaps between the connecting portions R2 and the connecting portions R1. The state at this time is shown in FIG. 18(b).

The state shown in FIG. 18(b) is the same as the state where the chips 37 are opposed to the insulating layer 32 on the support substrate 31 shown in FIG. 8(a) in the first embodiment, although the orientation is vertically overturned. Thereafter, in the same manner as that described in the aforementioned third embodiment, the connecting portions R2 of the respective chips 37 are fixed to the corresponding connecting portions R1 on the support substrate 11. The state at this time is substantially the same as that of FIG. 8(a). The water remaining in the gaps between the hydrophilic regions 91a and 92a evaporates to disappear due to the heat applied in or before the step of fixing the microbump electrodes 35 and 36.

The chips 37 are opposed to and contacted with the insulating layer 32 on the support substrate 31 that is faced upward in FIGS. 18(a) and 18(b); however, the said embodiment is not limited to this. The chips 37 that are faced upward may be opposed to and contacted with the insulating layer 32 on the support substrate 31 that is faced downward.

After the fixing of the chips 37 to the insulating layer 32 on the support substrate 31 is completed, as shown in FIG. 8(b), the gaps among the chips 37 are filled with a liquid or fluid adhesive 38 and then, the adhesive 38 is cured by applying heat, irradiating ultraviolet rays, or the like. Subsequently, the first semiconductor circuit layer L1 is formed in the same manner as that aforementioned in the third embodiment (see FIG. 9(c)).

The steps of respectively fixing the semiconductor chips to the surfaces of the first and second semiconductor circuit layers L1 and L2 can be substantially the same as the aforementioned step shown in FIGS. 9(c) to 10(e). Here, the step of opposing and contacting the semiconductor chips 49 constituting the third semiconductor circuit layer L3 with the surface of the second semiconductor circuit layer L2 at the predetermined positions thereof will be explained below with reference to FIGS. 19(a) and 20(b).

The semiconductor chips 43 constituting the second semiconductor circuit layer L2 and the adhesive 44 filled into the gaps among them are covered with the insulating layer 45, as shown in FIG. 19(a). Thin film-shaped hydrophilic regions 95a are formed on the respective connecting portions R1 formed at the desired positions on the insulating layer 45. The total number of the hydrophilic regions 95a is equal to the total number of the chips 49 (here, only the three regions 95a are shown) that constitute the third semiconductor circuit layer L3. The size and shape of each hydrophilic region 95a are approximately in accordance with the size and shape (here, rectangular shape) of the chip 49 (correctly speaking, the connecting portion R2 formed on the surface of the chip 49) to be placed thereon, respectively. Accordingly, if a hydrophilic region 96a of each chip 49 is opposingly disposed to the corresponding hydrophilic region 95a, the layout of the chips 49 will be a desired layout of the chips 49 on the second semiconductor circuit layer L2.

A necessary number of microbump electrodes 47 are formed in each of the hydrophilic regions 95a. The height of the electrodes 47 is greater than that of the hydrophilic regions 95a and therefore, the tops of the electrodes 47 are protruded from the hydrophilic regions 95a. This is to make it possible to electrical and mechanical connection between the electrodes 47 and microbump electrodes 48 formed on the semiconductor chips 49.

The hydrophilic regions 95a on the insulating layer 45 can be easily formed by the same method as described for the hydrophilic regions 91a.

On the other hand, the thin film-shaped hydrophilic regions 96a are formed in the connecting portions R2 on the surfaces of the respective semiconductor chips 49, as shown in FIG. 19(a). The hydrophilic region 96a covers the whole surface of the chip 49. The size and shape of the hydrophilic region 96a are approximately in accordance with the size and shape (here, rectangular shape) of the surface (the connecting portion R2) of the chip 49 on which the hydrophilic region 96a is placed. A necessary number of the microbump electrodes 48 are formed in each of the hydrophilic regions 96a. The height of the electrodes 48 is greater than that of the hydrophilic regions 96a and therefore, the tops of the electrodes 48 are protruded from the hydrophilic regions 96a. This is to make it possible to electrical and mechanical connection between the electrodes 48 and the microbump electrodes 47 formed on the insulating layer 45.

The hydrophilic regions 96a on the chips 49 can be formed in the same manner as the method described for the hydrophilic regions 92a.

When the connecting portions R2 of the semiconductor chips 49, which comprise the hydrophilic regions 96a, are respectively attached to the connecting portions R1 formed on the insulating layer 45, which comprise the hydrophilic regions 95a, the following step is carried out.

Specifically, first, a small amount of water is dropped on the respective hydrophilic regions 95a formed on the insulating layer 45, or the support substrate 31 is dipped into water and taken out of it. Then, since the hydrophilic regions 95a are hydrophilic, the water conforms to the whole surfaces of the regions 95a to cover the same, resulting in thin films 101 of the water as shown in FIG. 19(a). These water films 101 are naturally curved mildly convexly due to the surface tension. The amount of the water to be dropped on the respective hydrophilic regions 95a is adjusted, for example, in such a way that the water films 101 covering entirely the electrodes 47 are formed on the respective hydrophilic regions 95a. The hydrophilic regions 95a are island-shaped and apart from each other; therefore, the water will not flow to the outside from the regions 95a.

To further ensure the prevention of the flowing out of the water from the hydrophilic regions 95a, it is preferred that the surface of the insulating layer 45 is not hydrophilic. This can be realized by, for example, forming the insulating layer 45 itself by a hydrophobic material, such as fluoropolymer, silicone resin, Teflon resin, polyimide resin, resist, wax, BCB, or the like, or covering the surface of the insulating layer 45 with a hydrophobic material, such as fluoropolymer, silicone resin, Teflon resin, polyimide resin, resist, wax, BCB, or the like.

Next, the thin water films 101 are formed on the hydrophilic regions 96a formed in the connecting portions R2 of the chips 49. This can be easily realized by dipping entirely the chips 49 or partially the vicinities of the surfaces of the chips 49 into water and taking them out of the water. Specifically, due to the dipping into the water, water is attached to the surfaces of the hydrophilic regions 96a of the respective chips 37 faced downward, resulting in the thin water films 101 each covering the whole surface of the hydrophilic region 96a, as shown in FIG. 19(a). These water films 101 are naturally curved mildly convexly due to the surface tension. It is preferred that the amount of the water to be attached to the respective hydrophilic regions 96a is adjusted, for example, in such a way that the water films 101 covering the entire electrodes 48 are formed on the respective hydrophilic regions 96a. At this time, the water does not attached to the chips 49 except for the connecting portions R2. This is because hydrophobic single-crystal silicon is exposed except for the connecting portions R2 of the chips 49.

Next, as shown in FIG. 20(b), the connecting portions R2 of the semiconductor chips 49 where the water films 101 have been formed on the surfaces of the hydrophilic regions 96a are placed on the corresponding connecting portions R1 where the water films 101 have been formed on the surfaces of the hydrophilic regions 95a. This step can be carried out, for example, using a known chip bonder. Then, the water film 101 on each connecting portions R2 is coupled and unified with the water film 101 on the corresponding connecting portions R1. At this time, it is not always necessary to position correctly each chip 49 on the corresponding connecting portion R1. This is because even if the position of the chip 49 is slightly deviated from the position of the corresponding connecting portion R1 horizontally (i.e., in the direction parallel to the support substrate 31) (see FIG. 15(d)), the position of the chip 49 automatically agrees with that of the corresponding connecting portion R1 due to the action of the surface tension.

Subsequently, a pressing plate (not shown) with a rigidity is contacted with the opposite ends (reverses) of all the chips 49 to their connecting portions R2 and then, all the chips 49 are pressed toward the support substrate 31. Then, the electrodes 48 of each connecting portion R2 are contacted with the corresponding electrodes 47 while almost all the water existing between the connecting portions R2 of the respective chips 49 and the corresponding connecting portions R1 is pushed out. As a result, the connecting portions R2 are brought into approximately intimate contact with the corresponding connecting portions R1. Thus, the respective chips 49 are opposed and contacted in this state by the absorption force induced by the water remaining in the gaps between the connecting portions R2 and the connecting portions R1. The state at this time is shown in FIG. 20(*b*).

Thereafter, in the same manner as that described in the aforementioned third embodiment, the connecting portions R2 of the respective chips 49 are fixed to the corresponding connecting portions R1 over the support substrate 11. The water remaining in the gaps between the hydrophilic regions 95*a* and 96*a* evaporates due to the heat applied in or before the step of fixing the microbump electrodes 47 and 48.

The chips 49 are attached to the insulating layer 45 over the support substrate 31 that is faced upward in FIG. 20(*b*); however, the said embodiment is not limited to this. The chips 47 may be attached to the insulating layer 45 on the support substrate 31 that is faced downward.

After the fixing of the chips 49 to the insulating layer 45 is completed in this way, the gaps among the chips 49 are filled with a liquid or fluid adhesive 50 and then, the adhesive 50 is cured by applying heat, irradiating ultraviolet rays, or the like, as shown in FIG. 10(*f*). Subsequently, the third semiconductor circuit layer L3 is formed in the same manner as described in the third embodiment.

With the method of fabricating an integrated circuit device having a three-dimensional stacked structure according to the fifth embodiment of the invention, as explained above, the same advantages as those of the fourth embodiment are obtained. Specifically, the many (e.g., several hundreds of) semiconductor chips 37, 43, and 49 can be respectively fixed easily and efficiently with desired accuracy on the support substrate 11, and the first and second semiconductor circuit layers L1 and L2 in such a way as to form the desired layouts. Moreover, the many bump electrodes 36, 42, and 48 formed respectively on the connecting surfaces of the respective chips 37, 43, and 49 with the predetermined layouts can be fixed correctly to the corresponding bump electrodes 35, 41, and 47 oppositely in a one-to-one correspondence, respectively.

Further, in the fabrication method of the fifth embodiment, regarding, for example, the first semiconductor circuit layer L1, the hydrophilic regions 91*a* and 92*a* are respectively formed on the connecting portions R1 of the support substrate 31 and the connecting portions R2 of the chips 37 in advance and then, the chips 37 are positioned at the connecting portions R1 in self-alignment utilizing the surface tension of the water films 101 attached to the hydrophilic regions 91*a* and 92*a*. Therefore, there are advantages that the necessary positioning accuracy of the chips 37 in the fixing step of the chips 37 to the connecting portions R1 can be lowered, the preparation of such a material as the sticky material used in the first embodiment is unnecessary, and the remaining water is easily removed, in addition to the above-described advantages.

In the aforementioned fifth embodiment, the water films 101 are formed on both the connections portions R1 of the support substrate 31 and the connections portions R2 of the semiconductor chips 37. However, the invention is not limited to this. Needless to say, the water films 101 may be formed on either the portions R1 or the portions R2.

As the "water" used in the fifth embodiment, similar to the second embodiment, "ultrapure water" that has been generally used in the fabrication processes of semiconductor devices is preferred. However, it is more preferred to use "ultrapure water" containing an appropriate additive for enhancing the self-aligning function to the semiconductor chips by increasing the surface tension. As the additive for increasing the surface tension, the additives described in the second embodiment may be used. Moreover, similar to the second embodiment, other inorganic or organic liquid may be used instead of "water", where a material having a "lyophilic property" for such the liquid as described here is necessarily used to form the temporary adhesion regions and the temporary adhesion portions.

Sixth Embodiment

FIGS. 21(*a*) to 22(*f*) are cross-sectional views showing in detail the step of arranging the semiconductor chips that constitute the first semiconductor circuit layer on the support substrate, which is used in a method of fabricating an integrated circuit device having a three-dimensional stacked structure according to a sixth embodiment of the invention.

In the above-described fabrication method according to the fourth embodiment (see FIGS. 15(*a*) to 17(*b*)), the "hydrophilic" connecting portions are formed in advance on the support substrate or the corresponding positions of the semiconductor circuit layer, and then, all the semiconductor chips are respectively attached to the said connecting portions without using the carrier substrate. Unlike this, in the fabrication method according to the sixth embodiment, the mounting surface of the support substrate or the semiconductor circuit layer is made "hydrophobic" in advance, and then, "hydrophilic regions" are selectively formed at predetermined positions on the said mounting surface, thereby forming "hydrophobic regions" thereon. Thereafter, semiconductor chips are attached to the hydrophobic regions in self-alignment utilizing a hydrophobic liquid.

Since the fabrication method of the sixth embodiment is the same as that of the aforementioned fourth embodiment (see FIGS. 15(*a*) to 16(*g*)) except for this semiconductor chip arrangement step, the explanation about the same steps are omitted here and only the different steps will be explained in detail below.

Specifically, first, as shown in FIG. 21(*a*), hydrophilic regions 78 are formed on the hydrophobic mounting surface 11*a* of the support substrate 11 in such a way that the regions to which the semiconductor chips 13 constituting the first semiconductor circuit layer L1 are to be attached are left thereon with a predetermined layout. Such the hydrophilic regions 78 can be easily realized by using, for example, a $SiO_2$ film with a hydrophilic property. Specifically, a $SiO_2$ film (which has a thickness of, for example, 0.1 µm) is thinly formed on the entire mounting surface 11*a* of the support substrate 11 by a known method and thereafter, the $SiO_2$ film is selectively removed by a known etching method. Moreover, the hydrophobic mounting surface 11*a* can be easily realized by forming the support substrate 11 itself by single-crystal Si, or forming a hydrophobic film (e.g., a film made of fluoropolymer, silicone resin, Teflon resin, polyimide resin, resist, wax, BCB, or the like) on the support substrate 11 to use the surface of the said hydrophobic film as the mounting surface 11*a*.

As a result, the hydrophobic mounting surface 11*a* is exposed at the positions where the hydrophilic regions 78 do not cover, thereby forming hydrophobic regions 79. The size and shape of each hydrophobic region 79 are approximately in accordance with the size and shape (here, rectangular shape) of the chip 13 (correctly speaking, the connecting portion 12 formed on the surface of the chip 13) to be placed thereon, respectively. Accordingly, if the connecting portion 12 of each chip 13 is placed on the corresponding hydrophobic region 79, the layout of the chips 13 will be equal to the desired layout of the chips 13 on the support substrate 11.

Next, a small amount of water is dropped on the hydrophilic regions 78, or the support substrate 11 is dipped into water and taken out of it, thereby wetting the respective regions 78 with water. Then, a thin film 82 of the water is formed on each of the hydrophilic regions 78, as shown in FIG. 21(a). The water films 82 are not formed on the hydrophobic regions 79.

Following this, while keeping the state of FIG. 21(a), the support substrate 11 is dipped into a hydrophobic liquid. As the hydrophobic liquid, for example, xylene, hexane, toluene, benzene, or the like may be used. Then, the hydrophobic liquid is selectively attached to the parts of the mounting surface 11a other than the hydrophilic regions 78, i.e., the hydrophobic regions 79. Thus, as shown in FIG. 21(b), a thin film 83 of the hydrophobic liquid is formed on each of the hydrophobic regions 79.

On the other hand, the same hydrophobic liquid as attached to the mounting surface 11a is attached to the surfaces of the connecting portions 12 of the respective semiconductor chips 13, thereby forming a thin film 83 of the hydrophobic liquid on each of the said surfaces, as shown in FIG. 21(c). This step can be easily carried out by, for example, dipping entirely the chips 13 or dipping partially the vicinities of the connecting portions 12 of the chips 13 into the hydrophobic liquid and taking them out of the water. If the single-crystal silicon (which has a hydrophobic property) is exposed on the surfaces of the connecting portions 12 of the respective chips 13, the hydrophobic liquid is attached to the connecting portions 12 to form the films 83 in the as-is status. However, if the surface of each connecting portion 12 is covered with a hydrophilic material (e.g., $SiO_2$), the said surface needs to be covered with a film of appropriate hydrophobic material. As such the appropriate hydrophobic material, polycrystalline silicon, amorphous silicon, fluoropolymer, silicone resin, Teflon resin, polyimide resin, resist, wax, BCB, or the like may be used.

Thereafter, the connecting portions 12 of these chips 13 are faced downward and placed on the corresponding hydrophobic regions 79 on the mounting surface 11a. Then, the hydrophobic liquid film 83 on each chip 13 is unified with the hydrophobic liquid film 83 on the hydrophobic region 79 (the mounting surface 11a) and as a result, the respective chips 13 are held on the corresponding hydrophobic regions 79 by way of the hydrophobic liquid films 83, as shown in FIG. 22(d). At this time, the horizontal positions of the respective chips 17 are regulated by the hydrophilic regions 78 on the mounting surface 11a.

Next, as shown in FIG. 22(e), all the chips 13 are pressed toward the support substrate 11 using a pressing plate 180 set in a position parallel to the support substrate 11. Thus, the hydrophobic liquid existing between the connecting portions 12 of the chips 13 and the mounting surface 11a is pushed out, and the hydrophobic liquid films 83 disappear. As a result, the connecting portions 12 of the chips 13 are brought into intimate contact with the mounting surface 11a by the hydrophobic liquid remaining between the connecting portions 12 and the mounting surface 11a.

Then, the connecting portions 12 of the respective chips 13 are fixed to the corresponding positions on the support substrate 11 by the same method as used in the third embodiment. Since the hydrophobic liquid remaining between the connecting portions 12 of the chips 13 and the mounting surface 11a and the water existing on the hydrophilic regions 78 evaporate due to the heat applied during or before the said fixing step, the said fixing step is not affected by these liquids.

After the fixing of the chips 13 to the support substrate 11 is completed, the pressing plate 180 is detached from the chips 13. The state at this time is shown in FIG. 22(f).

In FIGS. 21(a) to 22(f), the fixing step of the semiconductor chips 13 that constitute the first semiconductor circuit layer L1 is shown. However, the method of bringing the chips 13 into intimate contact with the support substrate 11 utilizing the hydrophobic liquid is applied to the semiconductor chips 37 that constitute the second semiconductor circuit layer L2 and the semiconductor chips 19 and 22 that constitute respectively the third and fourth semiconductor circuit layers L3 and L4 in the same way.

As apparent from the above explanation, with the method of fabricating an integrated circuit device having a three-dimensional stacked structure according to the sixth embodiment of the invention, the same advantages as those of the method according to the aforementioned fourth embodiment are obtained.

In addition, for example, the hydrophobic liquid films 83 are formed on both the hydrophobic regions 79 of the support substrate 11 and the connecting portions 12 of the semiconductor chips 13 in the said sixth embodiment. However, the said embodiment is not limited to this. Needless to say, the hydrophobic liquid films 83 may be formed on either the hydrophobic regions 79 or the connecting portions 12.

As the "water" used in the sixth embodiment, similar to the second embodiment, "ultrapure water" that has been generally used in the fabrication processes of semiconductor devices is preferred. Moreover, similar to the second embodiment, other inorganic or organic liquid may be used instead of "water", where a material having a "lyophilic property" for such the liquid as described here is necessarily used to form the temporary adhesion regions and the temporary adhesion portions.

The said sixth embodiment using the hydrophilic regions and the hydrophobic regions is of the "non-transfer type". However, this embodiment may be applied to the "transfer type" (the first to third embodiments). For example, although the hydrophilic regions 78 and the hydrophobic regions 79 are formed on the support substrate 11 in the sixth embodiment, if the hydrophilic regions 78 and the hydrophobic regions 79 are formed on the carrier substrate serving as the transferring member, the sixth embodiment of the transfer type may be easily realized.

Seventh Embodiment

FIGS. 30(a) to 30(c) and FIG. 31 are cross-sectional views showing in detail the step of arranging the semiconductor chips that constitute the first semiconductor circuit layer on the support substrate, which is used in a method of fabricating an integrated circuit device having a three-dimensional stacked structure according to a seventh embodiment of the invention.

In the fabrication methods according to the above-described first to sixth embodiments, the semiconductor chips are individually arranged at the predetermined positions on the carrier substrate, the support substrate, or the semiconductor circuit layer. However, the invention is not limited to these. Specifically, a necessary number of the semiconductor chips may be collectively arranged at the predetermined positions on the carrier substrate, the support substrate, or the semiconductor circuit layer using an appropriate tray on which a necessary number of the semiconductor chips are mountable. The fabrication method according to the seventh embodiment is shown as an example of this.

With the fabrication method according to the seventh embodiment, a tray 200 for collective placement shown in FIG. 30(a) and FIG. 31 is used. This tray 200 comprises a body 201 having a rectangular plan shape. In the outside of the body 201, an outer wall 202 is formed along the entire periphery of the body 201. An inner space 207 is formed in the body 201. The surface of an upper wall 203 of the body 201 is partitioned by partition walls 204, thereby forming rectangular chip placement regions 205. These chip placement regions 205 are located inside of the outer wall 202. A small hole 206 is formed in each of the chip placement regions 205, where the hole 206 penetrates through the upper wall 203 to reach the inner space 207 and is located approximately at the center of the region 205. An air supply/emission port 208 communicating with the inner space 207 is formed at the bottom of the body 201. By evacuating the air existing in the inner space 207 with a vacuum pump by way of the air supply/emission port 208, a desired vacuum state can be generated in the inner space 207. For this reason, the semiconductor chips placed on the chip placement regions 205 can be held by vacuum suction, and the said semiconductor chips can be detached from the chip placement regions 205 by canceling the vacuum suction. The height of the outer wall 202 is set to be higher than the chips 13 to be placed on the chip placement regions 205.

Next, the fabrication method of the seventh embodiment using the tray 200 having the aforementioned structure is explained below. Here, the case where the semiconductor chips 13 are collectively placed on the carrier substrate 73a using the tray 200 in the fabrication method of the above-described second embodiment (see FIGS. 6(a) to 7(g)) is explained.

First, a necessary number of the semiconductor chips 13 are individually placed on the chip placement regions 205 of the tray 200 faced upward. Then, the air existing in the inner space 207 is evacuated by way of the air supply/emission port 208, thereby generating a predetermined vacuum state in the inner space 207. At this time, the air existing in the vicinities of the chips 13 is evacuated by way of the small hole 206 and the inner space 207 and therefore, the respective chips 13 are sucked onto the surfaces of the chip placement regions 205 (the upper wall 203). In this way, the respective chips 13 are held at the predetermined positions on the tray 200 by the so-called "vacuum suction". The state at this time is shown in FIG. 30(a) and FIG. 31. (To facilitate the understanding the structure of the chip placement regions 205, the semiconductor chips 13 are partially removed in FIG. 31.)

The arrangement of the chips 13 on the tray 200 is determined in such a way that the layout of the chips 13 is equivalent to a mirror image of a layout on the carrier substrate 73a (i.e., a desired layout on the support substrate 11). To facilitate the illustration, the chip placement regions 205 are arranged to form a checkered pattern in FIG. 31. However, it is needless to say that the layout of the chips 13 on the tray 200 may be changed appropriately according to the necessary layout.

Each of the chip placement regions 205 has the same rectangular shape as the chip 13; however, the size of the region 205 is slightly larger than that of the chip 13 for facilitating the placement of the chips 13. For this reason, a gap of approximately 1 μm to several hundreds of micrometers is usually formed between the chip 13 and the partition wall 204 on the periphery thereof.

Next, the tray 200 on which the chips 13 have been held by suction is faced downward and dipped into water, or water is dropped on the chips 13 held by suction on the tray 200 faced upward, thereby forming thin films 81 of water on the temporary adhesion portions 12b of the respective chips 13. On the other hand, thin films 81 of water are formed on the temporary adhesion regions 72a on the carrier substrate 73a.

Thereafter, the tray 200 is faced downward and brought near the carrier substrate 73a faced upward, as shown in FIG. 30(b). In this state, the shortest distance between the chips 13 and the carrier substrate 73a is set at, for example, 500 μm. Then, positional alignment is carried out in such a way that the respective chips 13 are positioned right over the corresponding temporary adhesion regions 72a in a predetermined orientation. After the positional alignment is completed, the air is introduced into the inner space 207 of the tray 200 to cancel the vacuum state, or the air is introduced into the inner space 207 to apply a pressure thereto to stop the vacuum suction, thereby causing the chips 13 to fall naturally from the tray 200 in a lump.

As a result, the respective chips 13 are placed over the corresponding temporary adhesion regions 72a by way of the water films 81, resulting in the state shown in FIG. 30(c). This state is the same as that of FIG. 7(e). At this time, the positional alignment between the chips 13 and the temporary adhesion regions 72a is automatically performed by the surface tension of the water.

Since the steps subsequent to that of FIG. 30(c) are the same as those in the second embodiment, the explanation about them is omitted here.

With the fabrication method of the seventh embodiment, as explained above, a necessary number of the semiconductor chips 13 are collectively placed on the carrier substrate 73a using the tray 200 and therefore, there is an advantage that the working hours can be shortened significantly compared with the case where the chips 13 are placed individually.

Although the seventh embodiment is of the "transfer type" using the carrier substrate, it is needless to say that the tray 200 may be used also in the "non-transfer type" without using the carrier substrate. In this case, for example, the support substrate 11 may be used instead of the carrier substrate 73a, where the other steps are the same as those of the seventh embodiment. Undoubtedly, the plan shape of the tray 200 may be changed optionally according to the necessity.

Eighth Embodiment

FIGS. 32(a) and 32(b) are cross-sectional views showing in detail the step of arranging the semiconductor chips that constitute the first semiconductor circuit layer on the carrier substrate, which is used in a method of fabricating an integrated circuit device having a three-dimensional stacked structure according to an eighth embodiment of the invention.

With the eighth embodiment, a tray 200a for collective placement is used similar to the seventh embodiment. However, the eighth embodiment is different from the seventh embodiment in that the water films 81 on the chips 13 are contacted with the water films 81 on the temporary adhesion regions 72a when the respective chips 13 are placed on the corresponding temporary adhesion regions 72a.

Specifically, similar to the seventh embodiment, the tray 200a on which a necessary number of the semiconductor chips 13 have been placed is faced downward and brought near the carrier substrate 73a faced upward. Then, positional alignment is carried out in such a way that the respective chips 13 are positioned right over the corresponding temporary adhesion regions 72a (see FIGS. 32(a) and 32(b)). Thereafter, the tray 200a is lowered further, thereby bringing the water films 81 on the respective chips 13 into contact with the water films 81 on the corresponding temporary adhesion regions 72a, as shown in FIG. 32(c). Subsequently, by introducing the air into the inner space 207 of the tray 200a or applying a pressure to the inner space 207, the vacuum suction is stopped, thereby detaching the chips 13 from the tray 200a collectively. Finally, the tray 200a is lifted for separating it from the carrier substrate 73a.

As a result, the respective chips 13 are placed on the corresponding temporary adhesion regions 72a by way of the water films 81, resulting in the same state as shown in FIG. 7(e). At this time, the positional alignment between the chips 13 and the temporary adhesion regions 72a is automatically performed by the surface tension of the water.

Since the steps subsequent to that of FIG. 32(c) are the same as those in the second embodiment shown in FIGS. 7(f) and 7(g), the explanation about them is omitted here.

With the fabrication method of the eighth embodiment, it is apparent that the same advantages as those of the seventh embodiment are obtained.

Although the eighth embodiment is of the "transfer type" using the carrier substrate, it is needless to say that the tray 200a may be used also in the "non-transfer type" without using the carrier substrate. In this case, for example, the support substrate 11 may be used instead of the carrier substrate 73a, where the other steps are the same as those of the eighth embodiment. Undoubtedly, the plan shape of the tray 200a may be changed optionally according to the necessity.

The structure of the tray 200a is the same as that of the tray 200 used in the seventh embodiment except that the height of the outer wall 202 is smaller than that of the tray 200. The smaller height of the outer wall 202 is adopted to prevent an obstruction such as the contact with the carrier substrate 73a when the water films 81 on the respective chips 13 are contacted with the water films 81 on the corresponding temporary adhesion regions 72a.

The fabrication method of the eighth embodiment may be used for collective placement of the temporary adhesion portions 12a of the chips 13 on the temporary adhesion regions 12a formed by a sticky material, like the fabrication method of the aforementioned first embodiment.

Ninth Embodiment

FIGS. 33(a) to 34(b) are partial cross-sectional views showing a position correction method of the semiconductor chips, which is used in a method of fabricating an integrated circuit device having a three-dimensional stacked structure according to a ninth embodiment of the invention. This fabrication method corresponds to an improved example of the fabrication method of the aforementioned fifth embodiment (see FIGS. 18(a) to 20(b)).

In the fabrication method according to the fifth embodiment, regarding the support substrate 31, the respective semiconductor chips 37 are placed over the corresponding temporary adhesion regions 91a by way of the water films 101, and the positions of the chips 37 are aligned using the surface tension of water. However, a positional deviation that is beyond the permissible range in a horizontal direction (a direction parallel to the support substrate 31) may occur because the positions of the chips 37 and the temporary adhesion regions 91a are unable to be conformed to a desired extent by the surface tension. Such the positional deviation can be corrected easily by the fabrication method of the ninth embodiment.

First, it is supposed that when the respective semiconductor chips 37 are placed on the corresponding temporary adhesion regions 91a by way of the water films 101, a positional deviation in a horizontal direction (a direction parallel to the support substrate 31) is left, as shown in FIG. 33(a), notwithstanding the positional alignment has been carried out by the surface tension. This state corresponds to FIG. 18(b).

Next, the chips 37 are pressed toward the support substrate 31 using the pressing plate 180 (see FIG. 33(b)) and then, the microbump electrodes 35 and 36 are melted by heating and re-solidified while keeping the said state. Thus, as shown in FIG. 34(c), the electrodes 35 and 36 are bonded by fusion welding where the positional deviation is left unchanged. If such the positional deviation is left, there is a high possibility that a defective device is produced.

Therefore, in such the case, after the pressing action by the pressing plate 180 is stopped, the electrodes 35 and 36 are heated again for melting them again. Then, self-alignment is carried out by the surface tension of the electrodes 35 and 36 thus melted and as a result, the positional deviation between the electrodes 35 and 36 disappears. Thereafter, the melted electrodes 35 and 36 are re-solidified in this state. In this way, the positions of the electrodes 35 and 36 can be accorded with each other correctly, as shown in FIG. 34(d).

The method of the ninth embodiment can be applied to any other embodiment than the fifth embodiment if it includes the step of bonding the electrodes by "fusion welding". The orientation of the support substrate 31 may be faced downward.

Tenth Embodiment

FIGS. 35(a) and 35(b) are partial cross-sectional views showing a position correction method of the semiconductor chips, which is used in a method of fabricating an integrated circuit device having a three-dimensional stacked structure according to a tenth embodiment of the invention. This fabrication method corresponds to an improved example of the fabrication method of the aforementioned third embodiment (see FIGS. 8(a) to 13(b)).

Specifically, in the step of bonding (fixing) the semiconductor chips 37 to the mounting surface (lower surface) of the support substrate 31 using the microbump electrodes 35 and 36 (see FIG. 8(a)), "fusion welding" can be used where the electrodes 35 and 36 are melted by heating and re-solidified. Here, it is supposed that a positional deviation in a horizontal direction (a direction parallel to the support substrate 31) that is beyond the permissible range occurs between the electrodes 35 and 36, as shown in FIG. 35(a).

In such the case, the electrodes 35 and 36 are melted again by re-heating in the tenth embodiment. In this state, self-alignment is carried out by the surface tension of the electrodes 35 and 36 thus melted and as a result, the positional deviation between the electrodes 35 and 36 disappears. Thereafter, the melted electrodes 35 and 36 are re-solidified in this state. In this way, the positions of the electrodes 35 and 36 can be accorded with each other correctly, as shown in FIG. 35(b).

The method of the tenth embodiment can be applied to any other embodiment than the third embodiment if it includes the step of bonding the electrodes by "fusion welding". The orientation of the support substrate 31 may be faced upward.

Eleventh Embodiment

FIGS. 36(a) and 36(b) and FIG. 37 are partial cross-sectional views showing an integrated circuit device fabrication apparatus 300 according to an eleventh embodiment of the invention. This fabrication apparatus 300 has a capability that semiconductor chips are collectively arranged on the carrier substrate with a desired layout using a tray for collective placement. Any one of the fabrication methods according to the above-described first to tenth embodiments can be performed using the apparatus 300.

The fabrication apparatus 300 comprises a control stage 302 in a body 301, as shown in FIG. 36(a). The control stage 302 is capable of translational motions in two directions (X direction and Y direction) intersecting at right angles in a horizontal plane and a vertical direction (Z direction) perpendicular to the said horizontal plane, and a rotational motion (θ direction) in the said horizontal plane. In other words, the apparatus 300 is capable of four-axis control around the X, Y, Z, and θ axes. The control stage 302 has two operation (control) states of the rough mode and the minute mode, which are changeable as necessary. Usually, rough positioning or alignment is carried out in the rough mode and thereafter, the operation is switched to the minute mode for precision positioning or alignment.

A support table 303 is fixed on the upper surface (the mounting surface) of the control stage 302. A cavity is formed in approximately the central part of the support table 303. An infrared lamp 304, which is used as a light source, is mounted in the cavity.

A vacuum chuck 305, on which the carrier substrate or the support substrate used in one of the aforementioned first to tenth embodiments is to be placed and held, is fixed on the support table 303. The inside of the vacuum chuck 305 is vacant. Small holes 305a are formed in the upper wall of the chuck 305. An air supply/emission port 305b is formed at one end of the chuck 305. By evacuating the air existing in the inner space 305d by way of the air supply/emission port 305b to generate a desired vacuum state in the space 305d, the carrier substrate or the support substrate placed on the placement surface (upper surface) 305c of the chuck 305 can be secured at that position. On the other hand, by introducing the air into the inner space 305d by way of the air supply/emission port 305b to break the vacuum state, the securing of the said carrier substrate or the said support substrate can be released. In FIG. 36(a), the state where the carrier substrate 73a used in the seventh embodiment is placed and secured on the placement surface 305c is shown. The vacuum chuck 305 is made of a material through which the infrared rays emitted from the infrared lamp 304 will transmit (e.g., quartz).

A tray holding system (means) for holding a tray 200b for collective placement in its horizontal state at the position right over the vacuum chuck 305 is provided in the upper part of the body 301. Here, only arms protruding inwardly from the upper end of the body 301 are shown. The tray 200b is engaged with these arms using an appropriate engaging means (e.g., screws, hooks), thereby holding the tray 200b in the horizontal state. At this time, appropriate gaps are formed between the semiconductor chips 13 held by the tray 200b and the temporary adhesion regions 72a held by the carrier substrate 73a, as shown in FIG. 36(a). The tray 200b is made of a material through which the infrared rays emitted from the infrared lamp 304 will transmit (e.g., quartz).

The structure of the tray 200b is the same as that of the tray 200 used in the seventh embodiment except that the outer wall 202 protruding from the body 201 is not present. Therefore, the explanation about the same structure is omitted here by attaching the same reference signs to the same elements. In FIGS. 36(a) and 36(b), the partition walls 204 are omitted for simplifying the illustration.

A CCD camera (a camera using Charge-Coupled Devices as sensors) 306 as an image pickup device is provided at the position approximately right over the infrared lamp 304 above the tray holding system (means). This is to detect the infrared light emitted from the lamp 304. The camera 306 converts the infrared light thus detected to an electric signal and then, sends the said electric signal to a computer 307 as an arithmetic unit, where predetermined data processing is executed. In this way, the positions of the temporary adhesion regions 72a on the carrier substrate 73a held on the vacuum chuck 305 are aligned with those of the semiconductor chips 13 held on the tray 200b in a one-to-one correspondence with a predetermined accuracy.

To facilitate the said alignment operation, alignment marks (not shown) are respectively formed on the chips 13 or the tray 200b and the carrier substrate 73a. The positions of the temporary adhesion regions 72a on the carrier substrate 73a and those of the semiconductor chips 13 on the tray 200b can be aligned with each other in a one-to-one correspondence by detecting the alignment marks using the CCD camera 306, making fine adjustments of the position of the control stage 302 in such a way that the alignment marks on the chips 13 or the tray 200b and the alignment marks on the carrier substrate 73a have a predetermined positional relationship, and fixing the control stage 302.

Next, the operation of the fabrication apparatus 300 having the above-described structure will be explained below, where the fabrication method according to the aforementioned seventh embodiment is carried out.

First, as shown in FIG. 36(a), the carrier substrate 73a is placed at the predetermined position on the placement surface 305c of the vacuum chuck 305. A vacuum state is then generated in the inner space 305d to fix the carrier substrate 73a at the said position. At this time, by dipping the carrier substrate 73a into pure water before fixing the carrier substrate 73a on the placement surface 305c, or by dropping pure water drops on the carrier substrate 73a after fixing it on the placement surface 305c, the water films 81 are attached to the respective temporary adhesion regions 72a in advance. On the other hand, in the same manner as described in the seventh embodiment, the semiconductor chips 13 are respectively placed on the chip placement regions 205 of the tray 200b. Then, the semiconductor chips 13 are held on the chip placement regions 205 by vacuum suction and thereafter, the tray 200b is turned upside down and held at the upper part of the body 301 using the tray holding system. At this time, before holding the tray 200b to the upper part of the body 301, the water films 81 are attached to the respective temporary adhesion portions 12b in advance by dipping the tray 200b into pure water or other method. Subsequently, the infrared lamp 304 is turned on to emit infrared rays. Using the infrared rays penetrating through the vacuum chuck 305, the carrier substrate 73a and the tray 200b, the image of the superposing state between the semiconductor chips 13 and the temporary adhesion regions 72a is picked up with the CCD camera 306.

Further, the control stage 302 is moved in the rough mode while picking up the images with the CCD camera 306, thereby making the positions of the temporary adhesion regions 72a on the carrier substrate 73a in approximately accordance with those of the semiconductor chips 13 on the tray 200b. Thereafter, the operation of the control stage 302 is switched to the minute mode for minute adjustment between the positions of the temporary adhesion regions 72a and those of the chips 13. In this way, the positional alignment between the between the temporary adhesion regions 72a on the carrier substrate 73a and the chips 13 on the tray 200b is completed.

Subsequently, the air is introduced into the inner space 207 of the tray 200b, thereby causing the semiconductor chips 13 to fall naturally. As a result, as shown in FIG. 36(b), the respective semiconductor chips 13 are placed on the corresponding temporary adhesion regions 72a by way of the water films 81.

After the natural falling of the chips 13 from the tray 200*b* in this way, the tray 200*b* is detached from the tray holding system, and the pressing plate 180 is attached to the tray holding system instead. By moving the control stage 302 upward, the connecting portions 12 of the chips 13 placed on the temporary adhesion regions 72*a* by way of the water films 81 are pressed against the lower surface of the pressing plate 180. Thus, the water films 81 are removed, and the connecting portions 12 of the chips 13 and the temporary adhesion regions 72*a* are brought into intimate contact.

After making the intimate contact between the connecting portions 12 of the chips 13 and the temporary adhesion regions 72*a*, the control stage 302 is lowered to detach the chips 13 from the pressing plate 180. Then, the air is introduced into the inner space 305*d* of the vacuum chuck 305, thereby detaching the carrier substrate 73*a* from the chuck 305 of the fabrication apparatus 300. Thereafter, the carrier substrate 73*a* on which the chips 13 have been placed is transferred to a known stacking apparatus, where the chips 13 are electrically and mechanically connected to the mounting surface of the support substrate or the corresponding semiconductor circuit layer using the microbump electrodes.

As explained above, with the fabrication apparatus 300 according to the eleventh embodiment of the invention, the semiconductor chips 13 can be collectively placed on the carrier substrate 73*a* with a desired layout and therefore, the apparatus 300 can be effectively used to perform the fabrication method of the aforementioned seventh embodiment.

In the apparatus 300, the semiconductor chips 13 may be collectively placed on the support substrate 11 instead of the carrier substrate 73*a*. The situation of this case is shown in FIGS. 39(*a*) and 39(*b*) and FIG. 40. Since the operation in this case is the same as the case where the carrier substrate 73*a* is used, the explanation is omitted here.

Twelfth Embodiment

FIG. 38 is a partial cross-sectional view showing an integrated circuit device fabrication apparatus 300*a* according to a twelfth embodiment of the invention. This fabrication apparatus 300*a* is also used for performing the fabrication methods according to the above-described first to tenth embodiments.

The fabrication apparatus 300*a* has approximately the same structure as that of the fabrication apparatus 300 shown in FIG. 36(*a*). The apparatus 300*a* is different from the apparatus 300 in that two CCD cameras 306*a* and 306*b* are provided between the vacuum chuck 305 and the tray 200*b* for collective placement, and that the infrared lamp is omitted. Therefore, the explanation is omitted here by attaching the same reference signs as those used in FIG. 36(*a*) to the same components.

With the fabrication apparatus 300*a*, the temporary adhesion regions 72*a* on the carrier substrate 73*a* and the chips 13 on the tray 200*b* are detected using the two CCD cameras 306*a* and 306*b* provided between the vacuum chuck 305 and the tray 200*b*, thereby performing the positional alignment between them. Accordingly, there in an advantage that an advantage that the vacuum chuck 305 and the tray 200*b* need not be made of a material through which the infrared rays transmit.

In the fabrication apparatus 300*a* also, although not shown, the semiconductor chips 13 may be collectively placed on the support substrate 11 instead of the carrier substrate 73*a*.

Variations

The above-described first to twelfth embodiments are disclosed to show concrete examples of the invention and therefore, the invention is not limited to these embodiments, and various modifications are possible without departing from the spirit of the invention. For example, in the above-described embodiments, semiconductor chips as KGDs are used for each semiconductor circuit layer. However, it is unnecessary that all the chips included in each semiconductor circuit layer are KGDs. Regarding the part that is unable to be omitted in the fabrication processes due to the structures of the other parts and that is unnecessary as the circuit functions, it is needless to say that a so-called dummy chip may be used.

Moreover, the step of the "transfer type" and that of the "non-transfer type" may be carried out in combination. For example, one of the aforementioned "transfer type" steps may be performed to form one of the semiconductor circuit layers that constitute the integrated circuit device, and one of the aforementioned "non-transfer type" steps may be performed to form another of the said semiconductor circuit layers.

INDUSTRIAL APPLICABILITY

The present invention is applicable to any integrated circuit device with a three-dimensional stacked structure if it is an integrated circuit device having a three-dimensional stacked structure formed by stacking a plurality of circuit layers on a support substrate, where a plurality of chip-shaped semiconductor circuits are fixed to the support substrate or a desired one of the circuit layers with a predetermined layout.

The invention claimed is:

1. A method of fabricating an integrated circuit device having a three-dimensional stacked structure formed by stacking circuit layers on a support substrate, the method comprising the steps of:
   (a) when fixing chip-shaped semiconductor circuits included in one of the circuit layers on a mounting surface of the support substrate, or other of the circuit layers that is adjacent to the one of the circuit layers to have a desired layout,
      (i) forming one or more temporary adhesion regions on a surface of a support member for transfer;
      (ii) forming a temporary adhesion portion that can be temporarily adhered to the one or more temporary adhesion regions, at an opposite end of each of the chip-shaped semiconductor circuits to a connecting portion thereof;
      (iii) collectively placing the chip-shaped semiconductor circuits at the same time as one lump on the support member so as to have a layout equivalent to a mirror image of the desired layout by temporarily adhering the temporary adhesion portion of each of the chip-shaped semiconductor circuits to the one or more temporary adhesion regions, wherein the semiconductor circuits are temporarily adhered to the one or more temporary adhesion regions of the support member for transfer using an absorption force of a liquid, and when the temporary adhesion portions of the semiconductor circuits are temporarily adhered to the one or more temporary adhesion regions, the semiconductor circuits are self-aligned in position by surface tension of the liquid;
      (iv) bringing collectively the temporary adhesion portions of the chip-shaped semiconductor circuits into contact with the mounting surface at corresponding predetermined positions of the mounting surface by causing the support member on which the chip-shaped semiconductor circuits have been placed to approach the mounting surface of the support substrate or the other of the circuit layers; and (v) disposing the chip-shaped semiconductor circuits on the mounting surface to have the desired layout by fixing the connecting portions of the chip-shaped semiconductor circuits to the corresponding predetermined positions of the mounting surface that have been brought into contact with each other; and (b) detaching the support member from the temporary adhesion portions of the chip-shaped semiconductor circuits by separating the support member from the support substrate or the other of the circuit layers, wherein the total number of the temporary adhesion regions of the support member for transfer is equal to that of the semiconductor circuits, and the semiconductor circuits and the temporary adhesion regions are in a one-to-one correspondence, and wherein the semiconductor circuits are temporarily adhered to the temporary adhesion regions through the steps of (A) forming films of the liquid on at least one of the opposite ends of the semiconductor circuits to the connecting portions and the one or more temporary adhesion regions corresponding to the at least one of the opposite ends;

(B) respectively linking the opposite ends of the semiconductor circuits with the corresponding one or more temporary adhesion regions in an opposed state thereof using the films of the liquid; and (C) respectively bringing the opposite ends into contact with the corresponding one or more temporary adhesion regions by applying a pressing force to between the opposite ends and the corresponding one or more temporary adhesion regions, thereby temporarily adhering the semiconductor circuits to the corresponding temporary adhesion regions in a detachable manner.

2. The method according to claim 1, wherein an additive for enhancing the surface tension of the liquid is added to the liquid.

3. The method according to claim 1, wherein water is used as the liquid.

4. The method according to claim 3, wherein an additive for enhancing the surface tension of the liquid is added to the water.

5. The method according to claim 1, wherein temporary connecting portions of the semiconductor circuits are formed by sticky material.

6. The method according to claim 1, wherein the temporary adhesion regions are defined by a film selectively formed on the surface of the support member for transfer using a material having a lyophilic property for the liquid, or a material not having a lyophilic property for the liquid.

7. A method of fabricating an integrated circuit device having a three-dimensional stacked structure formed by stacking circuit layers on a support substrate, the method comprising the steps of:

(a) when fixing chip-shaped semiconductor circuits included in one of the circuit layers on a mounting surface of the support substrate, or other of the circuit layers that is adjacent to the one of the circuit layers to have a desired layout, (i) forming one or more temporary adhesion regions on a surface of a support member for transfer;

(ii) forming a temporary adhesion portion that can be temporarily adhered to the one or more temporary adhesion regions, at an opposite end of each of the chip-shaped semiconductor circuits to a connecting portion thereof;

(iii) collectively placing the chip-shaped semiconductor circuits at the same time as one lump on the support member so as to have a layout equivalent to a mirror image of the desired layout by temporarily adhering the temporary adhesion portion of each of the chip-shaped semiconductor circuits to the one or more temporary adhesion regions, wherein the semiconductor circuits are temporarily adhered to the one or more temporary adhesion regions of the support member for transfer using an absorption force of a liquid, and when the temporary adhesion portions of the semiconductor circuits are temporarily adhered to the one or more temporary adhesion regions, the semiconductor circuits are self-aligned in position by surface tension of the liquid;

(iv) bringing collectively the temporary adhesion portions of the chip-shaped semiconductor circuits into contact with the mounting surface at corresponding predetermined positions of the mounting surface by causing the support member on which the chip-shaped semiconductor circuits have been placed to approach the mounting surface of the support substrate or the other of the circuit layers; and (v) disposing the chip-shaped semiconductor circuits on the mounting surface to have the desired layout by fixing the connecting portions of the chip-shaped semiconductor circuits to the corresponding predetermined positions of the mounting surface that have been brought into contact with each other; and (b) detaching the support member from the temporary adhesion portions of the chip-shaped semiconductor circuits by separating the support member from the support substrate or the other of the circuit layers, wherein the total number of the temporary adhesion regions of the support member for transfer is equal to that of the semiconductor circuits, and the semiconductor circuits and the temporary adhesion regions are in a one-to-one correspondence, and wherein the semiconductor circuits are temporarily adhered to the temporary adhesion regions through the steps of (A) forming films of the liquid on at least one of the opposite ends of the semiconductor circuits to the connecting portions and the one or more temporary adhesion regions corresponding to the at least one of the opposite ends;

(B) respectively linking the opposite ends of the semiconductor circuits with the corresponding one or more temporary adhesion regions in an opposed state thereof using the films of the liquid; and (C) respectively bringing the opposite ends into contact with the corresponding one or more temporary adhesion regions by applying a pressing force to between the opposite ends and the corresponding one or more temporary adhesion regions, thereby temporarily adhering the semiconductor circuits to the corresponding temporary adhesion regions in a detachable manner, and wherein exposed conductive contacts are formed at each of the predetermined positions of the mounting surface, and the semiconductor circuits are respectively fixed to the support substrate or the circuit layer at the corresponding predetermined positions of the mounting surface using the conductive contacts.

8. The method according to claim 7, wherein each of the conductive contacts penetrates through a corresponding one of the predetermined positions of the mounting surface to protrude to the outside.

9. The method according to claim 7, wherein the semiconductor circuits are fixed to the support substrate or to the circuit layer using the conductive contacts due to bonding with a bonding metal, bonding by pressure welding without a bonding metal, or due to bonding by fusion welding without a bonding metal.

10. The method according to claim 5, wherein exposed conductive contacts are formed at each of the predetermined positions of the semiconductor circuits; and the semiconductor circuits are respectively fixed to the support substrate or to the circuit layer at the corresponding predetermined positions of the mounting surface using the conductive contacts.

11. The method according to claim 10, wherein each of the conductive contacts penetrates through a corresponding one of the connecting portions to protrude to the outside.

12. A method of fabricating an integrated circuit device having a three-dimensional stacked structure formed by stacking circuit layers on a support substrate, the method comprising the steps of:

when fixing chip-shaped semiconductor circuits included in one of the circuit layers on a mounting surface of the support substrate, or other of the circuit layers that is adjacent to the one of the circuit layers to have a desired layout, (i) forming a plurality of lyophilic regions, wherein a lyophilic region is formed at each of predetermined positions defined on the mounting surface and to which connecting portions of the chip-shaped semiconductor circuits are to be respectively fixed;

(ii) forming a film of a liquid on each of the lyophilic regions;

(ii) respectively linking the connecting portions of the chip-shaped semiconductor circuits with the corresponding lyophilic regions in an opposed state so that the films of the liquid intervene between the connecting portions and the lyophilic regions;

(iv) respectively bringing the connecting portions into contact with the corresponding predetermined positions defined on the mounting surface by applying a pressing force between the connecting portions and the corresponding lyophilic regions; and (v) disposing the chip-shaped semiconductor circuits on the mounting surface so as to have the desired layout by fixing the connecting portions to the corresponding predetermined positions defined on the mounting surface that have been brought into contact with each other;

wherein the total number of the lyophilic regions is equal to or more than the total number of the chip-shaped semiconductor circuits, and the semiconductor circuits and the lyophilic regions are in a one-to-one correspondence, and when the connecting portions of the semiconductor circuits are respectively linked with the corresponding lyophilic regions, the semiconductor circuits are self-aligned in position by surface tension of the liquid, and wherein exposed conductive contacts are formed on each of the lyophilic regions, and the semiconductor circuits are respectively fixed to the support substrate or to the circuit layer at the corresponding predetermined positions defined on the mounting surface by using the conductive contacts.

13. The method according to claim 12, wherein a lyophilic region is formed on each of the connecting portions of the semiconductor circuits.

14. The method according to claim 12, wherein the lyophilic regions are defined by a film selectively formed on a surface of the support substrate, or on the circuit layer, using a material having a lyophilic property for the liquid or a material not having a lyophilic property for the liquid.

15. The method according to claim 12, wherein each of the conductive contacts penetrates through a corresponding one of the lyophilic regions to protrude to the outside.

16. The method according to claim 12, wherein the semiconductor circuits are fixed to the support substrate, or to the circuit layer, using the conductive contacts due to bonding with a bonding metal, bonding by pressure welding without a bonding metal, or due to bonding by fusion welding without a bonding metal.

17. The method according to claim 16, wherein each of the conductive contacts penetrates through a corresponding one of the lyophilic regions formed on the connecting portions to protrude to the outside.

18. The method according to claim 13, wherein the semiconductor circuits are fixed to the support substrate, or to the circuit layer, using the conductive contacts due to bonding with a bonding metal, bonding by pressure welding without a bonding metal, or due to bonding by fusion welding without a bonding metal.

19. The method according to claim 12, further comprising the step of:

melting the fixed conductive contacts by heating, thereby correcting positional deviation of the conductive contacts.

20. The method according to claim 12, wherein a step of placing the semiconductor circuits on a tray so as to have the desired layout is performed before the step of respectively linking the connecting portions of the semiconductor circuits with the corresponding lyophilic regions in the opposed state; and the semiconductor circuits are collectively placed as one lump at the same time on the support substrate, or on the circuit layer, from the tray.

21. The method according to claim 1, wherein the one or more temporary adhesion regions formed on the surface of the support member are each a lyophilic region.

22. The method according to claim 1, wherein after the one or more temporary adhesion regions have been formed on the surface of the support member, and after the temporary adhesion portion has been formed at the opposite end of each of the chip-shaped semiconductor circuits, a film of the liquid is formed on each of the one or more temporary adhesion regions, or on each temporary adhesion portion, or on each of the one or more temporary adhesion regions and on each temporary adhesion portion.

23. The method according to claim 1, wherein the liquid comprises water and a surface tension enhancement additive.

24. The method according to claim 12, wherein the liquid comprises water and a surface tension enhancement additive.

25. The method according to claim 7, wherein the liquid comprises water and a surface tension enhancement additive.

26. The method according to claim 23, wherein the surface tension enhancement additive is selected from the group consisting of hydrofluoric acid and ammonium fluoride.

27. The method according to claim 24, wherein the surface tension enhancement additive is selected from the group consisting of hydrofluoric acid and ammonium fluoride.

28. The method according to claim 25, wherein the surface tension enhancement additive is selected from the group consisting of hydrofluoric acid and ammonium fluoride.

29. A method of fabricating an integrated circuit device having a three-dimensional stacked structure formed by stacking circuit layers on a support substrate, the method comprising the steps of:
(a) when fixing chip-shaped semiconductor circuits included in one of the circuit layers on a mounting surface of the support substrate, or other of the circuit layers that is adjacent to the one of the circuit layers to have a desired layout,
(i) forming one or more temporary adhesion regions on a surface of a support member for transfer;
(ii) forming a temporary adhesion portion that can be temporarily adhered to the one or more temporary adhesion regions, at an opposite end of each of the chip-shaped semiconductor circuits to a connecting portion thereof;
(iii) collectively placing the chip-shaped semiconductor circuits at the same time as one lump on the support member so as to have a layout equivalent to a mirror image of the desired layout by temporarily adhering the temporary adhesion portion of each of the chip-shaped semiconductor circuits to the one or more temporary adhesion regions, wherein the semiconductor circuits are temporarily adhered to the one or more temporary adhesion regions of the support member for transfer using an absorption force of a liquid, wherein the liquid comprises water, and when the temporary adhesion portions of the semiconductor circuits are temporarily adhered to the one or more temporary adhesion regions, the semiconductor circuits are self-aligned in position by surface tension of the liquid;
(iv) bringing collectively the temporary adhesion portions of the chip-shaped semiconductor circuits into contact with the mounting surface at corresponding predetermined positions of the mounting surface by causing the support member on which the chip-shaped semiconductor circuits have been placed to approach the mounting surface of the support substrate or the other of the circuit layers; and
(v) disposing the chip-shaped semiconductor circuits on the mounting surface to have the desired layout by fixing the connecting portions of the chip-shaped semiconductor circuits to the corresponding predetermined positions of the mounting surface that have been brought into contact with each other; and
(b) detaching the support member from the temporary adhesion portions of the chip-shaped semiconductor circuits by separating the support member from the support substrate or the other of the circuit layers, wherein the total number of the temporary adhesion regions of the support member for transfer is equal to that of the semiconductor circuits, and the semiconductor circuits and the temporary adhesion regions are in a one-to-one correspondence.

30. A method of fabricating an integrated circuit device having a three-dimensional stacked structure formed by stacking circuit layers on a support substrate, the method comprising the steps of:
(a) when fixing chip-shaped semiconductor circuits included in one of the circuit layers on a mounting surface of the support substrate, or other of the circuit layers that is adjacent to the one of the circuit layers to have a desired layout,
(i) forming one or more temporary adhesion regions on a surface of a support member for transfer;
(ii) forming a temporary adhesion portion that can be temporarily adhered to the one or more temporary adhesion regions, at an opposite end of each of the chip-shaped semiconductor circuits to a connecting portion thereof;
(iii) collectively placing the chip-shaped semiconductor circuits at the same time as one lump on the support member so as to have a layout equivalent to a mirror image of the desired layout by temporarily adhering the temporary adhesion portion of each of the chip-shaped semiconductor circuits to the one or more temporary adhesion regions, wherein the semiconductor circuits are temporarily adhered to the one or more temporary adhesion regions of the support member for transfer using an absorption force of a liquid, wherein the liquid includes an additive for enhancing the surface tension of the liquid, and when the temporary adhesion portions of the semiconductor circuits are temporarily adhered to the one or more temporary adhesion regions, the semiconductor circuits are self-aligned in position by surface tension of the liquid;
(iv) bringing collectively the temporary adhesion portions of the chip-shaped semiconductor circuits into contact with the mounting surface at corresponding predetermined positions of the mounting surface by causing the support member on which the chip-shaped semiconductor circuits have been placed to approach the mounting surface of the support substrate or the other of the circuit layers; and
(v) disposing the chip-shaped semiconductor circuits on the mounting surface to have the desired layout by fixing the connecting portions of the chip-shaped semiconductor circuits to the corresponding predetermined positions of the mounting surface that have been brought into contact with each other; and
(b) detaching the support member from the temporary adhesion portions of the chip-shaped semiconductor circuits by separating the support member from the support substrate or the other of the circuit layers, wherein the total number of the temporary adhesion regions of the support member for transfer is equal to that of the semiconductor circuits, and the semiconductor circuits and the temporary adhesion regions are in a one-to-one correspondence.

31. The method according to claim 30, wherein the liquid comprises water and the additive.

32. The method according to claim 29, wherein in step (a) the chip-shaped semiconductor circuits comprise several hundred chip-shaped semiconductor circuits fixed at the same time.

33. The method according to claim 1, wherein the semiconductor circuits are temporarily adhered to the temporary adhesion region of the support member for transfer using a sticking force of a sticky material.

34. The method according to claim 33, wherein in the step of detaching the support member for transfer from the semiconductor circuits, the sticking force of the sticky material is decreased or destroyed by heating, irradiation of ultraviolet rays, or addition of a chemical agent.

35. The method according to claim 33, wherein the temporary adhesion portions of the semiconductor circuits are formed by the sticky material.

36. The method according to claim 10, wherein the semiconductor circuits are fixed to the support substrate or the said circuit layer using the conductive contacts due to bonding with a bonding metal, bonding by pressure welding without a bonding metal, or bonding by fusion welding without a bonding metal.

37. The method according to claim 7, further comprising the step of melting the fixed conductive contacts by heating, thereby correcting positional deviation of the said conductive contacts.

38. The method according to claim 1, wherein a step of placing the semiconductor circuits on a tray so as to have the desired layout is performed before the step of placing the semiconductor circuits on the support member for transfer; and the semiconductor circuits are collectively placed on the support member from the tray.

* * * * *